United States Patent
Makiyama et al.

(10) Patent No.: US 9,201,440 B2
(45) Date of Patent: Dec. 1, 2015

(54) SEMICONDUCTOR INTEGRATED CIRCUIT DEVICE

(71) Applicant: Renesas Electronics Corporation, Kanagawa (JP)

(72) Inventors: Hideki Makiyama, Kanagawa (JP); Toshiaki Iwamatsu, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/310,731

(22) Filed: Jun. 20, 2014

(65) Prior Publication Data
US 2014/0375379 A1    Dec. 25, 2014

(30) Foreign Application Priority Data

Jun. 21, 2013 (JP) .................. 2013-130446
Nov. 6, 2013 (JP) .................. 2013-230392

(51) Int. Cl.
*G05F 1/625* (2006.01)

(52) U.S. Cl.
CPC ..................... *G05F 1/625* (2013.01)

(58) Field of Classification Search
CPC .. G05F 1/625; H01L 21/0217; H01L 21/8234
USPC .......................................... 327/534
See application file for complete search history.

(56) References Cited

U.S. PATENT DOCUMENTS

| | | | |
|---|---|---|---|
| 6,166,577 A | 12/2000 | Mizuno et al. | |
| 6,388,483 B1 | 5/2002 | Mizuno et al. | |
| 6,466,077 B1 | 10/2002 | Miyazaki et al. | |
| 6,576,956 B2 * | 6/2003 | Kawanaka | 257/347 |
| 6,608,509 B1 | 8/2003 | Mizuno et al. | |
| 2002/0030521 A1 | 3/2002 | Mizuno et al. | |
| 2002/0186071 A1 | 12/2002 | Miyazaki et al. | |
| 2003/0006816 A1 | 1/2003 | Mizuno et al. | |
| 2003/0197547 A1 | 10/2003 | Mizuno et al. | |
| 2004/0251484 A1 | 12/2004 | Miyazaki et al. | |
| 2005/0083096 A1 | 4/2005 | Mizuno et al. | |
| 2009/0057746 A1 | 3/2009 | Sugll et al. | |

FOREIGN PATENT DOCUMENTS

| | | |
|---|---|---|
| JP | 8-274620 A | 10/1996 |
| JP | 2001-156261 A | 6/2001 |
| JP | 2009-044220 A | 2/2009 |
| JP | 2009-064860 A | 3/2009 |

* cited by examiner

*Primary Examiner* — Sibin Chen
*Assistant Examiner* — Metasebia Retebo
(74) *Attorney, Agent, or Firm* — McDermott Will & Emery LLP

(57) ABSTRACT

A semiconductor integrated circuit device has, as a current monitor circuit, a circuit in which n-channel type MISFETs are connected in series with each other. Based on a delay time of a speed monitor circuit in a state where a substrate bias is being applied to the p-channel type MISFETs, a first voltage value of a first substrate bias to be applied to the p-channel type MISFETs is determined. Next, based on a current flowing through an n-channel type MISFET in a state where the first substrate bias is being applied to the p-channel type MISFETs of the current monitor circuit and a second substrate bias is being applied to the n-channel type MISFETs of the current monitor circuit, a second voltage value of the second substrate bias to be applied to the n-channel type MISFETs is determined.

7 Claims, 48 Drawing Sheets

SEMICONDUCTOR INTEGRATED CIRCUIT DEVICE

CROSS-REFERENCE TO RELATED APPLICATIONS

The present application claims priority from Japanese Patent Applications No. 2013-130446 filed on Jun. 21, 2013 and No. 2013-230392 filed on Nov. 6, 2013, the contents of which are hereby incorporated by reference into this application.

TECHNICAL FIELD

The present invention relates to a semiconductor integrated circuit device, and is desirably applicable to, for example, a semiconductor integrated circuit device provided with semiconductor elements formed on a semiconductor substrate.

BACKGROUND

With the increasing miniaturization of semiconductor elements contained in a semiconductor integrated circuit device such as an LSI (Large Scale Integrated Circuit), variations in characteristics of a semiconductor element such as a threshold voltage of a field effect transistor including a MISFET (Metal Insulator Semiconductor Field Effect Transistor) have been increasing. As a technique for compensating for the variations in characteristics of a semiconductor element, a technique of applying a substrate bias to a semiconductor substrate has been conventionally known. By applying a substrate bias to the semiconductor substrate having MISFETs formed thereon, the threshold voltage of the MISFETs can be controlled, and it is possible to compensate for the variations in the threshold voltage.

Japanese Patent Application Laid-Open Publication No. 2001-156261 (Patent Document 1) has disclosed a technique in which a speed monitor circuit and a substrate bias control circuit are provided for a main circuit composed of MISFETs and a substrate bias is generated so that a speed signal set in accordance with an operating speed and a speed detection signal corresponding to the operating speed coincide with each other.

Japanese Patent Application Laid-Open Publication No. 8-274620 (Patent Document 2) has disclosed a technique in which a substrate bias of an oscillator circuit of a substrate-bias dependent type is used in common with a substrate bias of a main circuit and the threshold voltage of the MISFETs constituting the main circuit is controlled in accordance with an operation mode.

Japanese Patent Application Laid-Open Publication No. 2009-44220 (Patent Document 3) has disclosed a technique in which the threshold voltage is controlled by applying a substrate bias to a back gate of MISFET, thereby compensating for the variations in threshold voltage of the MISFETs.

Japanese Patent Application Laid-Open Publication No. 2009-64860 (Patent Document 4) has disclosed a technique in which MISFETs are formed on a main surface of an SOI (Silicon On Insulator) substrate and the threshold voltage is controlled by applying a substrate bias to a support substrate below the MISFETs.

SUMMARY

As a method of compensating for variations in threshold voltage of MISFETs, a method has been proposed, in which a voltage value of a substrate bias to be applied to a replica circuit formed in a semiconductor integrated circuit device is determined so that the delay time of the replica circuit becomes a target time and the threshold voltage is controlled by applying the substrate bias set to this voltage value to the main circuit. However, forming the replica circuit in the semiconductor integrated circuit device increases the area of the semiconductor integrated circuit device by an area corresponding to the formed replica circuit, and this method is thus disadvantageous from the viewpoint of downsizing the semiconductor integrated circuit device.

On the other hand, as a method of compensating for variations in the threshold voltage, a method has been proposed, in which a delay circuit such as a ring oscillator circuit is formed in the semiconductor integrated circuit device, a voltage value of a substrate bias to be applied to the formed delay circuit is determined so that the delay time of the delay circuit becomes a target time, and the threshold voltage is controlled by applying the substrate bias set to this voltage value to the main circuit.

However, in the case where a delay circuit having a simple circuit such as a ring oscillator circuit provided with a plurality of CMIS (Complementary Metal Insulator Semiconductor) inverter circuits is employed, even when a substrate bias set to a voltage value determined so that the delay time of the delay circuit becomes a target time is applied to the main circuit, the delay time of the main circuit does not become a target time. For this reason, it is difficult to control the delay time of the main circuit to be a target time by applying a substrate bias having the voltage value determined so that the delay time of the delay circuit becomes a target time. Therefore, it is not possible to easily compensate for the variations in characteristics such as the threshold voltage of MISFETs constituting the main circuit, and performances of the semiconductor integrated circuit device are deteriorated.

Other objects and novel features will be clarified by the description of the present specification and the attached drawings.

According to one embodiment, a semiconductor integrated circuit device includes, as a current monitor circuit, a circuit in which MISFETs of one channel type out of a p-channel type and an n-channel type are connected in series with each other in the same manner as a main circuit, in addition to a speed monitor circuit. Based on a delay time of the speed monitor circuit in a state where a substrate bias is being applied to the speed monitor circuit including MISFETs of the other channel type, a voltage value of the substrate bias to be applied to the MISFETs of the other channel type is determined. Next, the substrate bias set to the voltage value is applied to the MISFETs of the other channel type included in the current monitor circuit, and the substrate bias is applied to the MISFETs of the one channel type included in the current monitor circuit. Then, based on the currents flowing through the MISFETs of the respective channel types in a state where the substrate bias is being applied in this manner, the voltage value of the substrate bias to be applied to the MISFETs of the one channel type is determined.

Also, according to another embodiment, a semiconductor integrated circuit device includes, as a speed monitor circuit, a circuit having an inverter circuit in which MISFETs of one channel type out of a p-channel type and an n-channel type are connected in series with each other in the same manner as the main circuit. Moreover, this semiconductor integrated circuit device includes, as a speed monitor circuit, a circuit having an inverter circuit in which MISFETs of the other channel type are provided in the same manner as the main circuit. Based on a delay time of the speed monitor circuit in a state where a substrate bias is being applied to the speed monitor circuit including MISFETs of the other channel type, a voltage value of the substrate bias to be applied to the MISFETs of the other channel type is determined. Moreover, based on a delay time of the speed monitor circuit in a state where the substrate bias is being applied to the speed monitor circuit in which the MISFETs of the one channel type are connected in series with each other, a voltage value of the substrate bias to be applied to the MISFETs of the one channel type is determined.

Also, according to still another embodiment, the semiconductor integrated circuit device includes four semiconductor regions which are formed on a surface side of a support substrate of an SCI substrate, respectively extend in a first direction in the surface of the support substrate, and are also arranged in a second direction orthogonal to the first direction. As the four semiconductor regions, a p-type first semiconductor region, an n-type second semiconductor region, a p-type third semiconductor region, and an n-type fourth semiconductor region are arranged in this order. An SOI layer is formed on each of the first semiconductor region, the second semiconductor region, the third semiconductor region and the fourth semiconductor region, with a BOX layer interposed therebetween. A p-channel type MISFET is formed on the SOI layer on the second semiconductor region, and an n-channel type MISFET is formed on the SOI layer on the first semiconductor region or the third semiconductor region.

Also, according to still another embodiment, a semiconductor integrated circuit device includes, as a second speed monitor circuit, a circuit in which MISFETs of one channel type out of a p-channel type and an n-channel type are connected in series with each other in the same manner as the main circuit, in addition to a first speed monitor circuit and a current monitor circuit. Based on a current flowing through the current monitor circuit in a state where a first substrate bias is being applied to the MISFETs of the other channel type, a first substrate bias is temporarily determined. Based on a current flowing through the current monitor circuit in a state where a second substrate bias is being applied to MISFETs of the one channel type, a second substrate bias is temporarily determined. Based on a first delay time of the first speed monitor circuit in the state where the first substrate bias thus temporarily determined is being applied to the MISFETs of the other channel type and the second substrate bias thus temporarily determined is being applied to the MISFETs of the one channel type, a first substrate bias and a second substrate bias are determined. Moreover, in a state where the first substrate bias thus determined is being applied to the MISFETs of the other channel type and the second substrate bias thus determined is being applied to the first MISFET out of the two MISFETs of the one channel type, the second delay time of the second speed monitor circuit is acquired. Then, based on the acquired second delay time, a voltage value of a third substrate bias to be applied to the second MISFET out of the two MISFETs of the one channel type is determined.

According to one embodiment, it is possible to improve performances of a semiconductor integrated circuit device.

DETAILED DESCRIPTION

Figure 1:
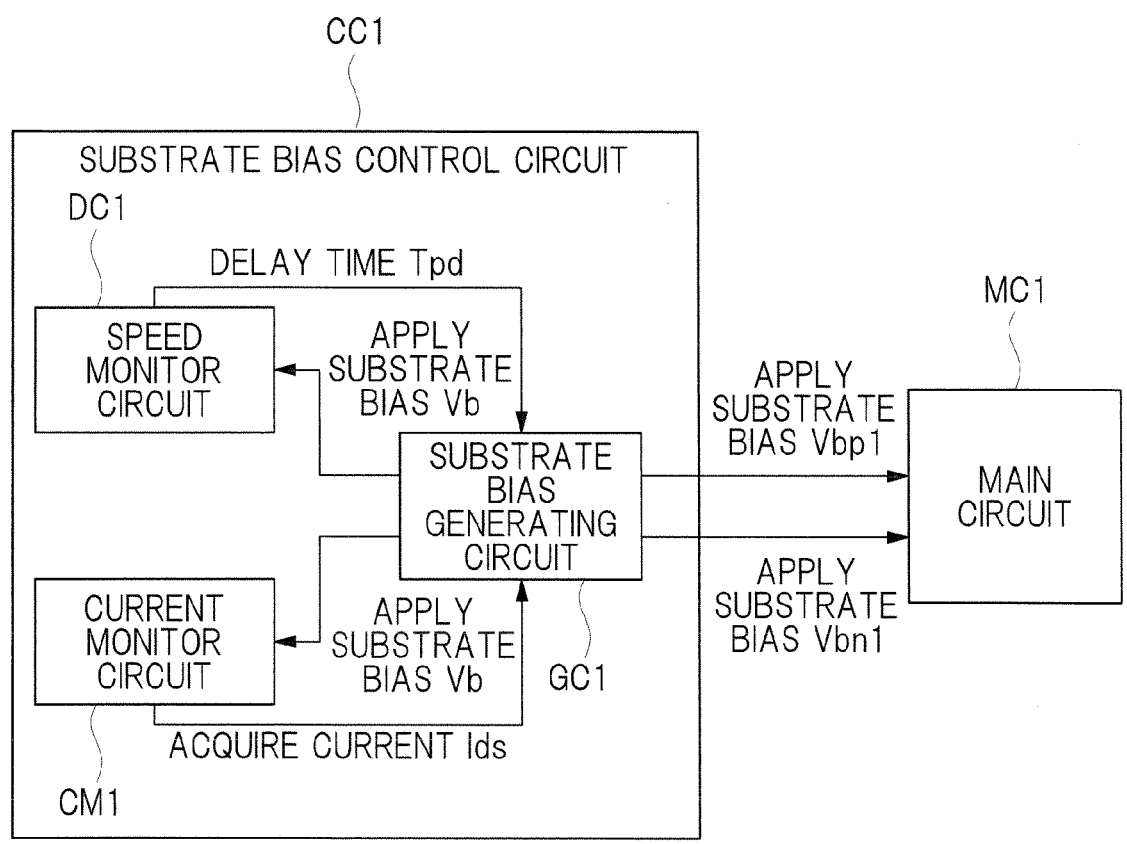
FIG. 1 is a block diagram showing a configuration of a semiconductor integrated circuit device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, typical embodiments of the present invention will be described in detail with reference to the accompanying drawings. Also, components having the same function are denoted by the same reference symbols throughout the drawings for describing the embodiments, and the repetitive description thereof is omitted. In addition, the description of the same or similar portions is not repeated in principle unless particularly required in the following embodiments.

Also, in some drawings used in the following embodiments, hatching may be omitted even in a sectional view so as to make the drawing easy to see. Also, hatching may be used even in a plan view so as to make the drawing easy to see.

(First Embodiment)
<Configuration of Semiconductor Integrated Circuit Device>

First, a configuration of a semiconductor integrated circuit device of the first embodiment will be described.

Figure 2:
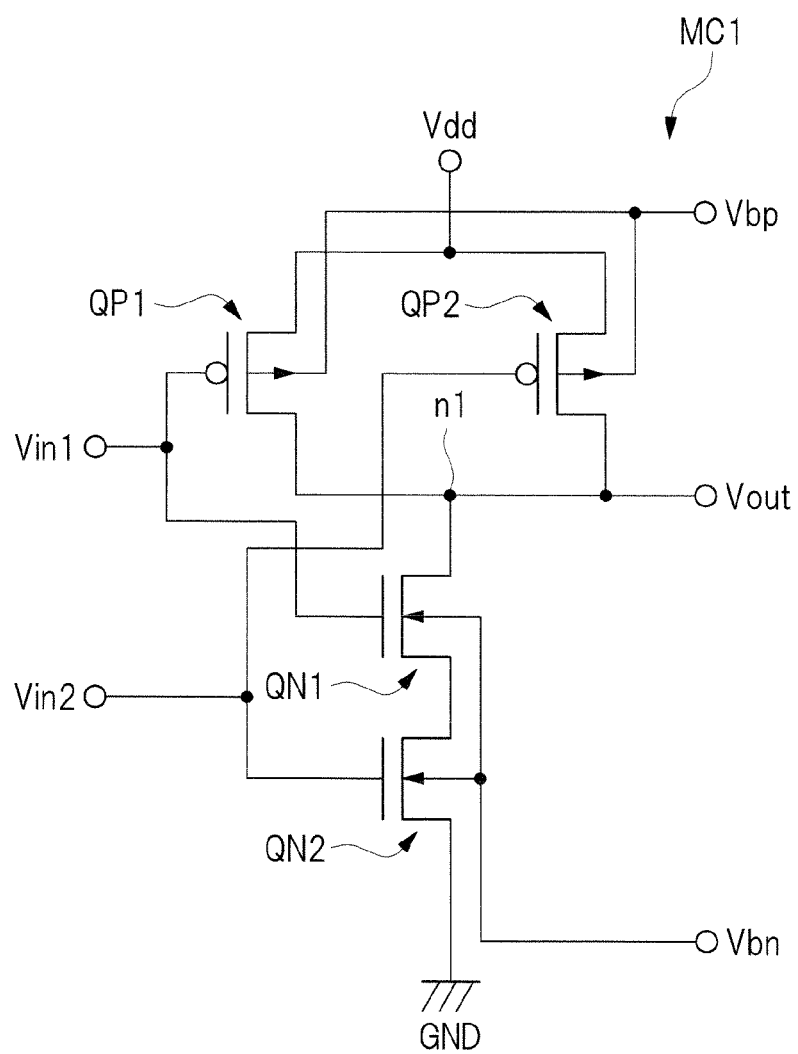
FIG. 2 is a circuit diagram showing a configuration of a NAND circuit as one example of a main circuit in the semiconductor integrated circuit device of the first embodiment.
Figure 3:
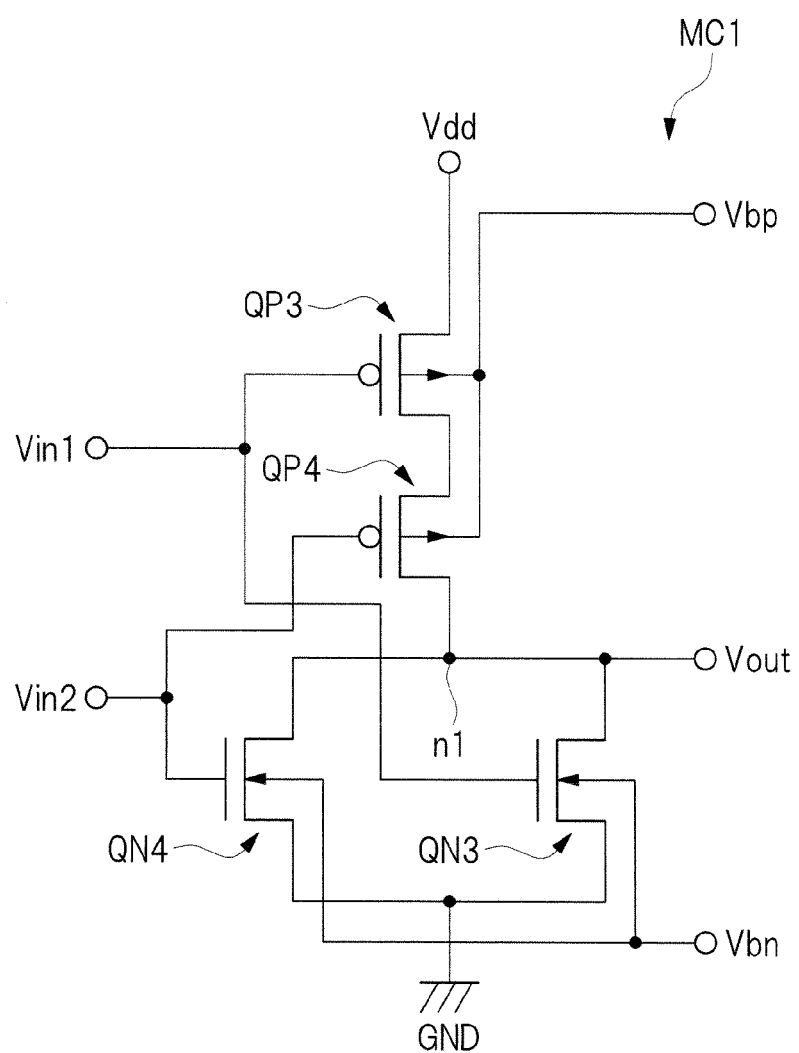
FIG. 3 is a circuit diagram showing a configuration of a NOR circuit as one example of the main circuit in the semiconductor integrated circuit device of the first embodiment.

FIG. 1 is a block diagram showing a configuration of a semiconductor integrated circuit device of the first embodiment. FIG. 2 is a circuit diagram showing a configuration of a NAND circuit as one example of a main circuit in the semiconductor integrated circuit device of the first embodiment. FIG. 3 is a circuit diagram showing a configuration of a NOR circuit as one example of a main circuit in the semiconductor integrated circuit device of the first embodiment. In FIG. 1, a substrate bias Vbp and a substrate bias Vbn are represented as substrate bias Vb, and a current Idsp and a current Idsn are represented as current Ids (the same is true of FIG. 27 to be described later).

As shown in FIG. 1, the semiconductor integrated circuit device of the first embodiment has a main circuit MC1 and a substrate bias control circuit CC1. The main circuit MC1 and the substrate bias control circuit CC1 are circuits each constituted of a plurality of MISFETs.

As shown in FIG. 2, when the main circuit MC1 in the semiconductor integrated circuit device of the first embodiment has a NAND circuit, the main circuit MC1 has two input nodes to which a voltage Vin1 and a voltage Vin2 are respectively input and one output node from which a voltage Vout is output. Moreover, at this time, the main circuit MC1 includes a p-channel type MISFET QP1 and a p-channel type MISFET QP2 and further an n-channel type MISFET QN1 and an n-channel type MISFET QN2, which are different from the p-channel type.

Note that, in the specification of the present application, when "voltage" is mentioned without clearly indicating a reference potential, the "voltage" means a potential relative to the ground potential (0 V). Moreover, in the following description, the ground potential (0 V) is represented as the ground potential GND.

The p-channel type MISFET QP1 and the p-channel type MISFET QP2 are connected in parallel with each other between a power supply line having a potential equal to a power supply voltage Vdd relative to the ground potential GND, that is, the power supply line to which the power supply voltage Vdd is applied and a node n1 having a potential between the potential of the power supply voltage Vdd and the ground potential GND. A source electrode of the p-channel type MISFET QP1 and a source electrode of the p-channel type MISFET QP2 are connected to the power supply voltage Vdd, that is, to the power supply. A drain electrode of the p-channel type MISFET QP1 and a drain electrode of the p-channel type MISFET QP2 are connected to a node n1.

The n-channel type MISFET QN1 and the n-channel type MISFET QN2 are connected in series with each other between the node n1 and a ground line having the ground potential GND. A drain electrode of the n-channel type MISFET QN1 is connected to the node n1. A source electrode of the n-channel type MISFET QN1 is connected to a drain electrode of the n-channel type MISFET QN2. A source electrode of the n-channel type MISFET QN2 is connected to the ground potential GND, that is, is grounded.

A gate electrode of the p-channel type MISFET QP1 and a gate electrode of the n-channel type MISFET QN1 are connected to the input node to which the voltage Vin1 is input. Moreover, a gate electrode of the p-channel type MISFET QP2 and a gate electrode of the n-channel type MISFET QN2 are connected to the input node to which the voltage Vin2 is input. Moreover, the node n1 is connected to the output node from which the voltage Vout is output.

Note that the state where the two MISFETs are connected in series with each other means that the source-drain paths of the respective MISFETs are connected in series with each other.

A substrate bias Vbp is applied as the substrate bias voltage to the p-channel type MISFET QP1 and the p-channel type MISFET QP2. A substrate bias Vbn is applied as the substrate bias voltage to the n-channel type MISFET QN1 and the n-channel type MISFET QN2.

On the other hand, as shown in FIG. 3, when the main circuit MC1 in the semiconductor integrated circuit device of the first embodiment has a NOR circuit, the main circuit MC1 has two input nodes to which the voltage Vin1 and the voltage Vin2 are respectively input and one output node from which the voltage Vout is output. Moreover, at this time, the main circuit MC1 includes a p-channel type MISFET QP3, a p-channel type MISFET QP4, an n-channel type MISFET QN3, and an n-channel type MISFET QN4.

The p-channel type MISFET QP3 and the p-channel type MISFET QP4 are connected in series with each other between a power supply line to which the power supply voltage Vdd is applied and the node n1 having a potential between the potential of the power supply voltage Vdd and the ground potential GND. A source electrode of the p-channel type MISFET QP3 is connected to the power supply voltage Vdd, that is, to the power supply. A drain electrode of the p-channel type MISFET QP3 is connected to a source electrode of the p-channel type MISFET QP4. A drain electrode of the p-channel type MISFET Q4 is connected to the node n1.

The n-channel type MISFET QN3 and the n-channel type MISFET QN4 are connected in parallel with each other between the node n1 and the ground line having the ground potential GND. A drain electrode of the n-channel type MISFET QN3 and a drain electrode of the n-channel type MISFET Q4 are connected to the node n1. Moreover, a source electrode of the n-channel type MISFET QN3 and a source electrode of the n-channel type MISFET QN4 are connected to the ground potential GND, that is, are grounded.

A gate electrode of the p-channel type MISFET QP3 and a gate electrode of the n-channel type MISFET QN3 are connected to the input node to which the voltage Vin1 is input. Moreover, a gate electrode of the p-channel type MISFET QP4 and a gate electrode of the n-channel type MISFET QN4 are connected to the input node to which the voltage Vin2 is input. Furthermore, the node n1 is connected to the output node from which the voltage Vout is output.

The substrate bias Vbp is applied as the substrate bias voltage to the p-channel type MISFET QP3 and the p-channel type MISFET QP4. The substrate bias Vbn is applied as the substrate bias voltage to the n-channel type MISFET QN3 and the n-channel type MISFET QN4.

In other words, in the first embodiment, the main circuit has a circuit in which at least two MISFETs of one channel type out of the p-channel type and the n-channel type are connected in series with each other.

As shown in FIG. 1, the substrate bias control circuit CC1 in the semiconductor integrated substrate device of the first embodiment includes a speed monitor circuit DC1 serving as a delay circuit, a current monitor circuit CM1 for monitoring a current, and a substrate bias generating circuit GC1 serving as a voltage generating circuit.

Figure 4:
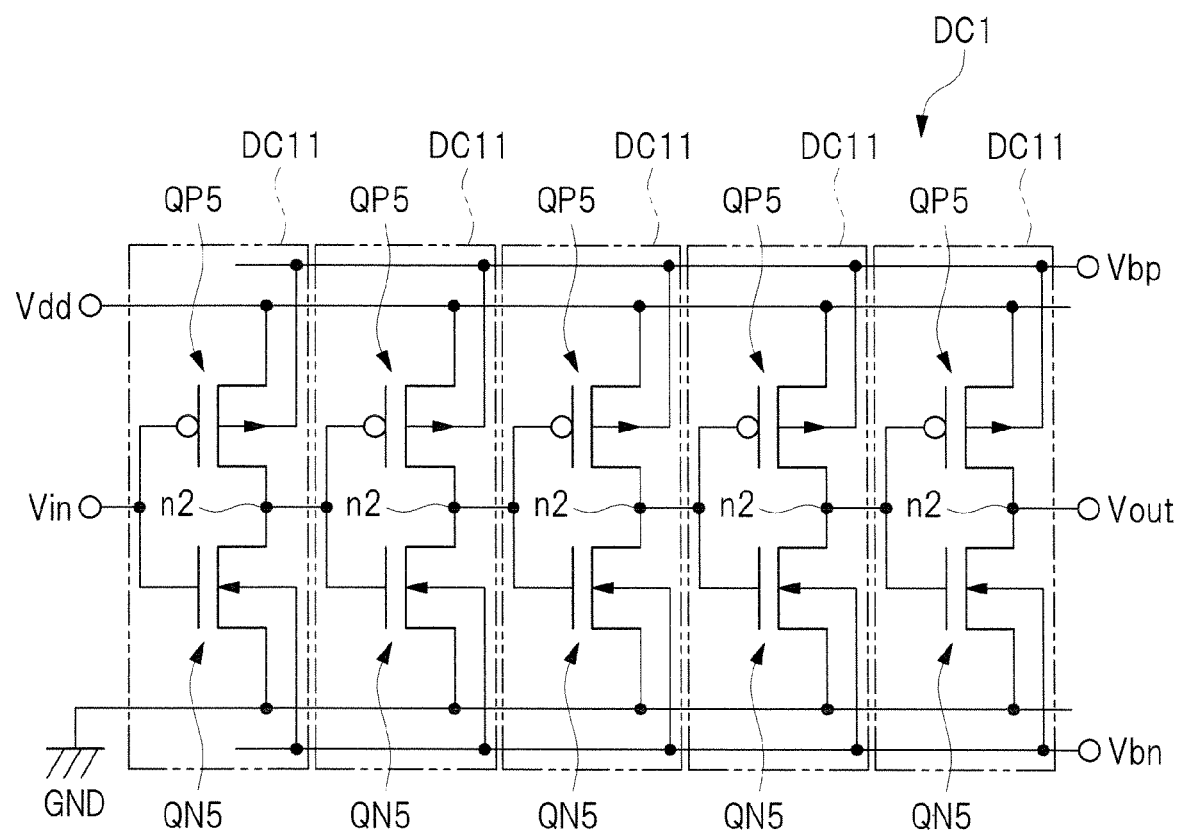
FIG. 4 is a circuit diagram showing a configuration of a speed monitor circuit in the semiconductor integrated circuit device of the first embodiment.

FIG. 4 is a circuit diagram showing the configuration of the speed monitor circuit in the semiconductor integrated circuit device of the first embodiment.

As shown in FIG. 4, the speed monitor circuit DC1 is a delay circuit having an input node to which the voltage Vin is input and an output node from which the voltage Vout is output. The speed monitor circuit DC1 is a delay circuit provided with a plurality of inverter circuits DC11 which are mutually connected in series. Each of the plurality of inverter circuits DC11 is a CMIS inverter circuit composed of, for example, a p-channel type MISFET QP5 and an n-channel type MISFET QN5. FIG. 4 shows an example in which the speed monitor DC1 is provided with five inverter circuits DC11.

Note that, as will be described later in the fourth embodiment, an inverter circuit composed of only one of the p-channel type MISFET and the n-channel type MISFET may also be used as the inverter circuit.

In each of the plurality of inverter circuits DC11, the p-channel type MISFET QP5 is connected between a power supply line to which the power supply voltage Vdd is applied and a node n2 having a potential between the potential of power supply voltage Vdd and the ground potential GND. A source electrode of the p-channel type MISFET QP5 is connected to the power supply voltage Vdd, that is, to the power supply, and a drain electrode of the p-channel type MISFET QP5 is connected to the node n2. The n-channel type MISFET QN5 is connected between the node n2 and the ground line having the ground potential GND. A drain electrode of the n-channel type MISFET QN5 is connected to the node n2, and a source electrode of the n-channel type MISFET QN5 is connected to the ground potential GND, that is, is grounded.

In the speed monitor circuit DC1, a plurality of inverter circuits DC11 as described above, for example, N inverter circuits DC11 are arranged, supposing that N is an integer of 2 or more. In this case, the input side of the inverter circuit DC11 is defined as a gate electrode of the p-channel type MISFET QP5 and a gate electrode of the n-channel type MISFET QN5, and the output side of the inverter circuit DC11 is defined as the node n2, that is, the drain electrode of the p-channel type MISFET QP5 and the drain electrode of the n-channel type MISFET QN5. At this time, the output side of each of the first to N−1 th inverter circuits DC11 is connected to the input side of the inverter circuit DC11 that is arranged next. In this manner, by connecting the plurality of inverter circuits DC11 in series between the input node and the output node, a delay circuit in which each inverter circuit DC11 has a delay time Tpd can be formed.

Note that, by setting N to an odd number of 3 or more and connecting the output node and the input node to configure a feedback circuit, the speed monitor circuit DC1 can be prepared as a ring oscillator circuit. In this manner, when the frequency of the ring oscillator circuit is defined as f, since the delay time Tpd of each of the inverter circuits DC11 can be easily obtained from, for example, 1/(2Nf) or the like based on the frequency f, the delay time Tpd can be measured with higher precision.

Alternatively, since it is only required to measure the time dependency of each of the voltage Vin at the input node and the voltage Vout at the output node, thereby measuring the delay time Tpd, a circuit composed of one inverter circuit DC11 may be used as the speed monitor circuit.

In each of the plurality of inverter circuits DC11, the substrate bias Vbp is applied to the p-channel type MISFET QP5 as the substrate bias voltage. The substrate bias Vbn is applied as the substrate bias voltage to the n-channel type MISFET QN5.

Preferably, in the case where the main circuit MC1 has the NAND circuit described with reference to FIG. 2, the MISFET QP5 constituting the inverter circuit DC11 is the same kind of MISFET as the MISFET QP1 and the MISFET QP2 constituting the main circuit MC1. More specifically, the threshold voltage of the MISFET QP5 is equal to the threshold voltage of the MISFET QP1 and MISFET QP2. Thus, the substrate bias Vbp to be applied to the MISFET QP1 and the MISFET QP2 constituting the main circuit MC1 can be controlled with high precision.

Preferably, in the case where the main circuit MC1 has the NOR circuit described with reference to FIG. 3, the MISFET QN5 constituting the inverter circuit DC11 is the same kind of MISFET as the MISFET QN3 and the MISFET QN4 constituting the main circuit MC1. More specifically, the threshold voltage of the MISFET QN5 is equal to the threshold voltage of the MISFET QN3 and MISFET QN4. Thus, the substrate bias Vbn to be applied to the MISFET QN3 and the MISFET QN4 constituting the main circuit MC1 can be controlled with high precision.

FIGS. 5 to 8 are circuit diagrams showing a configuration of a current monitor circuit in the semiconductor integrated circuit device of the first embodiment.

Figure 5:
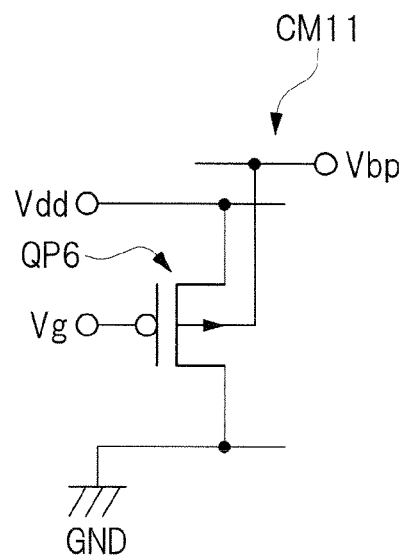
FIG. 5 is a circuit diagram showing a configuration of a current monitor circuit in the semiconductor integrated circuit device of the first embodiment.
Figure 6:
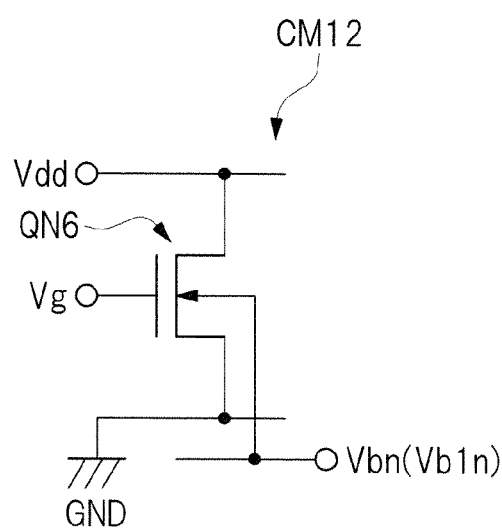
FIG. 6 is a circuit diagram showing a configuration of a current monitor circuit in the semiconductor integrated circuit device of the first embodiment.
Figure 7:
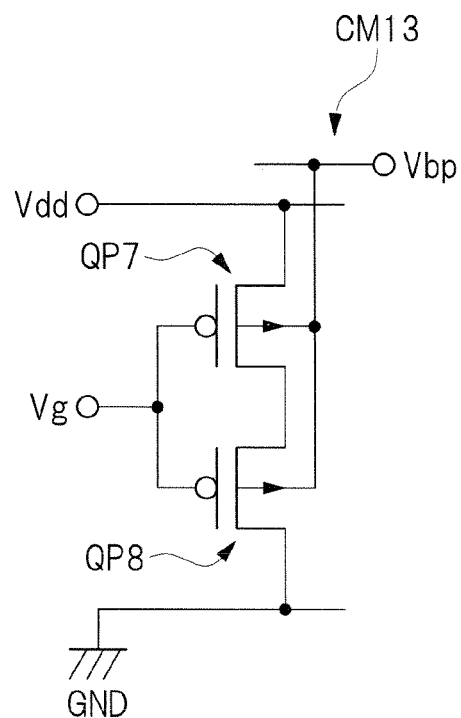
FIG. 7 is a circuit diagram showing a configuration of a current monitor circuit in the semiconductor integrated circuit device of the first embodiment.
Figure 8:
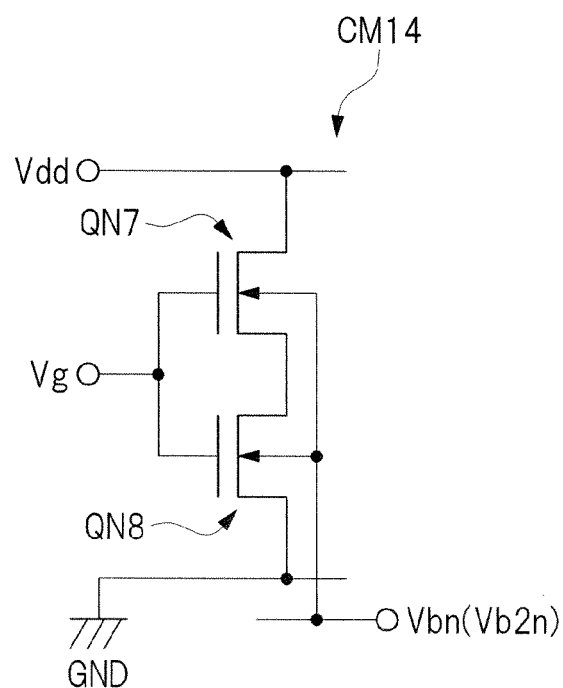
FIG. 8 is a circuit diagram showing a configuration of a current monitor circuit in the semiconductor integrated circuit device of the first embodiment.

In the first embodiment, as the current monitor circuit CM1, four current monitor circuits, that is, a current monitor circuit CM11 shown in FIG. 5, a current monitor circuit CM12 shown in FIG. 6, a current monitor circuit CM13 shown in FIG. 7 and a current monitor circuit CM14 shown in FIG. 8 are provided.

As shown in FIG. 5, the current monitor circuit CM11 has a p-channel type MISFET QP6. The p-channel type MISFET QP6 is connected between a power supply line to which the power supply voltage Vdd is applied and the ground line having the ground potential GND. A source electrode of the p-channel type MISFET QP6 is connected to the power supply voltage Vdd, that is, to the power supply, and a drain electrode of the p-channel type MISFET QP6 is connected to the ground potential GND, that is, is grounded. A gate electrode of the p-channel type MISFET QP6 is connected to an input node to which a voltage Vg is input. Moreover, the substrate bias Vbp is applied as the substrate bias voltage to the p-channel type MISFET QP6.

As shown in FIG. 6, the current monitor circuit CM12 has an n-channel type MISFET QN6. The n-channel type MISFET QN6 is connected between a power supply line to which the power supply voltage Vdd is applied and the ground line having the ground potential GND. A drain electrode of the n-channel type MISFET QN6 is connected to the power supply voltage Vdd, that is, to the power supply, and a source electrode of the n-channel type MISFET QN6 is connected to the ground potential GND, that is, is grounded. A gate electrode of the n-channel type MISFET QN6 is connected to an input node to which a voltage Vg is input. Moreover, the substrate bias Vbp is applied as the substrate bias voltage to the n-channel type MISFET QN6.

As shown in FIG. 7, the current monitor circuit CM13 has a p-channel type MISFET QP7 and a p-channel type MISFET QP8. The p-channel type MISFET QP7 and the p-channel type MISFET QP8 are connected in series with each other between the power supply line to which the power supply voltage Vdd is applied and the ground line having the ground potential GND. A source electrode of the p-channel type MISFET QP7 is connected to the power supply voltage Vdd, that is, to the power supply. A drain electrode of the p-channel type MISFET QP7 is connected to a source electrode of the p-channel type MISFET QP8. A drain electrode of the p-channel type MISFET QP8 is connected to the ground potential GND, that is, is grounded. A gate electrode of the p-channel type MISFET QP7 and a gate electrode of the p-channel type MISFET QP8 are connected to an input node to which the voltage Vg is input. Moreover, the substrate bias Vbp is applied as the substrate bias voltage to the p-channel type MISFET QP7 and the p-channel type MISFET QP8.

As shown in FIG. 8, the current monitor circuit CM14 has an n-channel type MISFET QN7 and an n-channel type MISFET QN8. The n-channel type MISFET QN7 and the n-channel type MISFET QN8 are connected in series with each other between the power supply line to which the power supply voltage Vdd is applied and the ground line having the ground potential GND. A drain electrode of the n-channel type MISFET QN7 is connected to the power supply voltage Vdd, that is, to the power supply. A source electrode of the n-channel type MISFET QN7 is connected to a drain electrode of the n-channel type MISFET QN8. A source electrode of the n-channel type MISFET QN8 is connected to the ground potential GND, that is, is grounded. A gate electrode of the n-channel type MISFET QN7 and a gate electrode of the n-channel type MISFET QN8 are connected to an input node to which the voltage Vg is input. Moreover, the substrate bias Vbn is applied as the substrate bias voltage to the n-channel type MISFET QN7 and the n-channel type MISFET QN8.

For example, in the case where the main circuit is a NAND circuit, the current monitor circuit CM11 and the current monitor circuit CM14 shown in FIG. 5 and FIG. 8 are used. Moreover, in the case where the main circuit is a NOR circuit, the current monitor circuit CM12 and the current monitor circuit CM13 shown in FIG. 6 and FIG. 7 are used. Furthermore, in the case where the main circuit is a circuit composed of a NAND circuit and a NOR circuit, the current monitor circuit CM11 to current monitor circuit CM14 shown in FIGS. 5 to 8 are used.

Preferably, the MISFET QP6 to MISFET QP8 constituting the current monitor circuit CM11 and the current monitor circuit CM13 are the same kind of MISFETs as the MISFET QP1 to MISFET QP4 constituting the main circuit MC1. More specifically, the threshold voltages of the MISFET QP6 to MISFET QP8 are equal to the threshold voltages of the MISFET QP1 to MISFET QP4. Thus, the substrate bias Vbp to be applied to the MISFET QP1 to MISFET QP4 constituting the main circuit MC1 can be controlled with high precision.

Preferably, the MISFET QN6 to MISFET QN8 constituting the current monitor circuit CM12 and the current monitor circuit CM14 are the same kind of MISFETs as the MISFET QN1 to MISFET QN4 constituting the main circuit MC1. More specifically, the threshold voltages of the MISFET QN6 to MISFET QN8 are equal to the threshold voltages of the MISFET QN1 to MISFET QN4. Thus, the substrate bias Vbn to be applied to the MISFET QN1 to MISFET QN4 constituting the main circuit MC1 can be controlled with high precision.

As shown in FIG. 1, the substrate bias generating circuit GC1 generates the substrate bias Vbp and the substrate bias Vbn.

Figure 9:
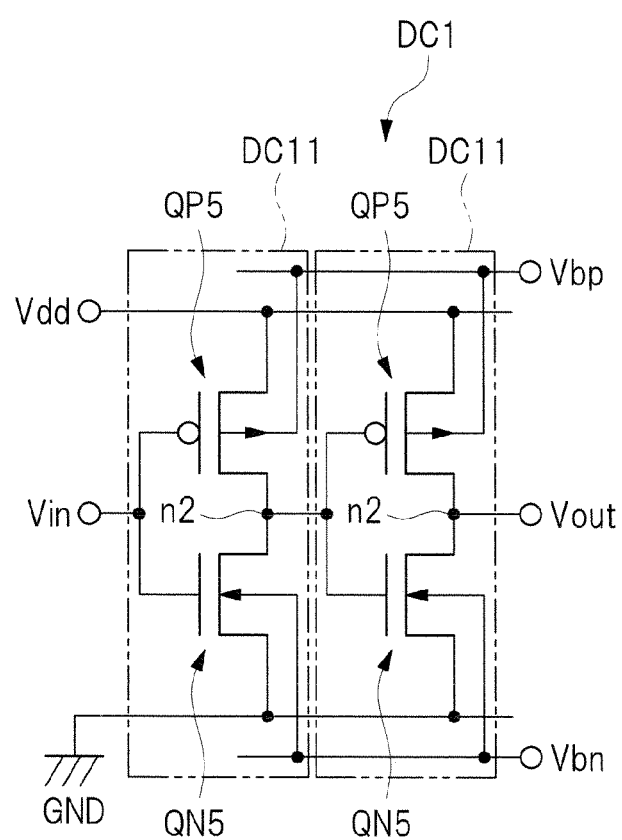
FIG. 9 is a circuit diagram showing a configuration of a part of a speed monitor circuit in the semiconductor integrated circuit device of the first embodiment.

FIG. 9 is a circuit diagram showing a configuration of a part of a speed monitor circuit in the semiconductor integrated circuit device of the first embodiment. FIG. 9 shows an example in which the speed monitor circuit DC1 is provided with two inverter circuits DC11.

Figure 10:
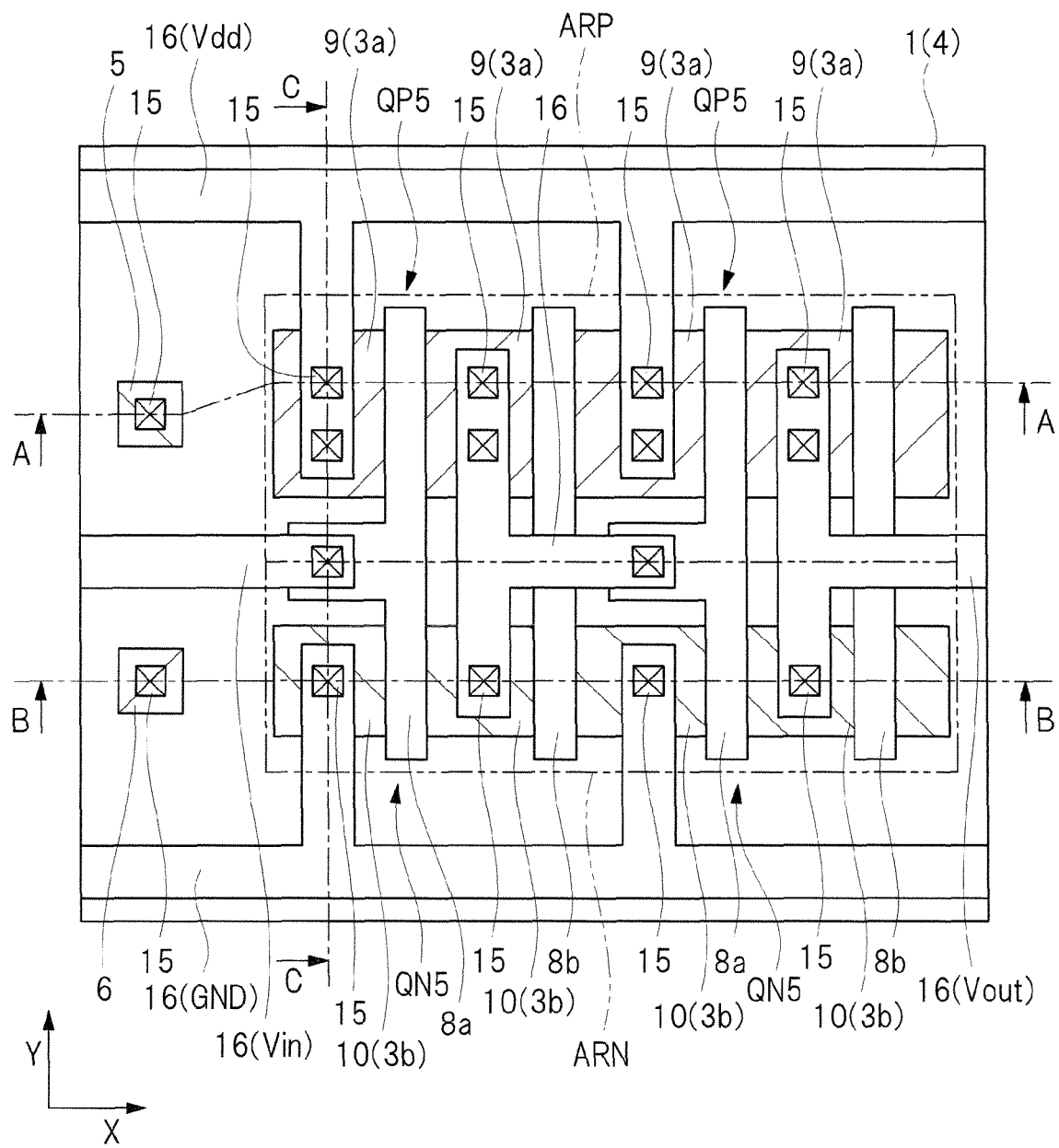
FIG. 10 is a plan view showing the semiconductor integrated circuit device constituting a part of the speed monitor circuit shown in FIG. 9.
Figure 11:
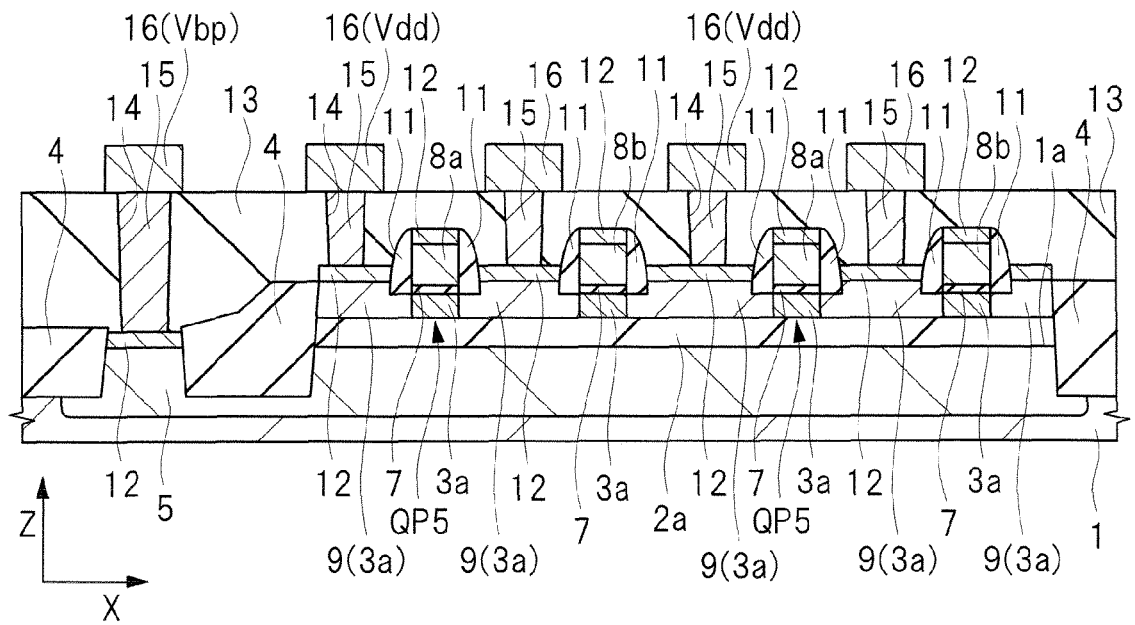
FIG. 11 is a sectional view showing the semiconductor integrated circuit device constituting a part of the speed monitor circuit shown in FIG. 9.
Figure 12:
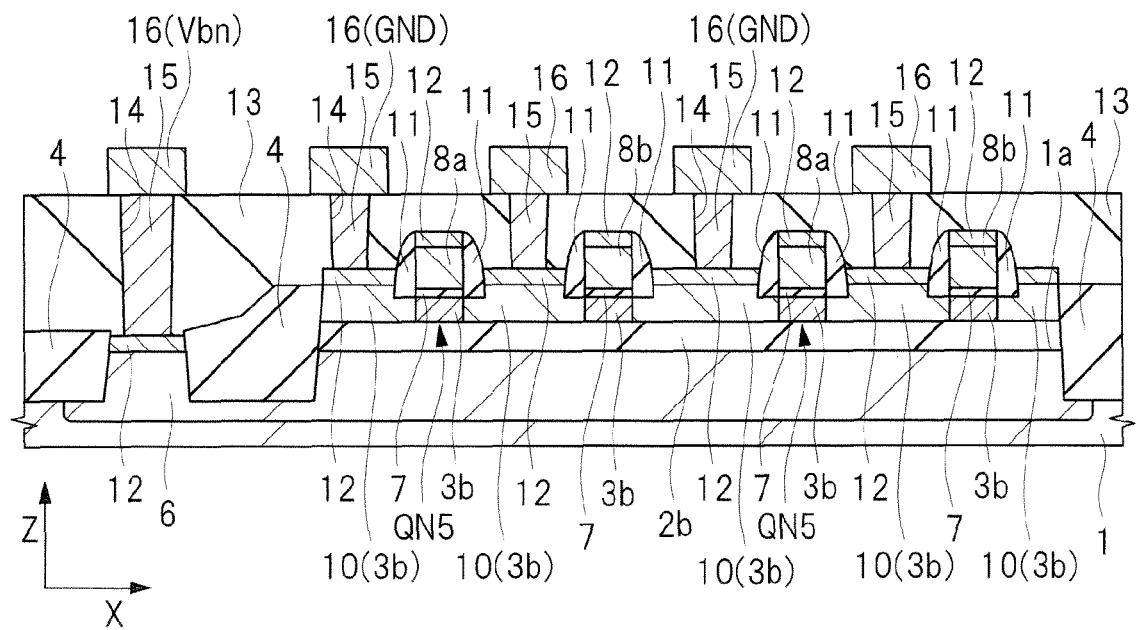
FIG. 12 is a sectional view showing the semiconductor integrated circuit device constituting a part of the speed monitor circuit shown in FIG. 9.
Figure 13:
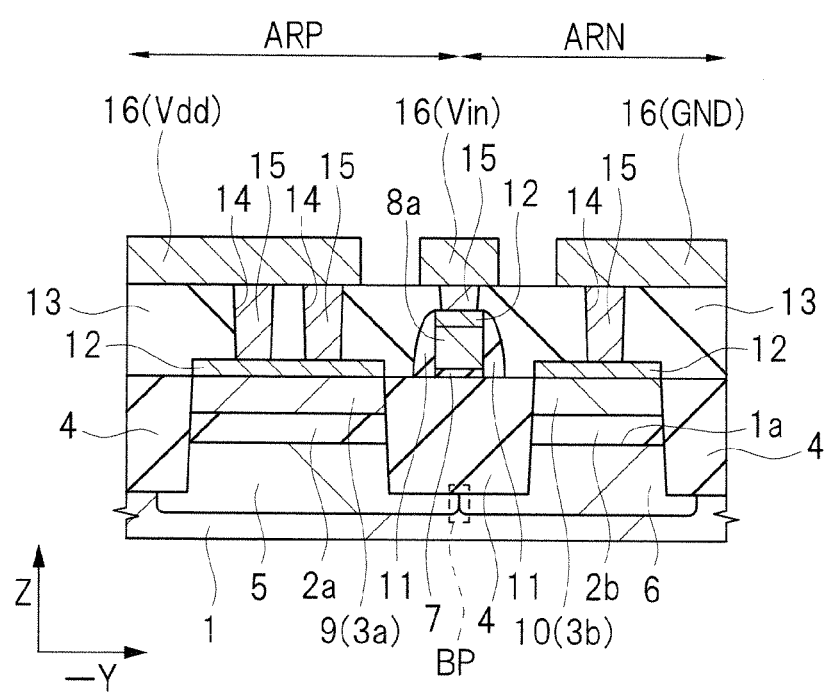
FIG. 13 is a sectional view showing the semiconductor integrated circuit device constituting a part of the speed monitor circuit shown in FIG. 9.

Moreover, FIG. 10 is a plan view of a semiconductor integrated circuit device constituting a part of the speed monitor circuit shown in FIG. 9. FIGS. 11 to 13 are sectional views of the semiconductor integrated circuit device constituting a part of the speed monitor circuit shown in FIG. 9. FIG. 11 is a sectional view taken along a line A-A of FIG. 10, FIG. 12 is a sectional view taken along a line B-B of FIG. 10 and FIG. 13 is a sectional view taken along a line C-C of FIG. 10. Note that FIG. 10 shows a transparent state obtained by removing an interlayer insulating film 13, a silicide layer 12 and a sidewall spacer 11. Moreover, in FIGS. 10 to 13, two directions which are in parallel with a surface 1a serving as the main surface of the support substrate 1 and orthogonal to each other are defined as the X-axis direction and the Y-axis direction, and a direction perpendicular to the surface 1a of the support substrate 1 is defined as the Z-axis direction.

Preferably, the semiconductor integrated circuit device of the first embodiment is formed on an SOI substrate composed of a BOX (Buried Oxide) layer which is a buried oxide film formed on the support substrate and an SOI layer serving as a semiconductor layer formed on the BOX layer.

As shown in FIGS. 10 to 13, the semiconductor integrated circuit device has an area ARP on the surface 1a side of the support substrate 1 and an area ARN on the surface 1a side of the support substrate 1. The area ARP and the area ARN respectively extend in the X-axis direction of FIG. 10 when seen in the plan view, and are disposed so as to be adjacent to each other in the Y-axis direction of FIG. 10. In the area ARP, the p-channel type MISFET QP5 is formed on the support substrate 1, and in the area ARN, the n-channel type MISFET QN5 is formed on the support substrate 1.

As shown in FIGS. 11 to 13, the semiconductor integrated circuit device of the first embodiment has the support substrate 1, a BOX layer 2a serving as an insulating layer formed on the support substrate 1 in the area ARP, and a BOX layer 2b serving as an insulating layer formed on the support substrate 1 in the area ARN. Moreover, the semiconductor integrated circuit device of the first embodiment has an SOI layer 3a serving as a semiconductor layer formed on the BOX layer 2a and an SOI layer 3b serving as a semiconductor layer formed on the BOX layer 2b.

The support substrate 1 is made of, for example, a p-type single-crystal silicon having a plane orientation of (100) and a resistivity of about 5 Ωcm. The BOX layer 2a and BOX layer 2b are made of, for example, a silicon oxide film having a thickness of about 10 nm. Preferably, the BOX layer 2b is an insulating layer of the same layer as the BOX layer 2a. The SOI layer 3a and the SOI layer 3b are made of, for example, a single-crystal silicon having a plane orientation of (100) and a thickness of about 30 nm. More preferably, the SOI layer 3b is a semiconductor layer of the same layer as the SOI layer 3a. On the support substrate 1, an element isolation trench 4 which reaches the support substrate 1 from the surface of the SOI layer 3a and the SOI layer 3b and has a depth of, for example, about 300 nm is formed by a known STI (Shallow Trench Isolation) technique. Inside the element isolation trench 4, an insulating film made of, for example, silicon oxide or the like is buried. Therefore, the SOI layer 3a and the SOI layer 3b are divided by the element isolation trench 4.

As shown in FIGS. 10 and 11, in the area ARP, on the surface 1a side of the support substrate 1, an n-type well 5 serving as an n-type semiconductor region is formed. Moreover, as shown in FIGS. 10 and 12, in the area ARN, on the surface 1a side of the support substrate 1, a p-type well 6 serving as a p-type semiconductor region different from the n-type is formed. The n-type impurity concentration in the n-type well 5 may be set to about $10^{18}$ cm$^{-3}$, and the p-type impurity concentration in the p-type well 6 may be set to about $10^{18}$ cm$^{-3}$. Moreover, the BOX layer 2a is formed on the n-type well 5 in the area ARP, and the BOX layer 2b is formed on the p-type well 6 in the area ARN.

Note that, in a region in which a plug electrically connected to the n-type well 5 is formed, no SOI layer 3a is formed and the n-type well 5 is exposed. Moreover, in a region in which a plug electrically connected to the p-type well 6 is formed, no SOI layer 3b is formed and the p-type well 6 is exposed.

As shown in FIGS. 11 to 13, in the area ARP and the area ARN, a gate electrode 8a is formed on the SOI layer 3a and the SOI layer 3b, with a gate insulating layer 7 interposed therebetween. The gate insulating layer 7 is formed by, for example, subjecting the surface of the SOI layer 3a and the surface of the SOI layer 3b to thermal oxidation. The gate electrode 8a is formed by depositing a polycrystalline silicon film on the SOI layer 3a and the SOI layer 3b, with the gate insulating film 7 interposed therebetween and then performing the dry etching to the deposited polycrystalline silicon film. As shown in FIGS. 11 to 13, in the area ARP and the area ARN, a dummy gate electrode 8b is formed on the SOI layer 3a and the SOI layer 3b, with the gate insulating film 7 interposed therebetween. The dummy gate electrode 8b does not have a function as the gate electrode of the MISFET, but has a function of, for example, adjusting the potential of the SOI layer 3a and the potential of the SOI layer 3b.

As shown in FIG. 11, in the area ARP, p-type semiconductor regions 9 are formed in the SOI layer 3a on the both sides of the gate electrode 8a and the SOI layer 3a on the both sides of the dummy gate electrode 8b. The p-type semiconductor regions 9 are formed by ion-implanting a p-type impurity such as boron (B) to the SOI layer 3a on the both sides of the gate electrode 8a and the SOI layer 3a on the both sides of the dummy gate electrode 8b.

As shown in FIG. 12, in the area ARN, n-type semiconductor regions 10 are formed in the SOI layer 3b on the both sides of the gate electrode 8a and the SOI layers 3b on the both sides of the dummy gate electrode 8b. The n-type semiconductor regions 10 are formed by ion-implanting an n-type impurity such as arsenic (As) or phosphorus (P) to the SOI layer 3b on the both sides of the gate electrode 8a and the SOI layer 3b on the both sides of the dummy gate electrode 8b.

As shown in FIG. 10, the gate electrode 8a and the dummy gate electrode 8b respectively extend in the Y-axis direction of FIG. 10 and are disposed in the X-axis direction of FIG. 10, with gaps interposed therebetween when seen in the plan view.

As shown in FIGS. 11 to 13, in the area ARP and the area ARN, a sidewall spacer 11 is formed on each of the side wall of the gate electrode 8a and the side wall of the dummy gate electrode 8b. The sidewall spacer 11 is formed by etching back the silicon oxide film, which is deposited on the surfaces of the gate electrode 8a and the dummy gate electrode 8b by, for example, a CVD (Chemical Vapor Deposition), by using an anisotropic etching.

Note that, by growing a silicon epitaxial layer on the surface of the p-type semiconductor region 9 after forming the sidewall spacer 11 and then implanting a p-type impurity thereto in the area ARP, the upper surface of the p-type semiconductor region 9 can be made to be positioned on an upper side with respect to a lower surface of the sidewall spacer 11 as shown in FIG. 11. Moreover, by growing a silicon epitaxial layer on the surface of the n-type semiconductor region 10 after forming the sidewall spacer 11 and then implanting an n-type impurity thereto in the area ARN, the upper surface of the n-type semiconductor region 10 can be made to be positioned on an upper side with respect to a lower surface of the sidewall spacer 11 as shown in FIG. 12.

As shown in FIGS. 11 to 13, in the area ARP and the area ARN, a silicide layer 12 is formed on the surfaces of the gate electrode 8a, the dummy gate electrode 8b, the p-type semiconductor region 9 and the n-type semiconductor region 10. The silicide layer 12 is made of nickel (Ni) silicide, cobalt (Co) silicide, or the like. Moreover, on the surface of an exposed portion of the n-type well 5, the silicide layer 12 is formed, and also on the surface of an exposed portion of the p-type well 6, the silicide layer 12 is formed.

On the support substrate 1 including the surfaces of the gate electrode 8a, the dummy gate electrode 8b, the sidewall spacer 11, the p-type semiconductor region 9 and the n-type semiconductor region 10, an interlayer insulating film 13 is formed. In the interlayer insulating film 13, a contact hole 14 which penetrates the interlayer insulating film 13 to reach the surface of any one of the n-type well 5, the p-type wall 6, the gate electrode 8a, the p-type semiconductor region 9 and the n-type semiconductor region 10 is formed. Inside the contact hole 14, a plug 15 made of a conductive film such as a tungsten (W) film buried inside the contact hole 14 is formed. The plug 15 is electrically connected to any one of the n-type well 5, the p-type well 6, the gate electrode 8a, the p-type semiconductor region 9 and the n-type semiconductor region 10, which are exposed on the bottom portion of the contact hole 14, through the silicide layer 12.

On the interlayer insulating film 13, a first layer wire 16 made of, for example, an aluminum (Al) alloy film and electrically connected to the plug 15 is formed. Moreover, although not shown, a plurality of layers of wires can be formed on the first layer wire 16.

In this manner, the p-channel type MISFET QP5 made up of the SOI layer 3a, the gate insulating film 7, the gate electrode 8a and the p-type semiconductor region 9 is formed in the area ARP. Moreover, the n-channel type MISFET QN5 made up of the SOI layer 3b, the gate insulating film 7, the gate electrode 8a and the n-type semiconductor region 10 is formed in the area ARN. In the area ARP, on the SOI layer 3a, two p-channel type MISFETs QP5 are disposed in the X-axis direction, with a gap interposed therebetween, and in the area ARN, on the SOI layer 3b, two n-channel type MISFETs QN5 are disposed in the X-axis direction, with a gap interposed therebetween. Moreover, by the first layer wire 16 electrically connected to the n-type well 5 through the plug 15, the substrate bias Vbp is applied to the n-type well 5, and by the first layer wire 16 electrically connected to the p-type well 6 through the plug 15, the substrate bias Vbn is applied to the p-type well 6. Furthermore, in FIGS. 10 and 13, the first layer wire 16 for inputting the voltage Vin to the gate electrode 8a is shown, and in FIG. 10, the first layer wire 16 for outputting the voltage Vout from the p-type semiconductor region 9 and the n-type semiconductor region 10 is shown.

Although not shown, in the same manner as the p-channel type MISFET QP5, the p-channel type MISFET QP1 to MISFET QP4 and the p-channel type MISFET QP6 to MISFET QP8 are formed on the SOI layer 3a in the area ARP. Moreover, although not shown, in the same manner as the n-channel type MISFET QN5, the n-channel type MISFET QN1 to MISFET QN4 and the n-channel type MISFET QN6 to MISFET QN8 are formed on the SOI layer 3b in the area ARN.

With this configuration, since the substrate bias Vbp can be applied to the n-type well 5 electrically insulated from the SOI layer 3a and the substrate bias Vbn can be applied to the p-type well 6 electrically insulated from the SOI layer 3b, it is possible to adjust the voltage value of the substrate bias Vbp and the substrate bias Vbn in a wide range. Therefore, the substrate bias to be applied to the MISFETs constituting the main circuit MC1 can be controlled with high precision.

Moreover, preferably, the threshold voltages of the respective MISFETs in the area ARP are equal to one another, and the threshold voltages of the respective MISFETs in the area ARN are equal to one another. Thus, the substrate bias to be applied to the MISFETs constituting the main circuit MC1 can be controlled with higher precision.

<Control Method of Substrate Bias for NAND Circuit>

Next, a control method of a substrate bias in the semiconductor integrated circuit device of the first embodiment will be described.

Figure 14:
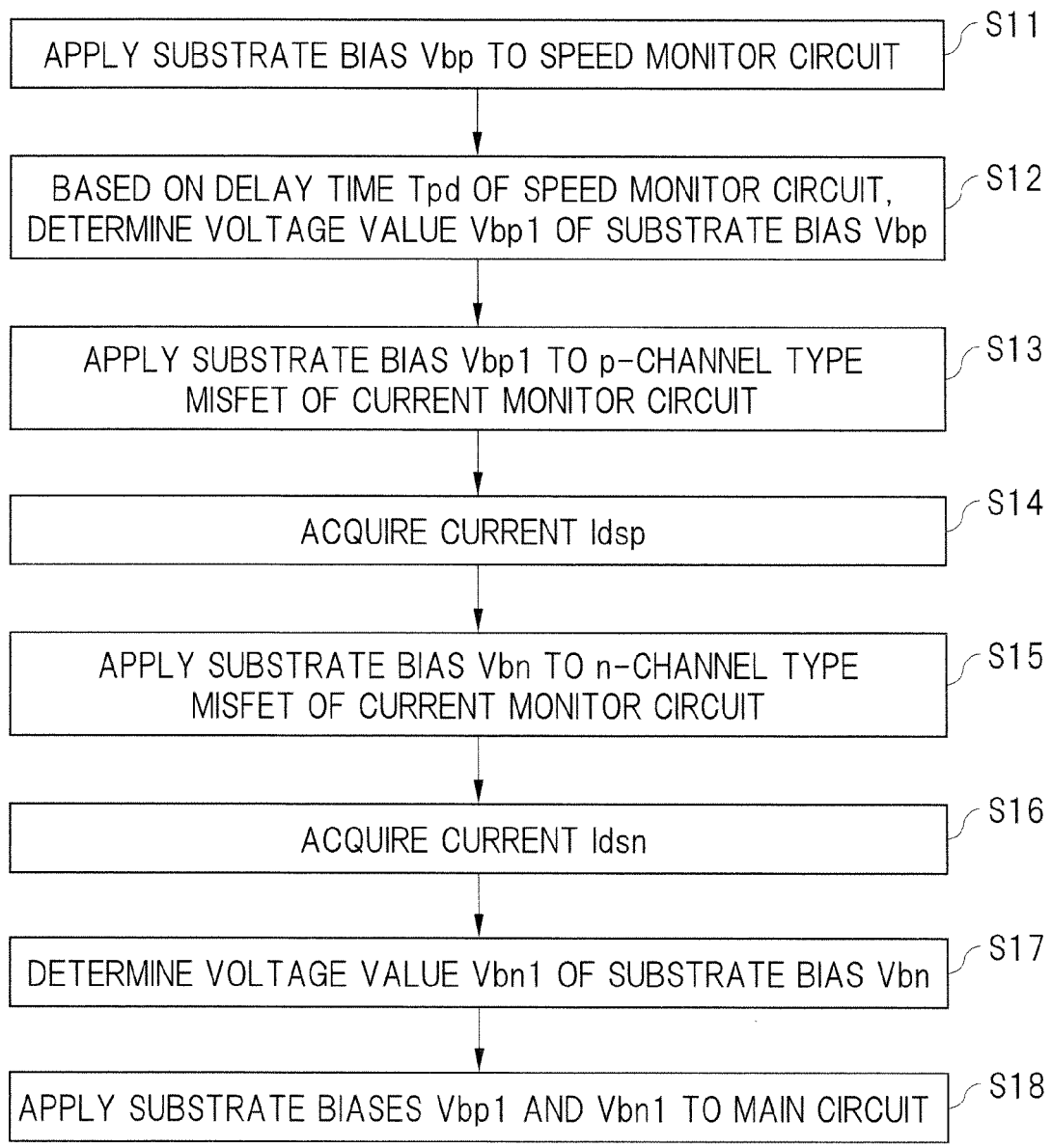
FIG. 14 is a flowchart showing a part of a process for controlling a substrate bias to be applied to the main circuit in the semiconductor integrated circuit device of the first embodiment.
Figure 15:
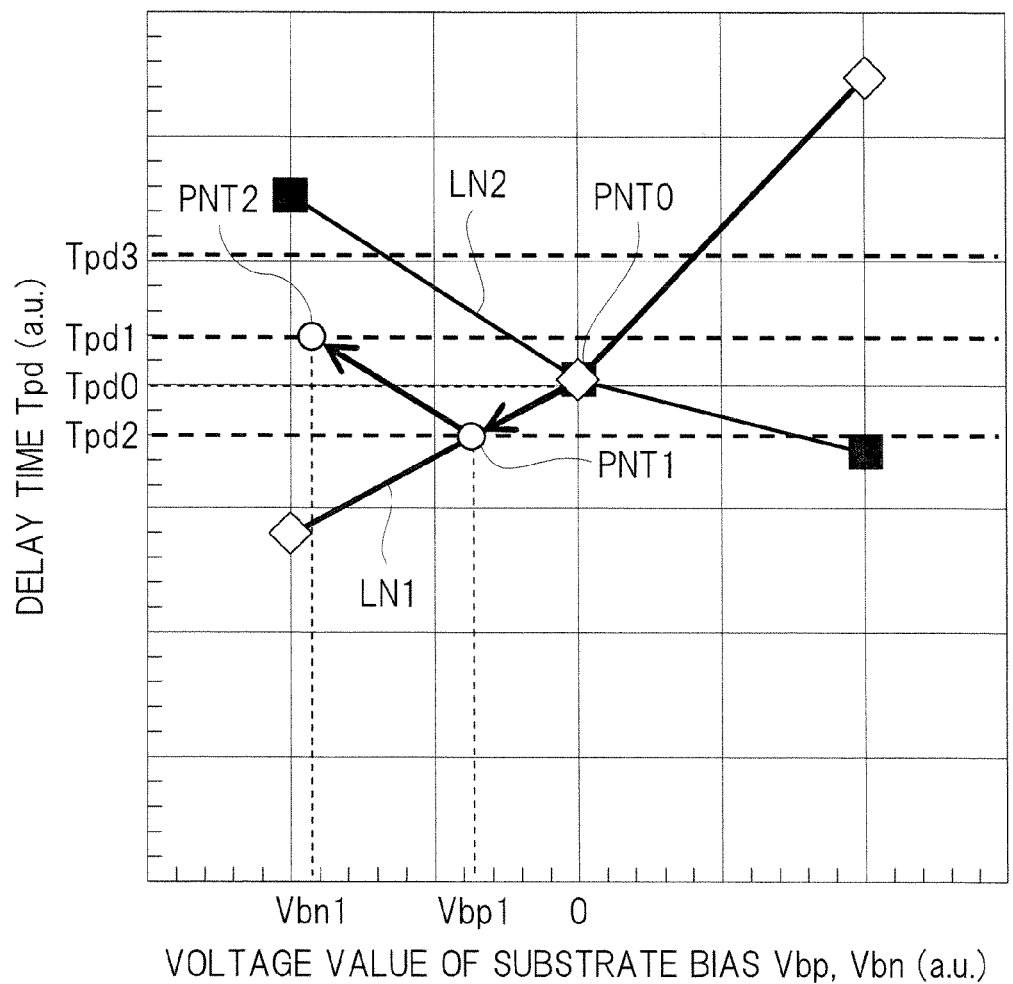
FIG. 15 is a drawing for describing that the voltage value of the substrate bias is determined so that the delay time becomes equal to a target time.

First, an example in which the main circuit is a NAND circuit will be described. FIG. 14 is a flowchart showing a part of a process for controlling a substrate bias to be applied to a main circuit of the semiconductor integrated circuit device of the first embodiment. FIG. 15 is a drawing for describing that the voltage value of the substrate bias is determined so that the delay time becomes equal to a target time. The axis of abscissas of FIG. 15 represents voltage values of the substrate bias Vbp and the substrate bias Vbn, and the axis of ordinate of FIG. 15 represents the delay time Tpd.

First, the substrate bias control circuit CC1 applies the substrate bias Vbp to the speed monitor circuit DC1 (see FIG. 4) (step S11 of FIG. 14), and determines the voltage value Vbp1 of the substrate bias Vbp based on the delay time Tpd of the speed monitor circuit DC1 (step S12 of FIG. 14).

In step S11, the substrate bias control circuit CC1 (see FIG. 1) makes the substrate bias generating circuit GC1 (see FIG. 1) generate the substrate bias Vbp and apply it to the p-channel type MISFET QP5 of the speed monitor circuit DC1 (see FIG. 4). In step S12, the substrate bias control circuit CC1 determines the voltage value Vbp1 of the substrate bias Vbp based on the delay time Tpd of the speed monitor circuit DC1 in a state where the substrate bias Vbp is being applied to the p-channel type MISFET QP5 of the speed monitor circuit DC1.

Preferably, the substrate bias control circuit CC1 determines the voltage value Vbp1 of the substrate bias Vbp so that the delay time Tpd of the speed monitor circuit DC1 becomes a target time Tpd2 smaller than the target time Tpd1 of the delay time of the main circuit MC1.

In FIG. 15, for example, as indicated by a straight line LN1 showing the dependency of the delay time Tpd on the substrate bias Vbp, the delay time Tpd of the inverter circuit DC11 (see FIG. 4) becomes smaller as the substrate bias Vbp to be applied to the p-channel type MISFET QP5 is reduced. More specifically, in conjunction with the reduction of the substrate bias Vbp, the speed of the speed monitor circuit as the delay circuit becomes faster. On the other hand, in FIG. 15, for example, as indicated by a straight line LN2 showing the dependency of the delay time Tpd on the substrate bias Vbn, the delay time Tpd of the inverter circuit DC11 becomes larger as the substrate bias Vbn to be applied to the n-channel type MISFET QN5 is reduced. More specifically, in conjunction with the reduction of the substrate bias Vbn, the speed of the speed monitor circuit as the delay circuit becomes slower.

A state prior to carrying out step S11 and step S12, that is, an initial state at which both of the substrate bias Vbp and the substrate bias Vbn are 0 is represented by a point PNT0 in FIG. 15. The delay time Tpd at the point PNT0 is defined as an initial time Tpd0. In FIG. 15, for example, a state in which the initial time Tpd0 is smaller than the target time Tpd1 of the delay time Tpd is shown, but the initial time Tpd0 may be larger than the target time Tpd1 in some cases.

Moreover, a state after carrying out step S11 and step S12, that is, a state in which the substrate bias Vbn is still kept at 0 and the substrate bias Vbp is set to the voltage value Vbp1 is represented by a point PNT1 in FIG. 15. The delay time Tpd at the point PNT1 is set to a target time Tpd2 which is smaller than the target time Tpd1 of the delay time Tpd.

Specifically, the application of the substrate bias Vbp and the acquisition of the delay time Tpd are repeated, while reducing the voltage value of the substrate bias Vbp from 0 toward the negative side. Then, at the time when the delay time Tpd is reduced from the initial time Tpd0 to reach the target time Tpd2, the substrate bias Vbp at this time can be determined as the voltage value Vbp1. In this case, the point PNT1 is located on the straight line LN1 indicating the dependency of the delay time Tpd on the substrate bias Vbp in a range where the substrate bias Vbp is negative.

Alternatively, the substrate bias control circuit CC1 can determine the voltage value Vbp1 of the substrate bias Vbp so that the delay time Tpd of the speed monitor circuit DC1 becomes a target time Tpd3 larger than the target time Tpd1 of the delay time of the main circuit MC1.

Next, the substrate bias control circuit CC1 applies the substrate bias Vbp1 to the p-channel type MISFET QP6 of the current monitor circuit CM11 (see FIG. 5) (step S13 of FIG. 14) and acquires the current Idsp (step S14 of FIG. 14). Also, the substrate bias control circuit CC1 applies the substrate bias Vbn to the n-channel type MISFET QN7 and the n-channel type MISFET QN8 of the current monitor circuit CM14 (see FIG. 8) (step 915 of FIG. 14) and acquires the current Idsn (step 916 of FIG. 14). Then, the voltage value Vbn1 of the substrate bias Vbn is determined (step S17 of FIG. 14).

In step 913, the substrate bias control circuit CC1 makes the substrate bias generating circuit GC1 generate the substrate bias Vbp set to the voltage value Vbp1, that is, the substrate bias Vbp1 and apply it to the p-channel type MISFET QP6 of the current monitor circuit CM11. In step S14, the substrate bias control circuit CC1 acquires the current Idsp flowing through the p-channel type MISFET QP6 in a state where the substrate bias Vbp1 is being applied thereto, by using the current monitor circuit CM11.

On the other hand, in step S15, the substrate bias control circuit CC1 makes the substrate bias generating circuit GC1 generate the substrate bias Vbn and apply it to the n-channel type MISFET QN7 and the n-channel type MISFET QN8 of the current monitor circuit CM14. In step S16, the substrate bias control circuit CC1 acquires the current Idsn flowing through the n-channel type MISFET QN7 and the n-channel type MISFET QN8 in a state where the substrate bias Vbn is being applied thereto, by using the current monitor circuit CM14. Then, in step S17, the substrate bias control circuit CC1 determines the voltage value Vbn1 of the substrate bias Vbn based on the acquired current Idsp and the acquired current Idsn. At this time, it is desired to determine the substrate bias Vbn and the substrate bias Vbp so that the absolute value of the current Idsp and the absolute value of the current Idsn become equal to each other.

Preferably, the voltage value Vbn1 of the substrate bias Vbn is determined so that a calculated value obtained as a sum of respective reciprocals of the acquired current Idsp and the acquired current Idsn becomes a set value Rt1 which is set in accordance with the target time Tpd1 of the delay time Tpd.

Specifically, step S15 and step S16 are repeated while reducing the substrate bias Vbn from 0 toward the negative side. Then, when the current Idsp acquired in step S14 and the current Idsn acquired in step S16 satisfy the following equation (1), the substrate bias Vbn at that time can be determined as the voltage value Vbn1 in step S17.

$$(1/Idsp)+(1/Idsn)=Rt1 \qquad (1)$$

Preferably, the set value Rt1 is determined so that the delay time Tpd of the main circuit MC1 in a state where the substrate bias Vbp is being applied to the MISFET QP1 and the MISFET QP2 and the substrate bias Vbn is being applied to the MISFET QN1 and the MISFET QN2 in the main circuit MC1 becomes the target time Tpd1. When the delay time Tpd of the main circuit MC1 becomes the target time Tpd1, the current Idsp flowing through the p-channel type MISFET QP1 is defined as the current Idsp1 and the current Idsn flowing through the n-channel type MISFET QN1 and the n-channel type MISFET QN2 is defined as the current Idsn1. At this time, the set value Rt1 satisfies the following equation (2)

$$Rt1=(1/Idsp1)+(1/Idsn1) \quad (2)$$

Specifically, step S15 and step S16 are repeated while reducing the substrate bias Vbn from 0 toward the negative side. Then, when the delay time Tpd of the main circuit MC1 increases from the target time Tpd2 to reach the target time Tpd1, the substrate bias Vbn at this time is determined as the voltage value Vbn1 in step S17.

A state after carrying out these steps S15 to S17, that is, the state where the substrate bias Vbp is set to the voltage value Vbp1 and the substrate bias Vbn is set to the voltage value Vbn1 is represented by a point PNT2 in FIG. 15. The delay time Tpd at the point PNT2 is set to the target time Tpd1 of the delay time Tpd of the main circuit MC1. Moreover, a slope of a straight line formed by connecting the point PNT1 and the point PNT2 is equal to a slope of the straight line LN2 indicating the dependency of the delay time Tpd on the substrate bias Vbn in a range where the substrate bias Vbn is negative.

Note that steps S15 to S17 can be carried out in parallel with steps S13 and S14. However, in the case where the current Idsp is preliminarily obtained by carrying out steps S13 and S14 prior to carrying out steps 915 to S17, it is possible to more easily carry out steps S15 to S17.

Next, the substrate bias Vbp1 and the substrate bias Vbn1 are applied to the main circuit MC1 (step S18 of FIG. 14). At this time, in step S18, the substrate bias control circuit CC1 makes the substrate bias generating circuit GC1 generate the substrate bias Vbp set to the voltage value Vbp1, that is, the substrate bias Vbp1 and apply it to the p-channel type MISFET QP1 and the p-channel type MISFET QP2 of the main circuit MC1. Moreover, in step S18, the substrate bias control circuit CC1 makes the substrate bias generating circuit GC1 generate the substrate bias Vbn set to the voltage value Vbn1, that is, the substrate bias Vbn1 and apply it to the n-channel type MISFET QN1 and the n-channel type MISFET QN2 of the main circuit MC1.

In this control method, in the main circuit MC1, the substrate bias Vbp1 to be applied to the n-type well 5 in the area ARP is negative, and the substrate bias Vbn1 to be applied to the p-type well 6 in the area ARN is also negative. Therefore, since a potential difference between the n-type well 5 and the p-type well 6 can be reduced at an interface between the n-type well 5 and the p-type well 6, that is, at a portion corresponding to a portion BP surrounded by a broken line in FIG. 13, the leakage current flowing between the n-type well 5 and the p-type well 6 can be reduced.

<Control Method of Substrate Bias for NOR Circuit>

Figure 16:
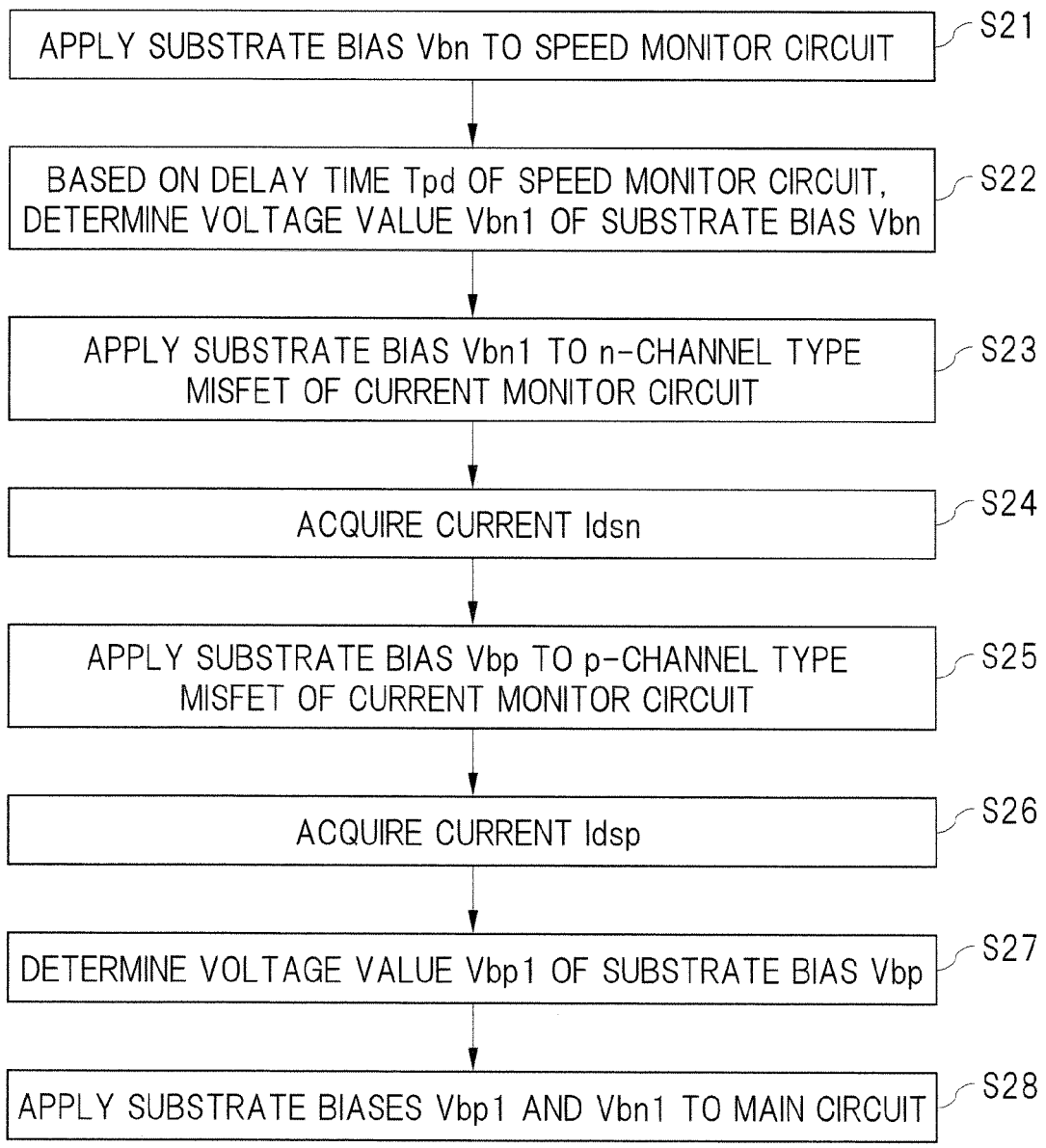
FIG. 16 is a flowchart showing a part of a process for controlling a substrate bias to be applied to the main circuit in the semiconductor integrated circuit device of the first embodiment.
Figure 17:
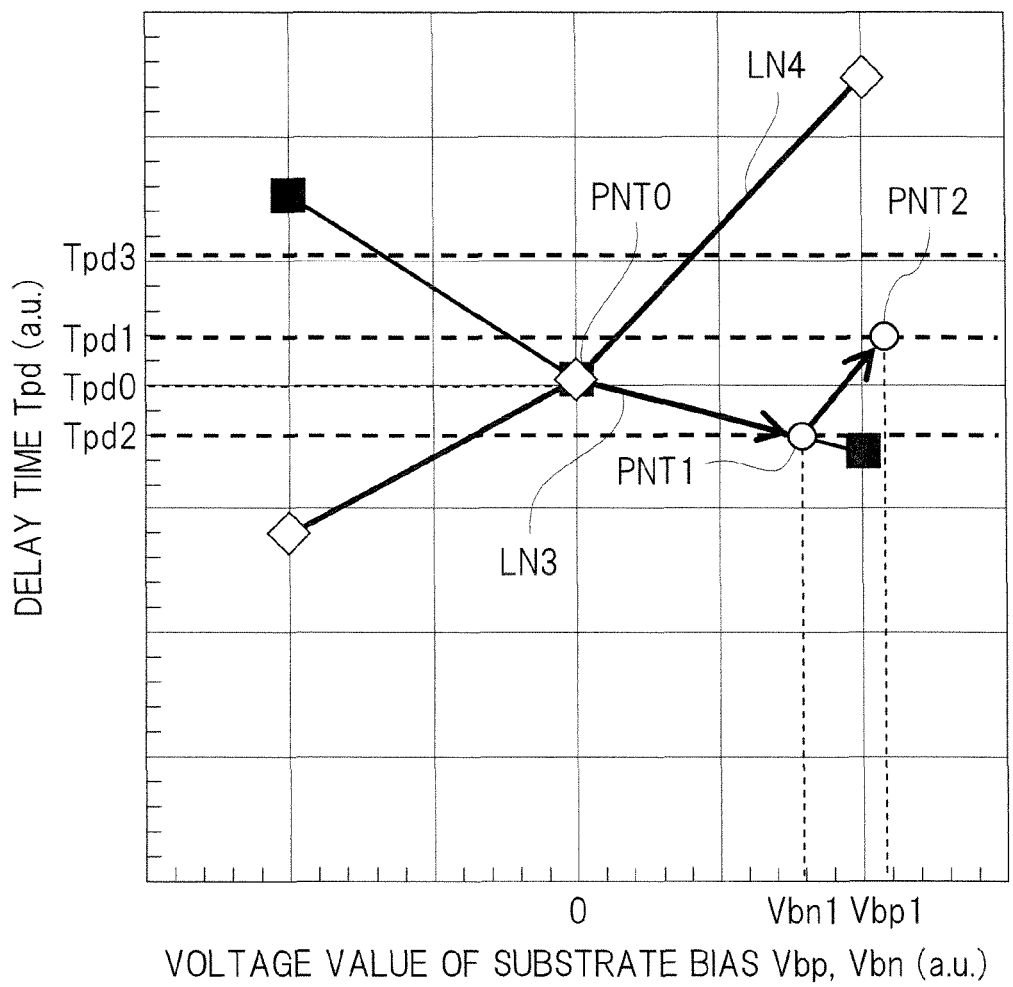
FIG. 17 is a drawing for describing that the voltage value of the substrate bias is determined so that the delay time becomes equal to a target time.

Next, an example in which the main circuit is a NOR circuit will be described. FIG. 16 is a flowchart showing a part of a process for controlling the substrate bias to be applied to the main circuit in the semiconductor integrated circuit device of the first embodiment. FIG. 17 is a drawing for describing that the voltage value of the substrate bias is determined so that the delay time becomes equal to a target time. The axis of abscissas of FIG. 17 represents voltage values of the substrate bias Vbp and the substrate bias Vbn, and the axis of ordinate represents a delay time Tpd.

First, the substrate bias control circuit CC1 applies the substrate bias Vbn to the speed monitor circuit DC1 (step S21 of FIG. 16), and determines the voltage value Vbn1 of the substrate bias Vbn based on the delay time Tpd of the speed monitor circuit DC1 (step S22 of FIG. 16).

In step S21, the substrate bias control circuit CC1 (see FIG. 1) makes the substrate bias generating circuit GC1 (see FIG. 1) generate the substrate bias Vbn and apply it to the n-channel type MISFET QN5 of the speed monitor circuit DC1 (see FIG. 4). In step S22, the substrate bias control circuit CC1 determines the voltage value Vbn1 of the substrate bias Vbn based on the delay time Tpd of the speed monitor circuit DC1 in a state where the substrate bias Vbn is being applied to the n-channel type MISFET QN5 of the speed monitor circuit DC1.

Preferably, the substrate bias control circuit CC1 determines the voltage value Vbn1 of the substrate bias Vbn so that the delay time Tpd of the speed monitor circuit DC1 becomes a target time Tpd2 smaller than the target time Tpd1 of the delay time of the main circuit MC1.

In FIG. 17, for example, as indicated by a straight line LN3 showing the dependency of the delay time Tpd on the substrate bias Vbn, the delay time Tpd of the inverter circuit DC11 (see FIG. 4) becomes smaller as the substrate bias Vbn to be applied to the n-channel type MISFET QN5 is increased. On the other hand, in FIG. 17, for example, as indicated by a straight line LN4 showing the dependency of the delay time Tpd on the substrate bias Vbp, the delay time Tpd of the inverter circuit DC11 becomes larger as the substrate bias Vbp to be applied to the p-channel type MISFET QP5 is increased.

A state prior to carrying out step S21 and step S22, that is, an initial state at which both of the substrate bias Vbp and the substrate bias Vbn are 0 is represented by a point PNT0 in FIG. 17. The delay time Tpd at the point PNT0 is defined as an initial time Tpd0. In FIG. 17, for example, a state in which the initial time Tpd0 is smaller than the target time Tpd1 of the delay time Tpd is shown, but the initial time Tpd0 may be larger than the target time Tpd1 in some cases.

Moreover, a state after carrying out step S21 and step S22, that is, a state in which the substrate bias Vbp is still kept at 0 and the substrate bias Vbn is set to the voltage value Vbn1 is represented by a point PNT1 in FIG. 17. The delay time Tpd at the point PNT1 is set to a target time Tpd2 which is smaller than the target time Tpd1.

Specifically, the application of the substrate bias Vbn and the acquisition of the delay time Tpd are repeated, while increasing the voltage value of the substrate bias Vbn from 0 toward the positive side. Then, at the time when the delay time Tpd is reduced from the initial time Tpd0 to reach the target time Tpd2, the substrate bias Vbn at this time can be determined as the voltage value Vbn1. In this case, the point PNT1 is located on the straight line LN3 indicating the dependency of the delay time Tpd on the substrate bias Vbn in a range where the substrate bias Vbn is positive.

Alternatively, the substrate bias control circuit CC1 can determine the voltage value Vbn1 of the substrate bias Vbn so that the delay time Tpd of the speed monitor circuit DC1 becomes a target time Tpd3 larger than the target time Tpd1 of the delay time of the main circuit MC1.

Next, the substrate bias control circuit CC1 applies the substrate bias Vbn1 to the n-channel type MISFET QN6 of the current monitor circuit CM12 (see FIG. 6) (step S23 of FIG. 16) and acquires the current Idsn (step S24 of FIG. 16). Also, the substrate bias control circuit CC1 applies the substrate bias Vbp to the p-channel type MISFET QP7 and the p-channel type MISFET QP8 of the current monitor circuit CM13 (see FIG. 7) (step S25 of FIG. 16) and acquires the current Idsp (step S26 of FIG. 16). Then, the voltage value Vbp1 of the substrate bias Vbp is determined (step S27 of FIG. 16).

In step S23, the substrate bias control circuit CC1 makes the substrate bias generating circuit GC1 generate the substrate bias Vbn set to the voltage value Vbn1, that is, the substrate bias Vbn1 and apply it to the n-channel type MISFET QN6 of the current monitor circuit CM12. In step S24, the substrate bias control circuit CC1 acquires the current Idsn flowing through the n-channel type MISFET QN6 in a state where the substrate bias Vbn1 is being applied thereto, by using the current monitor circuit CM12.

On the other hand, in step S25, the substrate bias control circuit CC1 makes the substrate bias generating circuit GC1 generate the substrate bias Vbp and apply it to the p-channel type MISFET QP7 and the p-channel type MISFET QP8 of the current monitor circuit CM13. In step S26, the substrate bias control circuit CC1 acquires the current Idsp flowing through the p-channel type MISFET QP7 and the p-channel type MISFET QP8 in a state where the substrate bias Vbp is being applied thereto, by using the current monitor circuit CM13. Then, in step S27, the substrate bias control circuit CC1 determines the voltage value Vbp1 of the substrate bias Vbp based on the acquired current Idsp and the acquired current Idsn.

Preferably, the voltage value Vbp1 of the substrate bias Vbp is determined so that a calculated value obtained as a sum of respective reciprocals of the acquired current Idsp and the acquired current Idsn becomes a set value Rt1 which is set in accordance with the target time Tpd1 of the delay time Tpd.

Specifically, step S25 and step S26 are repeated while increasing the substrate bias Vbp from 0 toward the positive side. Then, when the current Idsn acquired in step S24 and the current Idsp acquired in step S26 satisfy the above-mentioned equation (1), the substrate bias Vbp at that time can be determined as the voltage value Vbp1 in step S27.

Preferably, the set value Rt1 is determined so that the delay time Tpd of the main circuit MC1 in a state where the substrate bias Vbn is being applied to the MISFET QN3 and the MISFET QN4 and the substrate bias Vbp is being applied to the MISFET QP3 and the MISFET QP4 in the main circuit MC1 becomes the target time Tpd1. When the delay time Tpd of the main circuit MC1 becomes the target time Tpd1, the current Idsp flowing through the p-channel type MISFET QP3 and the p-channel type MISFET QP4 is defined as the current Idsp1 and the current Idsn flowing through the n-channel type MISFET QN3 is defined as the current Idsn1. At this time, the set value Rt1 satisfies the above-mentioned equation (2).

Specifically, step S25 and step S26 are repeated while increasing the substrate bias Vbp from 0 toward the positive side. Then, when the delay time Tpd of the main circuit MC1 increases from the target time Tpd2 to reach the target time Tpd1, the substrate bias Vbp at this time is determined as the voltage value Vbp1 in step S27.

A state after carrying out these steps S25 to S27, that is, the state where the substrate bias Vbp is set to the voltage value Vbp1 and the substrate bias Vbn is set to the voltage value Vbn1 is represented by a point PNT2 in FIG. 17. The delay time Tpd at the point PNT2 is set to the target time Tpd1 of the delay time Tpd of the main circuit MC1. Moreover, a slope of a straight line formed by connecting the point PNT1 and the point PNT2 is equal to a slope of the straight line LN4 indicating the dependency of the delay time Tpd on the substrate bias Vbp in a range where the substrate bias Vbp is positive.

Note that steps S25 to S27 can be carried out in parallel with steps S23 and S24. However, in the case where the current Idsn is preliminarily obtained by carrying out steps S23 and S24 prior to carrying out steps S25 to S27, it is possible to more easily carry out steps S25 to S27.

Next, the substrate bias Vbp1 and the substrate bias Vbn1 are applied to the main circuit MC1 (step S28 of FIG. 16). At this time, in step S28, the substrate bias control circuit CC1 makes the substrate bias generating circuit GC1 generate the substrate bias Vbp set to the voltage value Vbp1, that is, the substrate bias Vbp1 and apply it to the p-channel type MISFET QP3 and the p-channel type MISFET QP4 of the main circuit MC1. Moreover, in step S28, the substrate bias control circuit CC1 makes the substrate bias generating circuit GC1 generate the substrate bias Vbn set to the voltage value Vbn1, that is, the substrate bias Vbn1 and apply it to the n-channel type MISFET QN3 and the n-channel type MISFET QN4 of the main circuit MC1.

In this control method, in the main circuit MC1, the substrate bias Vbp1 to be applied to the n-type well 5 in the area ARP is positive, and the substrate bias Vbn1 to be applied to the p-type well 6 in the area ARN is also positive. Therefore, since a potential difference between the n-type well 5 and the p-type well 6 can be reduced at an interface between the n-type well 5 and the p-type well 6, that is, at a portion corresponding to a portion BP surrounded by a broken line in FIG. 13, the leakage current flowing between the n-type well 5 and the p-type well 6 can be reduced.

<Modified Example of Current Monitor Circuit>

Figure 18:
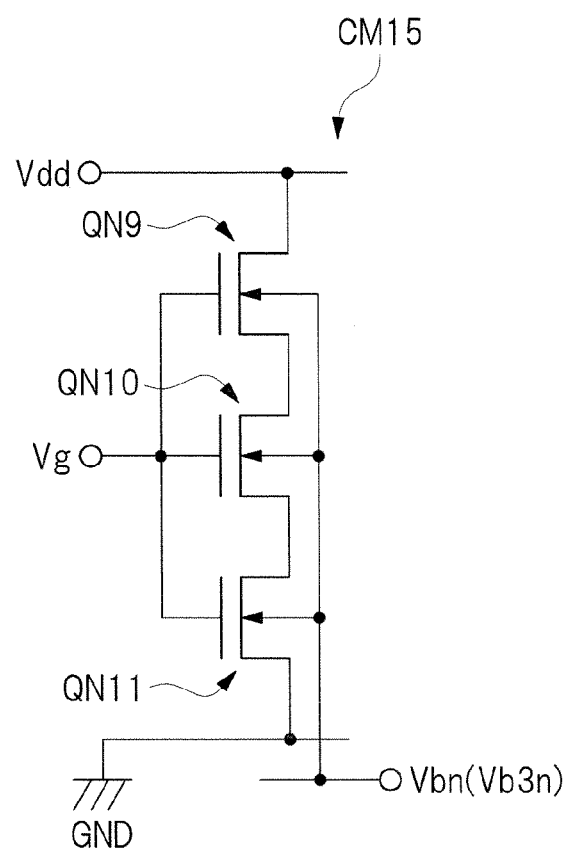
FIG. 18 is a circuit diagram showing a configuration of a current monitor circuit in a semiconductor integrated circuit device of a modified example of the first embodiment.
Figure 19:
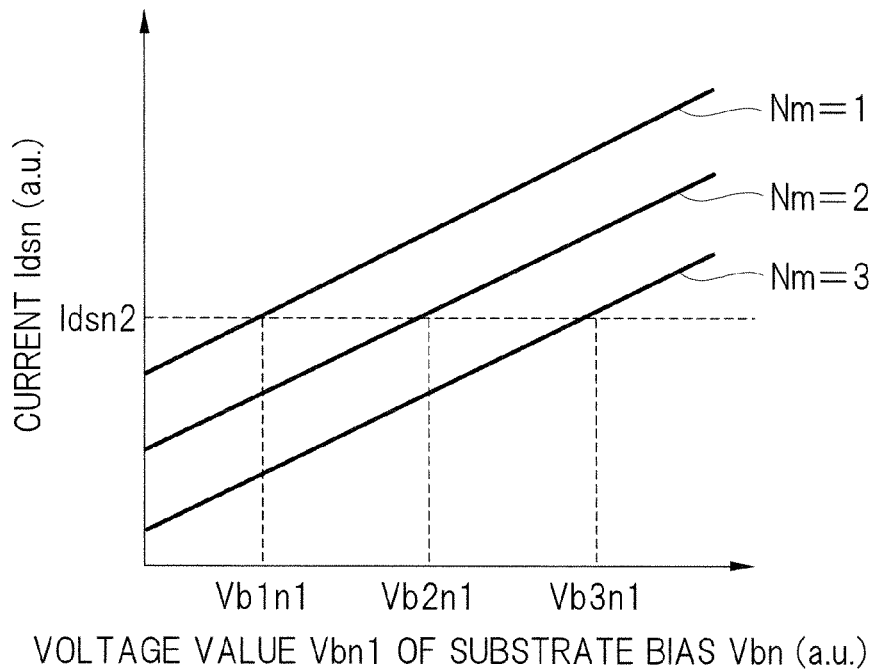
FIG. 19 is a graph schematically showing a relationship between a voltage value of a substrate bias and a current flowing through the current monitor circuit.
Figure 20:
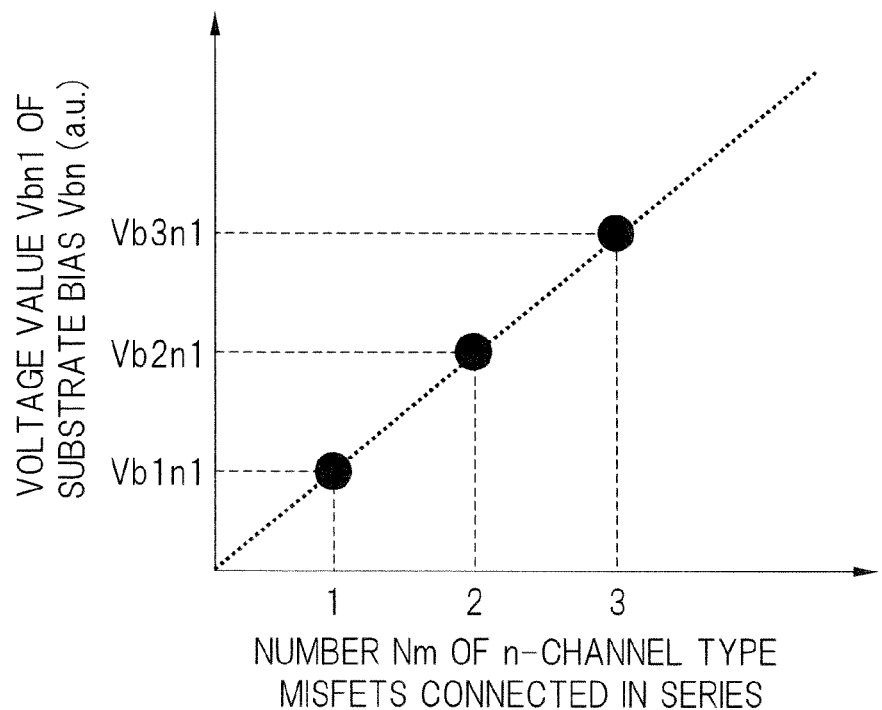
FIG. 20 is a graph schematically showing a relationship between the number of n-channel type MISFETs connected in series and the voltage value of the substrate bias.

Next, a modified example of the current monitor circuit CM1 will be described. FIG. 18 is a circuit diagram showing a configuration of a current monitor circuit in a semiconductor integrated circuit device of the modified example of the first embodiment. FIG. 19 is a graph schematically showing a relationship between the voltage value Vbn1 of the substrate bias Vbn and the current Idsn flowing through the current monitor circuit. FIG. 20 is a graph schematically showing a relationship between the number Nm of the n-channel type MISFETs connected in series and the voltage value Vbn1 of the substrate bias Vbn.

In the modified example, as the current monitor circuit having the n-channel type MISFET, the current monitor circuit CM12 shown in FIG. 6, the current monitor circuit CM14 shown in FIG. 8 and the current monitor circuit CM15 shown in FIG. 18 are provided. Also, in the current monitor circuit CM12, the substrate bias Vbn to be applied to the n-channel type MISFET QN6 is defined as a substrate bias Vb1n. Furthermore, in the current monitor circuit CM14, the substrate bias Vbn to be applied to the n-channel type MISFET QN7 and the n-channel type MISFET QN8 is defined as a substrate bias Vb2n.

As shown in FIG. 18, the current monitor circuit CM15 has an n-channel type MISFET QN9, an n-channel type MISFET QN10 and an n-channel type MISFET QN11. The n-channel type MISFET QN9, the n-channel type MISFET QN10 and the n-channel type MISFET QN11 are connected in series with one another between a power supply line to which the power supply voltage Vdd is applied and the ground line having the ground potential GND. A drain electrode of the n-channel type MISFET QN9 is connected to the power supply voltage Vdd, that is, to the power supply. A source electrode of the n-channel type MISFET QN9 is connected to a drain electrode of the n-channel type MISFET QN10. A source electrode of the n-channel type MISFET QN10 is connected to a drain electrode of the n-channel type MISFET QN11. A source electrode of the n-channel type MISFET QN11 is connected to the ground potential GND, that is, is grounded. Moreover, the substrate bias Vbn is applied as the substrate bias voltage to the n-channel type MISFET QN9, the n-channel type MISFET QN10 and the n-channel type MISFET QN11. In the current monitor circuit CM15, the substrate bias Vbn to be applied to the n-channel type MIS- FET QN9, the n-channel type MISFET QN10 and the n-channel type MISFET QN11 is defined as a substrate bias Vb3n.

For example, in a NAND circuit, the number of n-channel type MISFETs mutually connected in series with each other can take various values in accordance with a target circuit operation. Therefore, as the current monitor circuit having the n-channel type MISFETs, a plurality of current monitor circuits are preferably provided so that the number Nm of n-channel type MISFETs mutually connected in series becomes 1, 2 or 3. At this time, as shown in FIG. 19, in each of the cases where the number Nm of n-channel type MISFETs is 1, 2 and 3, the current Idsn flowing through the n-channel type MISFETs of the current monitor circuit increases in conjunction with the increase of each of the substrate bias Vb1n, the substrate bias Vb2n and the substrate bias Vb3n.

However, in the case where the same voltage value is applied as the substrate bias Vb1n, the substrate bias Vb2n and the substrate bias Vb3n, the current Idsn becomes smaller as the number Nm of n-channel type MISFETs becomes larger. More specifically, a straight line indicating a relationship between the substrate bias Vbn and the current Idsn is located on a lower side as the number Nm of n-channel type MISFETs becomes larger.

Here, as shown in FIG. 19, the current Idsn at the time when the current Idsn satisfies the above-mentioned equation (1) is defined as a target current Idsn2. Also, the respective voltage values of the substrate bias Vb1n, the substrate bias Vb2n and the substrate bias Vb3n at the time when the current Idsn becomes the target current Idsn2 are defined as a voltage value Vb1n1, a voltage value Vb2n1 and a voltage value Vb3n1. At this time, as shown in FIG. 19 and FIG. 20, the voltage value Vb1n1, the voltage value Vb2n1 and the voltage value Vb3n1 rise in this order. More specifically, the voltage value determined as the voltage value Vbn1 of the substrate bias Vbn rises in conjunction with the increase of the number Nm of n-channel type MISFETs connected in series with each other.

Therefore, when a plurality of current monitor circuits are prepared so that the number Nm of n-channel type MISFETs connected in series with each other becomes 1, 2 and 3, an optimal voltage value Vbn1 of the substrate bias Vbn is easily determined in accordance with each of the numbers Nm. Alternatively, since a change rate of the voltage value Vbn1 of the substrate bias Vbn relative to the number Nm of n-channel type MISFETs connected in series with each other can be obtained, the voltage value Vbn1 of the substrate bias Vbn can be determined with higher precision.

For example, when step S14 of FIG. 14 is carried out and then step S15 of FIG. 14 is carried out, the substrate bias control circuit CC1 makes the substrate bias generating circuit GC1 generate the substrate bias Vb1n and apply it to the n-channel type MISFET QN6 of the current monitor circuit CM12 (see FIG. 6). Also, the substrate bias control circuit CC1 makes the substrate bias generating circuit GC1 generate the substrate bias Vb3n and apply it to the n-channel type MISFET QN9, n-channel type MISFET QN10 and n-channel type MISFET QN11 of the current monitor circuit CM15 (see FIG. 18). Note that, in the same manner as the first embodiment, the substrate bias control circuit CC1 makes the substrate bias generating circuit GC1 generate the substrate bias Vb2n and apply it to the n-channel type MISFET QN7 and the n-channel type MISFET QN8 of the current monitor circuit CM14 (see FIG. 8).

Moreover, when carrying out step S16, the substrate bias control circuit CC1 acquires the current Idsn (hereinafter, referred to as current Ids1n) flowing through the n-channel type MISFET QN6 in a state where the substrate bias Vb1n is being applied thereto, by using the current monitor circuit CM12. Furthermore, it also acquires the current Idsn (hereinafter, referred to as current Ids3n) flowing through the n-channel type MISFET QN9, the n-channel type MISFET QN10 and the n-channel type MISFET QN11 in a state where the substrate bias Vb3n is being applied thereto, by using the current monitor circuit CM15. Note that, in the same manner as the first embodiment, the substrate bias control circuit CC1 acquires the current Idsn (hereinafter, referred to as current Ids2n) flowing through the MISFET QN7 and the MISFET QN8 in a state where the substrate bias Vb2n is being applied thereto, by using the current monitor circuit CM14.

Furthermore, when carrying out step S18, the substrate bias control circuit CC1 determines the voltage value Vb1n1 of the substrate bias Vb1n based on the acquired current Idsp and the acquired current Ids1n. Also, the substrate bias control circuit CC1 determines the voltage value Vb3n1 of the substrate bias Vb3n based on the acquired current Idsp and the acquired current Ids3n. Note that, in the same manner as the first embodiment, the substrate bias control circuit CC1 determines the voltage value Vb2n1 of the substrate bias Vb2n based on the acquired current Idsp and the acquired current Ids2n. Also, a method of specifically determining the voltage value Vb1n1 and the voltage value Vb3n1 may be the same as the method of determining the voltage value Vb2n1.

Preferably, the MISFET QN9 to MISFET QN11 constituting the current monitor circuit CM15 are the same kind of MISFETs as the MISFET QN1 and the MISFET QN2 constituting the main circuit MC1. More specifically, the threshold voltages of the MISFET QN9 to MISFET QN11 are equal to the threshold voltages of the MISFET QN1 and MISFET QN2. Thus, the substrate bias Vbn to be applied to the MISFET QN1 and the MISFET QN2 constituting the main circuit MC1 can be controlled with high precision.

In the description above, the case where the main circuit is a NAND circuit and the MISFETs connected in series with each other are n-channel type MISFETs has been described. However, even in the case where the main circuit is a NOR circuit and the MISFETs connected in series with each other are p-channel type MISFETs, a plurality of current monitor circuits can be prepared so that the number Nm of p-channel type MISFETs connected in series with each other becomes 1, 2 and 3 in the same manner. Thus, an optimal voltage value Vbp1 of the substrate bias Vbp can be easily determined in accordance with each of the numbers Nm. Alternatively, since a change rate of the voltage value Vbp1 of the substrate bias Vbp relative to the number Nm of p-channel type MISFETs connected in series with each other can be obtained, the voltage value Vbp1 of the substrate bias Vbp can be determined with higher precision.

<Another Method of Compensating for Variations in Threshold Voltage>

As another method of compensating for variations in the threshold voltage, a method is proposed, in which a voltage value of a substrate bias to be applied to a replica circuit formed in a semiconductor integrated circuit device is determined so that the delay time of the replica circuit becomes a target time and the threshold voltage is controlled by applying the substrate bias set to this voltage value to the main circuit. However, forming the replica circuit in the semiconductor integrated circuit device increases the area of the semiconductor integrated circuit device by an area corresponding to the formed replica circuit, and this method is thus disadvantageous from the viewpoint of downsizing the semiconductor integrated circuit device.

On the other hand, as still another method of compensating for variations in the threshold voltage, a method is proposed, in which a delay circuit such as a ring oscillator circuit is formed in the semiconductor integrated circuit device, a voltage value of a substrate bias to be applied to the formed delay circuit is determined so that the delay time of the delay circuit becomes a target time and the threshold voltage is controlled by applying the substrate bias set to this voltage value to the main circuit.

However, in the case where a delay circuit having a simple circuit such as a ring oscillator circuit provided with a plurality of CMIS inverter circuits is employed, even when a substrate bias set to a voltage value determined so that the delay time of the delay circuit becomes a target time is applied to the main circuit, the delay time of the main circuit does not become a target time. This is because, when the main circuit is a circuit such as a NAND circuit or a NOR circuit, since n-channel type or p-channel type MISFETs connected in series with each other are included in the main circuit, the delay time of the main circuit is different from the delay time of the simple delay circuit even when the substrate bias set to the same voltage value is applied thereto. For this reason, it is difficult to control the delay time of the main circuit to be a target time by applying a substrate bias having the voltage value determined so that the delay time of the delay circuit becomes a target time. Therefore, it is not possible to easily compensate for characteristic variations such as the threshold voltage of MISFETs constituting the main circuit, and performances of the semiconductor integrated circuit device are deteriorated.

<Main Characteristics and Effects of Present Embodiment>

The semiconductor integrated circuit device of the first embodiment includes, as a current monitor circuit, a circuit in which MISFETs of one channel type out of a p-channel type and an n-channel type are connected in series with each other in the same manner as a main circuit, in addition to a speed monitor circuit. Based on a delay time of the speed monitor circuit in a state where a substrate bias is being applied to the MISFETs of the other channel type in the MISFETs constituting the inverter circuit included in the speed monitor circuit, a voltage value of the substrate bias to be applied to the MISFETs of the other channel type is determined. Next, the substrate bias set to the voltage value is applied to the MISFETs of the other channel type, and the substrate bias is applied to the MISFETs of the one channel type. Then, based on the currents flowing through the MISFETs of the respective channel types in a state where the substrate bias is being applied in this manner, the voltage value of the substrate bias to be applied to the MISFETs of the one channel type is determined.

By using such a current monitor circuit in combination with a speed monitor circuit, even when a circuit in which MISFETs of one channel type out of the p-channel type and the n-channel type are connected in series with each other is provided as the main circuit, the voltage value of the substrate bias can be controlled with high precision so that the delay time of the main circuit becomes a target time. Therefore, since it is possible to easily compensate for variations in characteristics such as the threshold voltage and the like of the MISFETs constituting the main circuit, the performances of the semiconductor integrated circuit device can be improved. Moreover, since it is possible to control the voltage value of the substrate bias with high precision so that the delay time of the main circuit becomes the target time without the necessity of forming the same circuit as the main circuit, that is, the replica circuit, the performances of the semiconductor integrated circuit device can be improved.

Considerations are given to a case in which the above-mentioned variations in characteristics such the threshold voltage of the MISFET are not variations of threshold voltage inside the individual chips, that is, so-called local variations, but variations of threshold voltage among chips caused by variations in the manufacturing process of the semiconductor integrated circuit device, that is, so-called global variations. In such a case, since it is possible to easily control the threshold voltage by applying the same substrate bias to the plurality of MISFETs inside the chip, the effect of compensating for the variations in the threshold voltage is enhanced.

(Second Embodiment)

In the semiconductor integrated circuit device of the first embodiment, preferably, of the MISFETs constituting the main circuit and the substrate bias control circuit, the p-channel type MISFETs have the same threshold voltage and the n-channel type MISFETs have the same threshold voltage. In contrast, in the semiconductor integrated circuit device of the second embodiment, the main circuit and the substrate bias control circuit are formed in each of a plurality of circuit areas among which threshold voltages of the p-channel type MISFETs are different and threshold voltages of the n-channel type MISFETs are different.

In the following description, the case where the main circuit and the substrate bias control circuit are formed in each of the two areas between which threshold voltages of the MISFETs are different will be described. However, in the semiconductor integrated circuit device of the second embodiment, the main circuit and the substrate bias control circuit may be formed in each of three or more areas among which threshold voltages of the MISFETs are different.

<Configuration of Semiconductor Integrated Circuit Device>

In the semiconductor integrated circuit device of the second embodiment, MISFETs constituting the main circuit and the substrate bias control circuit are formed in two circuit areas HVT and LVT between which threshold voltages of the p-channel type MISFETs are different and threshold voltages of the n-channel type MISFETs are different.

The absolute values of the respective threshold voltages of the p-channel type MISFETs formed in the circuit area HVT are larger than the absolute values of the respective threshold voltages of the p-channel type MISFETs formed in the circuit area LVT.

The absolute values of the respective threshold voltages of the n-channel type MISFETs formed in the circuit area HVT are larger than the absolute values of the respective threshold voltages of the n-channel type MISFETs formed in the circuit area LVT.

In the following description, for example, a case where the main circuit is a NAND circuit will be described. However, even in the case where the main circuit is a NOR circuit, the same configuration as the configuration using a NAND circuit as the main circuit can be obtained by inverting all the channel types and the conductivity types and by inverting the connection to the power supply voltage Vdd and the connection to the ground potential GND.

Figure 21:
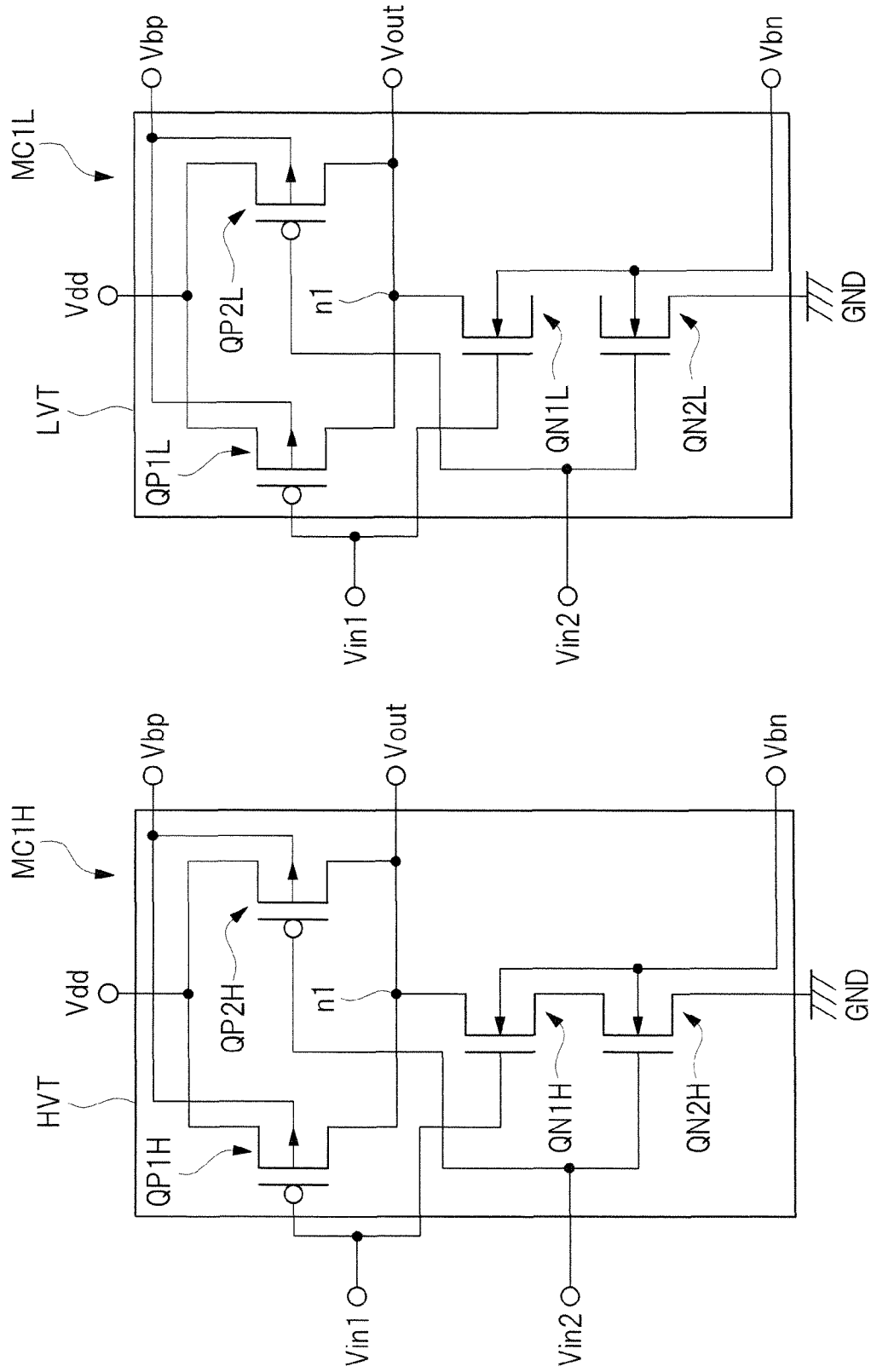
FIG. 21 is a circuit diagram showing a configuration of a NAND circuit as one example of a main circuit in a semiconductor integrated circuit device of the second embodiment.
Figure 22:
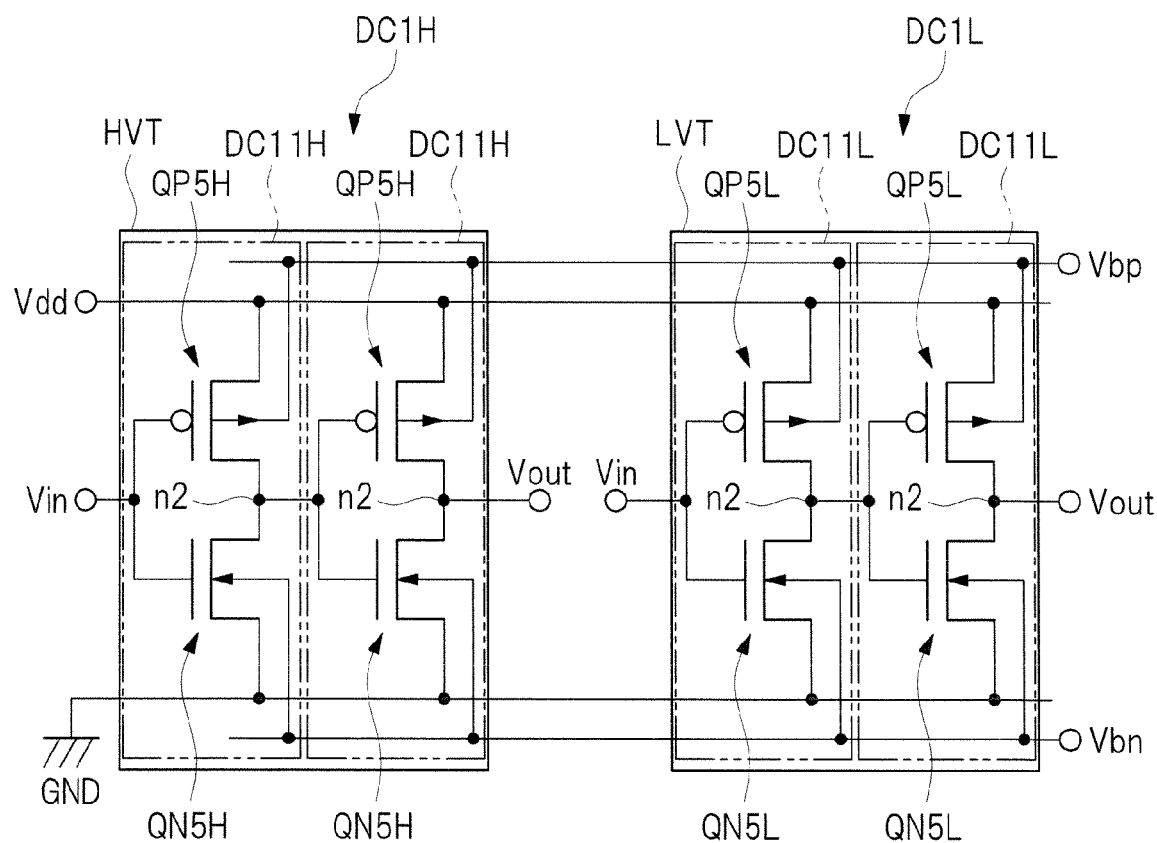
FIG. 22 is a circuit diagram showing a configuration of a speed monitor circuit in the semiconductor integrated circuit device of the second embodiment.
Figure 23:
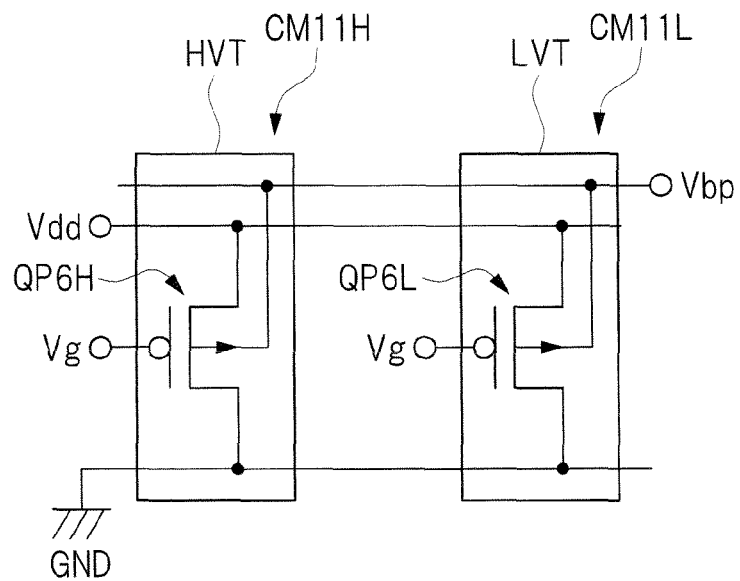
FIG. 23 is a circuit diagram showing a configuration of a current monitor circuit in the semiconductor integrated circuit device of the second embodiment.
Figure 24:
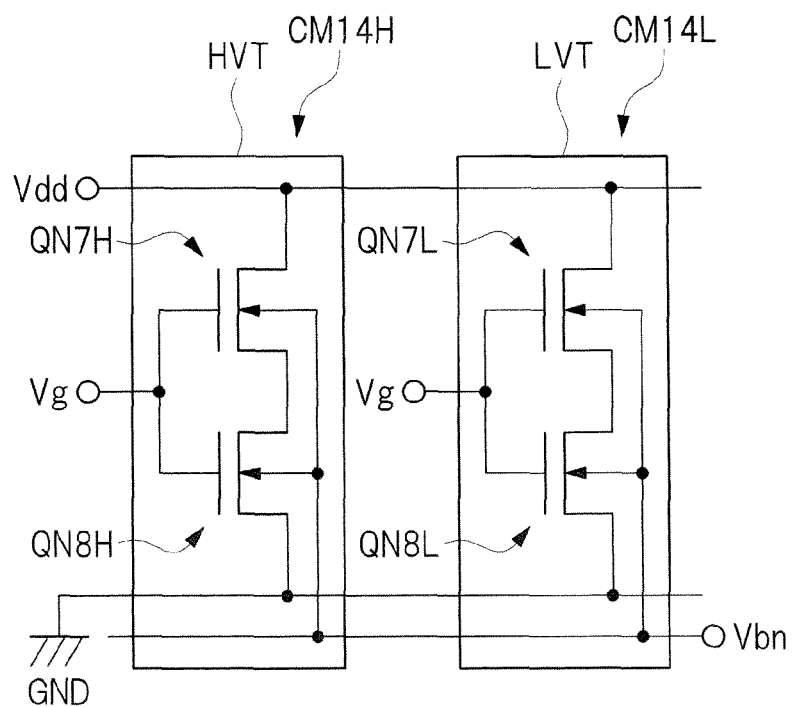
FIG. 24 is a circuit diagram showing a configuration of a current monitor circuit in the semiconductor integrated circuit device of the second embodiment.

FIG. 21 is a circuit diagram showing a configuration of a NAND circuit as one example of the main circuit in the semiconductor integrated circuit device of the second embodiment. FIG. 22 is a circuit diagram showing a configuration of a speed monitor circuit in the semiconductor integrated circuit device of the second embodiment. FIG. 23 and FIG. 24 are circuit diagrams showing configurations of current monitor circuits in the semiconductor integrated circuit device of the second embodiment.

As shown in FIG. 21, in the circuit area HVT, a main circuit MC1H has two inputs of a voltage Vin1 and a voltage Vin2 and has one output of a voltage Vout. Also, in the circuit area HVT, the main circuit MC1H includes a p-channel type MISFET QP1H, a p-channel type MISFET QP2H, an n-channel type MISFET QN1H and an n-channel type MISFET QN2H.

On the other hand, as shown in FIG. 21, in the circuit area LVT, a main circuit MC1L has two inputs of a voltage Vin1 and a voltage Vin2 and has one output of a voltage Vout. Also, in the circuit area LVT, the main circuit MC1L includes a p-channel type MISFET QP1L, a p-channel type MISFET QP2L, an n-channel type MISFET QN1L and an n-channel type MISFET QN2L.

As shown in FIG. 21, the main circuit MC1H in the circuit area HVT and the main circuit MC1L in the circuit area LVT have the same configurations as that of the main circuit MC1 described with reference to FIG. 2 in the first embodiment except that the threshold voltages of MISFETs of the same channel type constituting the respective circuits are different from each other.

As shown in FIG. 22, in the circuit area HVT, a speed monitor circuit DC1H serving as a delay circuit is provided with a plurality of inverter circuits DC11H. Moreover, each inverter circuit DC11H includes, for example, a p-channel type MISFET QP5H and an n-channel type MISFET QN5H. On the other hand, in the circuit area LVT, a speed monitor circuit DC1L serving as a delay circuit is provided with a plurality of inverter circuits DC11L, and each inverter circuit DC11L includes, for example, a p-channel type MISFET QP5L and an n-channel type MISFET QN5L.

As shown in FIG. 22, the speed monitor circuit DC1H in the circuit area HVT and the speed monitor circuit DC1L in the circuit area LVT have the same configurations as that of the speed monitor circuit DC1 described with reference to FIG. 4 in the first embodiment except that the threshold voltages of the MISFETs of the same channel type constituting the respective circuits are different from each other.

As shown in FIG. 23, in the circuit area HVT, a current monitor circuit CM11H is provided with a p-channel type MISFET QP6H. On the other hand, in the circuit area LVT, a current monitor circuit CM11L is provided with a p-channel type MISFET QP6L.

As shown in FIG. 23, the current monitor circuit CM11H in the circuit area HVT and the current monitor circuit CM11L in the circuit area LVT have the same configurations as that of the current monitor circuit MC11 described with reference to FIG. 5 in the first embodiment except that the threshold voltages of the MISFETs of the same channel type constituting the respective circuits are different from each other.

As shown in FIG. 24, in the circuit area HVT, a current monitor circuit CM14H is provided with an n-channel type MISFET QN7H and an n-channel type MISFET QN8H. On the other hand, in the circuit area LVT, a current monitor circuit CM14L is provided with an n-channel type MISFET QN7L and an n-channel type MISFET QN8L.

As shown in FIG. 24, the current monitor circuit CM14H in the circuit area HVT and the current monitor circuit CM14L in the circuit area LVT have the same configurations as that of the current monitor circuit MC14 described with reference to FIG. 8 in the first embodiment except that the threshold voltages of the MISFETs of the same channel type constituting the respective circuits are different from each other.

Next, the relationship between the circuit areas HVT and LVT and the areas ARP and ARN will be described. In the following description, the speed monitor circuit is taken as an example from among the circuits constituting the semiconductor integrated circuit device. However, the same is true of the circuits other than the speed monitor circuit among the circuits constituting the semiconductor integrated circuit device such as the current monitor circuit.

Figure 25:
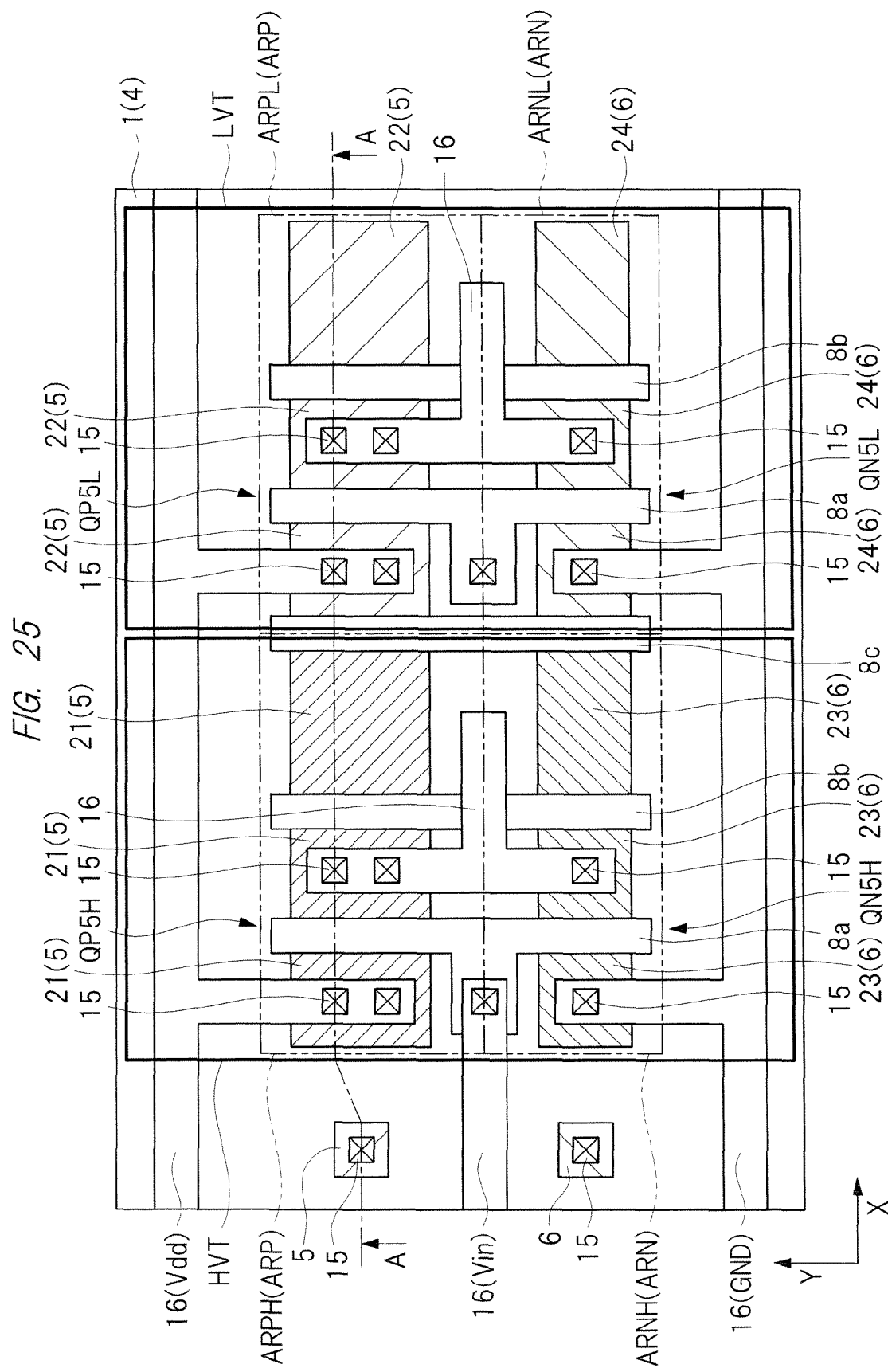
FIG. 25 is a plan view of the semiconductor integrated circuit device constituting a part of the speed monitor circuit.
Figure 26:
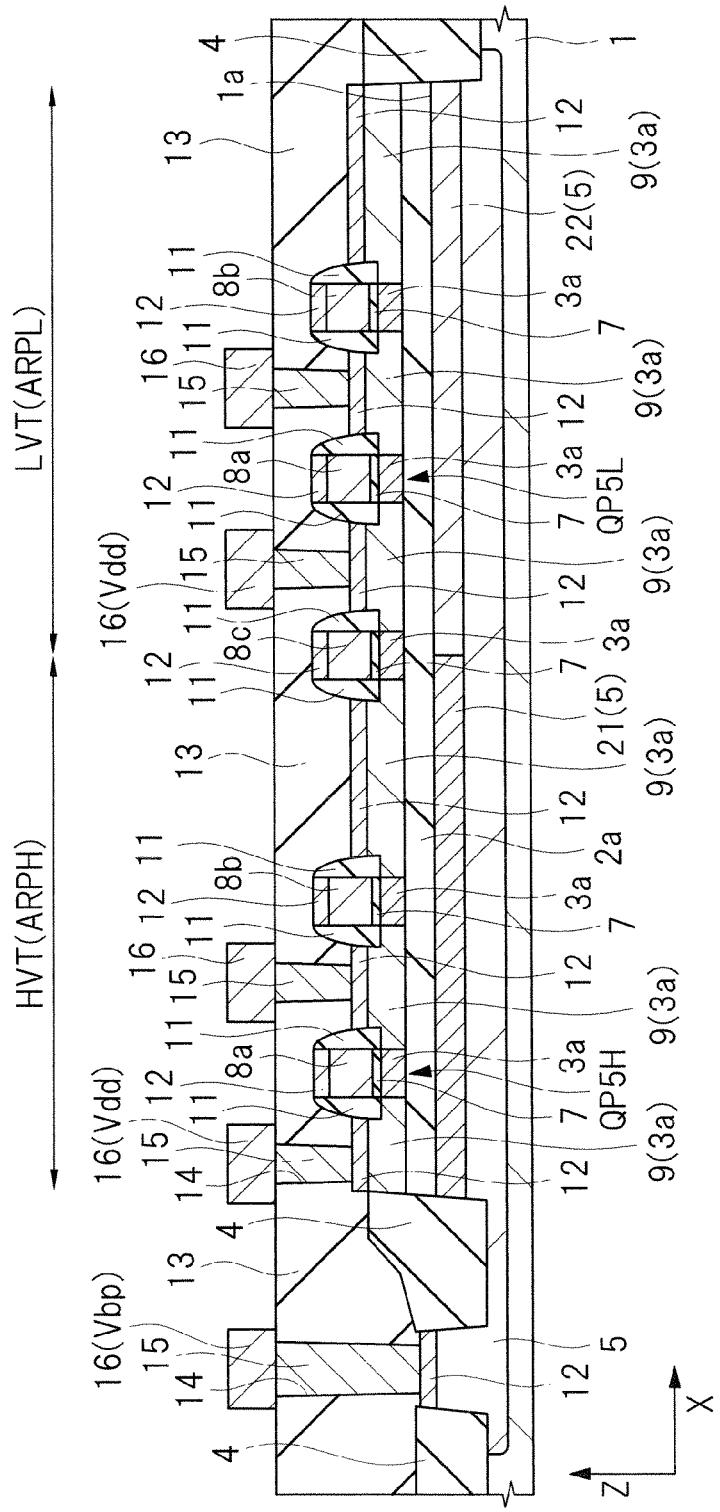
FIG. 26 is a sectional view of the semiconductor integrated circuit device constituting a part of the speed monitor circuit.

FIG. 25 is a plan view of a semiconductor integrated circuit device constituting a part of the speed monitor circuit. FIG. 26 is a sectional view of the semiconductor integrated circuit device constituting a part of the speed monitor circuit. FIG. 26 is a sectional view taken along a line A-A of FIG. 25. Note that FIG. 25 shows a transparent state obtained by removing the interlayer insulating film 13, the silicide layer 12 and the sidewall spacer 11 like FIG. 10 and further removing the p-type semiconductor region 9, the n-type semiconductor region 10, the BOX layer 2a and the BOX layer 2b unlike FIG. 10. Also, in FIGS. 25 and 26, two directions which are in parallel with a surface 1a serving as the main surface of the support substrate 1 and orthogonal to each other are defined as the X-axis direction and the Y-axis direction, and a direction perpendicular to the surface 1a of the support substrate 1 is defined as the Z-axis direction.

In the speed monitor circuit DC1H and the speed monitor circuit DC1L in the semiconductor integrated circuit device of the second embodiment, portions other than the n-type well 5 and the p-type well 6 are the same as the respective portions of the speed monitor circuit DC1 in the semiconductor integrated circuit device of the first embodiment described with reference to FIG. 10 and FIG. 11. Also, in FIG. 25 and FIG. 26, one CMIS inverter circuit including the p-channel e MISFET and the n-channel type MISFET is shown in each of the circuit area HVT and circuit area LVT.

As shown in FIGS. 25 and 26, in the second embodiment, in the same manner as the first embodiment, the n-type well 5 serving as an n-type semiconductor region is formed on the surface 1a side of the support substrate 1 in the area ARP, and the p-type well 6 serving as a p-type semiconductor region is formed on the surface 1a side of the support substrate 1 in the area ARN.

On the other hand, as shown in FIG. 25 and FIG. 26, in the second embodiment, different from the first embodiment, the area ARP is composed of two areas between which the threshold voltages of the MISFETs are different from each other, that is, an area ARPH and an area ARPL. Also, the area ARN is composed of two areas between which the threshold voltages of the MISFETs are different from each other, that is, an area ARNH and an area ARNL. The area ARPH of the areas ARP is an area included in the circuit area HVT, the area ARPL of the areas ARP is an area included in the circuit area LVT, the area ARNH of the areas ARN is an area included in the circuit area HVT, and the area ARNL of the areas ARN is an area included in the circuit area LVT.

Preferably, in the area ARPH, an n-type semiconductor region 21 is formed in an upper layer portion of the n-type well 5, and in the area ARPL, an n-type semiconductor region 22 is formed in an upper layer portion of the n-type well 5. At this time, the BOX layer 2a is formed on the n-type semiconductor region 21 and the n-type semiconductor region 22, and the SOI layer 3a is formed on the BOX layer 2a in the area ARPH and the area ARPL.

For example, by making an n-type impurity concentration in the n-type semiconductor region 21 higher than an n-type impurity concentration in the n-type semiconductor region 22, the absolute value of the threshold voltage of the p-channel type MISFET QP5H formed in the area ARPH is made larger than the absolute value of the threshold voltage of the p-channel type MISFET QPSL formed in the area ARPL. Specifically, after the n-type well 5 is formed, when an n-type impurity such as arsenic (As) or phosphorus (P) is implanted into the upper layer portion of the n-type well 5 in the area ARPH and the area ARPL, the dose amount of the n-type impurity to be implanted in the area ARPH is made larger than the dose amount of the n-type impurity to be implanted in the area ARPL. By such a method, the n-type impurity concentration in the n-type semiconductor region 21 is made higher than the n-type impurity concentration in the n-type semiconductor region 22.

Similarly, in the area ARNH, a p-type semiconductor region 23 is formed in an upper layer portion of the p-type well 6, and in the area ARNL, a p-type semiconductor region 24 is formed in an upper layer portion of the p-type well 6. Although not shown, the BOX layer 2b (see FIG. 12) is formed on the p-type semiconductor region 23 and the p-type semiconductor region 24, and the SOI layer 3b (see FIG. 12) is formed on the BOX layer 2b in the area ARNH and the area ARNL.

For example, by making a p-type impurity concentration in the p-type semiconductor region 23 higher than a p-type impurity concentration in the p-type semiconductor region 24, the threshold voltage of the n-channel type MISFET QN5H formed in the area ARNH is made higher than the threshold voltage of the n-channel type MISFET QN5L formed in the area ARNL. Specifically, after the p-type well 6 is formed, when a p-type impurity such as boron (B) is implanted into the upper layer portion of the p-type well 6 in the area ARNH and the area ARNL, the dose amount of the p-type impurity to be implanted in the area ARNH is made larger than the dose amount of the p-type impurity to be implanted in the area ARNL. By such a method, the p-type impurity concentration in the p-type semiconductor region 23 is made higher than the p-type impurity concentration in the p-type semiconductor region 24.

Preferably, the area ARPL is adjacent to the area ARPH, and the semiconductor region 22 is adjacent to the semiconductor region 21. Also, the area ARNL is adjacent to the area ARNH, and the semiconductor region 24 is adjacent to the semiconductor region 23.

Note that the same impurity concentrations as those of the first embodiment can be employed as the impurity concentrations of the n-type well 5 and the p-type well 6. Moreover, as shown in FIG. 25 and FIG. 26, for example, on a boundary between the area ARPH and the area ARPL and a boundary between the area ARNH and the area ARNL, a dummy gate electrode 8c for adjusting the potential of the p-type semiconductor region 9 and the n-type semiconductor region 10 may be formed.

Since the substrate bias Vbp can be applied to the n-type well 5 electrically insulated from the SOI layer 3a and the substrate bias Vbn can be applied to the p-type well 6 electrically insulated from the SOI layer 3b also in the second embodiment in the same manner as the first embodiment, voltage values of the substrate bias Vbp and the substrate bias Vbn can be adjusted in a wide range. Therefore, the substrate bias to be applied to the MISFETs constituting the main circuit MC1 can be controlled with high precision.

<Control Method of Substrate Bias>

In the second embodiment, in each of the two circuit areas HVT and LVT between which threshold voltages of MISFETs are different from each other, the same control method of the substrate bias as the control method of the substrate bias in the first embodiment can be used.

Considerations are given to the case where the main circuit MC1H is a NAND circuit in the circuit area HVT. In this case, the respective MISFETs (see FIG. 2, FIG. 4, FIG. 5 and FIG. 8) indicated by QP1, QP2, QP5, QP6, QN1, QN2, QN7 and QN8 are replaced with the respective MISFETs (see FIG. 21 to FIG. 24) indicated by QP1H, QP2H, QP5H, QP6H, QN1H, QN2H, QN7H and QN8H. Then, in this state where the MISFETs have been replaced, steps S11 to S18 of FIG. 14 are carried out. In this manner, in the circuit area HVT, the substrate bias to be applied to the main circuit MC1H can be controlled.

Also, considerations are given to the case where the main circuit MC1L is a NAND circuit in the circuit area LVT. In this case, the respective MISFETs (see FIG. 2, FIG. 4, FIG. 5 and FIG. 8) indicated by QP1, QP2, QP5, QP6, QN1, QN2, QN7 and QN8 are replaced with the respective MISFETs (see FIG. 21 to FIG. 24) indicated by QP1L, QP2L, QP5L, QP6L, QN1L, QN2L, QN7L and QN8L. Then, in this state where the MISFETs have been replaced, steps S11 to S18 of FIG. 14 are carried out. In this manner, in the circuit area LVT, the substrate bias to be applied to the main circuit MC1L can be controlled.

Similarly, considerations are given to the case where the main circuit MC1H is a NOR circuit (not shown) in the circuit area HVT. In this case, MISFETs which are the same as the respective MISFETs (see FIG. 3, FIG. 4, FIG. 6 and FIG. 7) indicated by QN3, QN4, QN5, QN6, QP3, QP4, QP7 and QP8 and formed in the circuit area HVT are used to carry out steps S21 to S28 of FIG. 16. In this manner, the substrate bias to be applied to the main circuit MC1H can be controlled.

Also, considerations are given to the case where the main circuit MC1L is a NOR circuit (not shown) in the circuit area LVT. In this case, MISFETs which are the same as the respective MISFETs (see FIG. 3, FIG. 4, FIG. 6 and FIG. 7) indicated by QN3, QN4, QN5, QN6, QP3, QP4, QP7 and QP8 and formed in the circuit area LVT are used to carry out steps S21 to S28 of FIG. 16. In this manner, the substrate bias to be applied to the main circuit MC1L can be controlled.

<Main Characteristics and Effects of Present Embodiment>

In the semiconductor integrated circuit device of the second embodiment, the main circuit and the substrate bias control circuit are respectively formed in a plurality of circuit areas between which threshold voltages of p-channel type MISFETS are different and threshold voltages of n-channel type MISFETS are different. Thus, even in the case where the main circuit is formed in each of the plurality of circuit areas having different threshold values of the MISFETs, the voltage value of the substrate bias can be controlled with high precision by using the substrate bias control circuits formed in the respective circuit areas so that the delay time of the main circuit in the respective circuit areas becomes the target time. Therefore, with respect to portions of the main circuit formed in each of the plurality of circuit areas having different threshold voltages of MISFETs, it is possible to easily compensate for variations in characteristics such as the threshold voltage of MISFETs constituting the main circuit in the same manner as the first embodiment, and therefore performances of the semiconductor integrated circuit device can be improved.

Moreover, in the semiconductor integrated circuit device of the second embodiment, preferably, MISFETs contained in portions of the substrate bias control circuit formed in each of the two circuit areas having different threshold voltages of the MISFETs can be formed on the same n-type well or p-type well. Therefore, in comparison with the case in which two kinds of MISFETs having different threshold voltages are respectively formed on two n-type wells or two p-type wells formed separately from each other, the areas of the speed monitor circuit and the current monitor circuit can be downsized and the semiconductor integrated circuit device can be further downsized.

(Third Embodiment)

The semiconductor integrated circuit device of the first embodiment includes a speed monitor circuit having a plurality of CMIS inverter circuits composed of p-channel type MISFETs and n-channel type MISFETs and a current monitor circuit. On the other hand, semiconductor integrated circuit device of the third embodiment includes a speed monitor circuit having a plurality of inverter circuits composed of only p-channel type MISFETs and a speed monitor circuit having a plurality of inverter circuits composed of only n-channel type MISFETs, but does not include a current monitor circuit.

<Configuration of Semiconductor Integrated Circuit Device>

Figure 27:
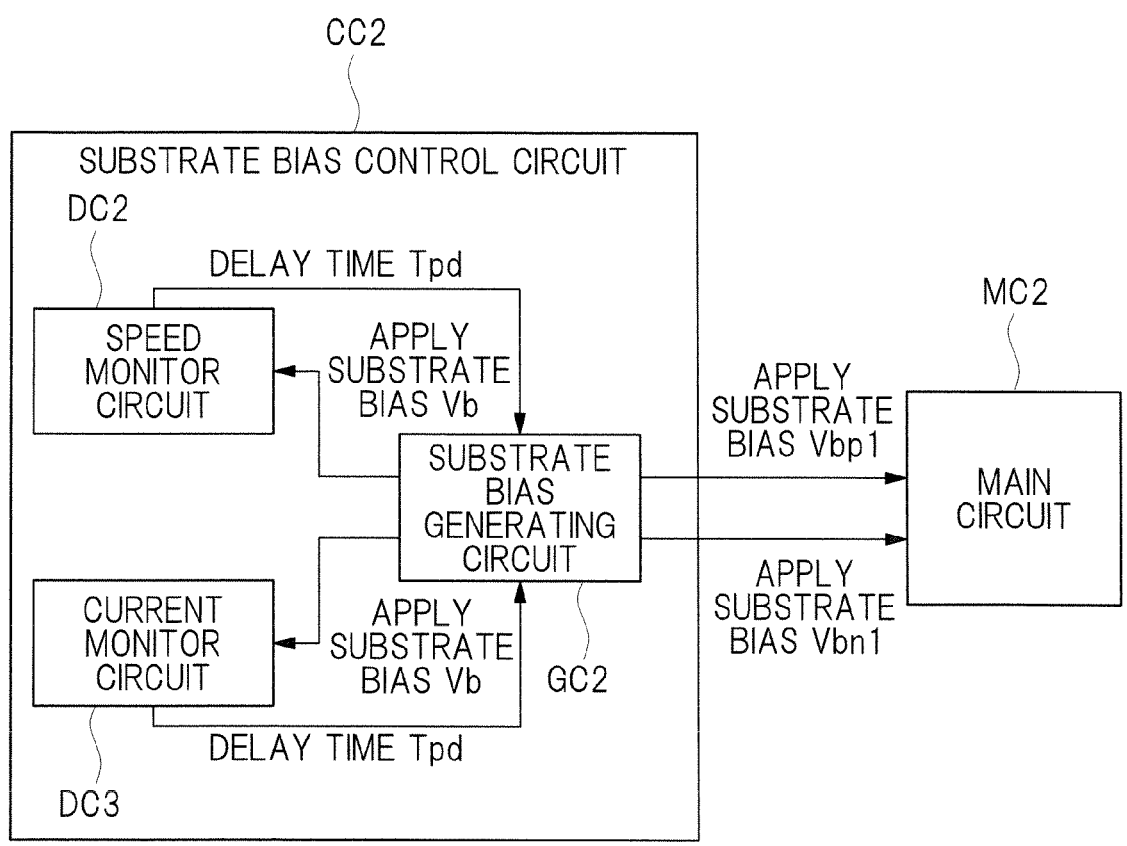
FIG. 27 is a block diagram showing a configuration of a semiconductor integrated circuit device of the third embodiment.

FIG. 27 is a block diagram showing a configuration of the semiconductor integrated circuit device of the third embodiment. As shown in FIG. 27, the semiconductor integrated circuit device of the third embodiment has a main circuit MC2 and a substrate bias control circuit CC2. The semiconductor integrated circuit device of the embodiment differs from the semiconductor integrated circuit device of the first embodiment in that the substrate bias control circuit CC2 has a speed monitor circuit DC2 and a speed monitor circuit DC3 serving as a plurality of delay circuits and no current monitor circuit is provided. Moreover, with respect to each of the main circuit MC2 and the substrate bias generating circuit GC2 serving as the voltage generating circuit in the semiconductor integrated circuit device of the third embodiment, the same configurations as those of the main circuit MC1 and the substrate bias generating circuit GC1 of the semiconductor integrated circuit device of the first embodiment may be used.

Figure 28:
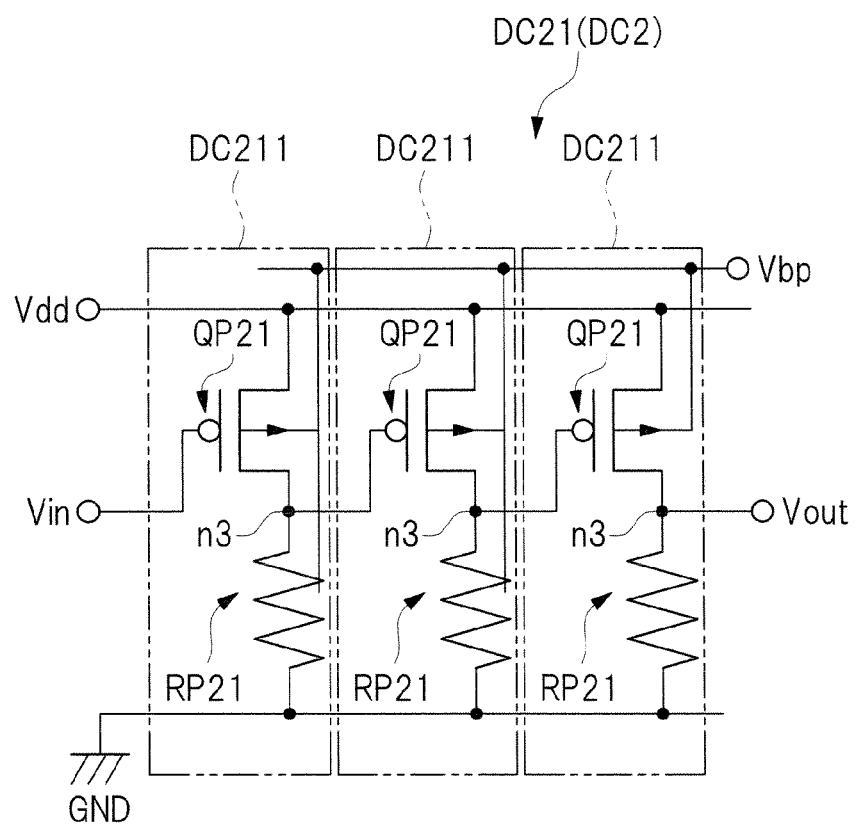
FIG. 28 is a circuit diagram showing a configuration of a speed monitor circuit in the semiconductor integrated circuit device of the third embodiment.
Figure 29:
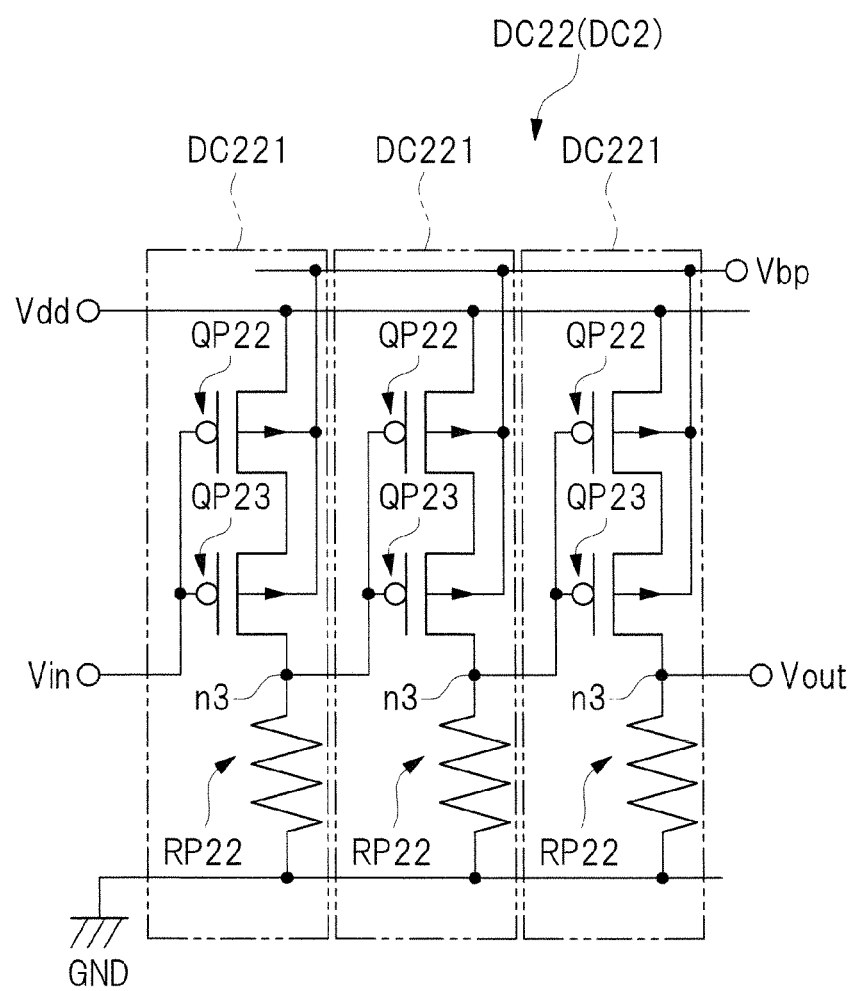
FIG. 29 is a circuit diagram showing a configuration of a speed monitor circuit in the semiconductor integrated circuit device of the third embodiment.
Figure 30:
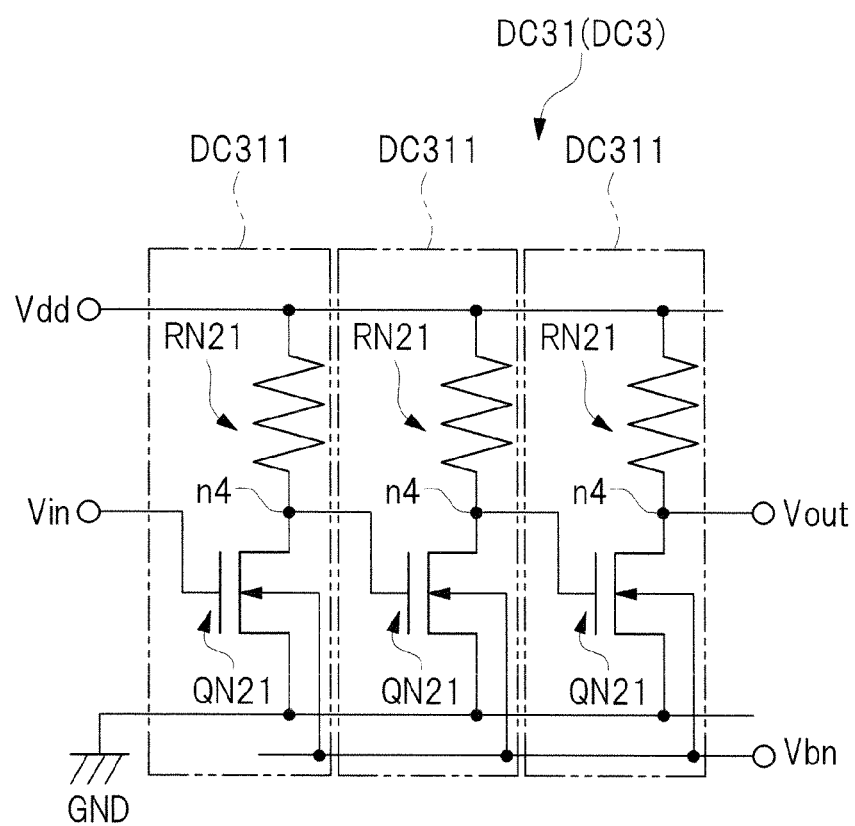
FIG. 30 is a circuit diagram showing a configuration of a speed monitor circuit in the semiconductor integrated circuit device of the third embodiment.
Figure 31:
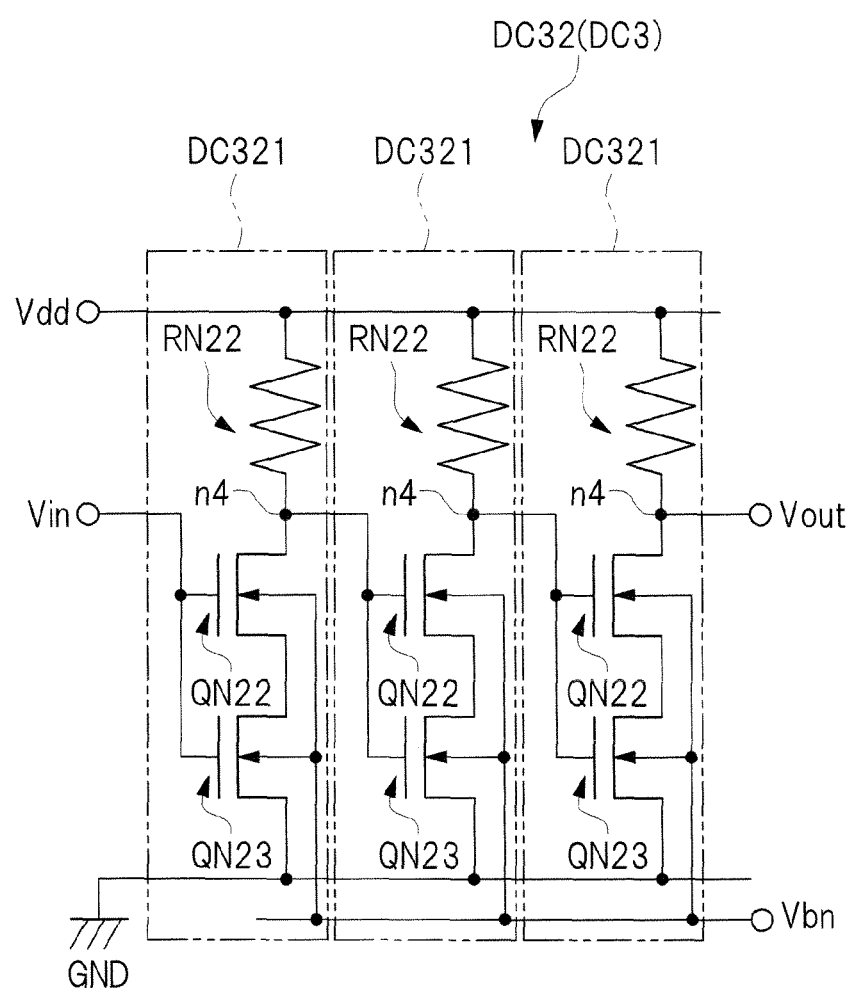
FIG. 31 is a circuit diagram showing a configuration of a speed monitor circuit in the semiconductor integrated circuit device of the third embodiment.

FIGS. 28 to 31 are circuit diagrams showing configurations of speed monitor circuits in the semiconductor integrated circuit device of the third embodiment. FIG. 28 shows a speed monitor circuit DC21 as one example of the speed monitor circuit DC2 and FIG. 29 shows a speed monitor circuit DC22 as one example of the speed monitor circuit DC2. FIG. 30 shows a speed monitor circuit DC31 as one example of the speed monitor circuit DC3 and FIG. 31 shows a speed monitor circuit DC32 as one example of the speed monitor circuit DC3. Note that FIGS. 28 to 31 show three of the plurality of inverter circuits provided in the respective speed monitor circuits, but the number of the inverter circuits provided in the respective speed monitor circuits may be one or plural numbers other than three.

As shown in FIGS. 28 to 31, each of the speed monitor circuit DC21, the speed monitor circuit DC22, the speed monitor circuit DC31 and the speed monitor circuit DC32 is a delay circuit having an input node to which a voltage Vin in input and an output node from which a voltage Vout is output.

An inverter circuit DC211 provided in the speed monitor circuit DC21 shown in FIG. 28 is composed of, for example, a p-channel type MISFET QP21 and a resistor element RP21. A source electrode of the p-channel type MISFET QP21 is connected to the power supply voltage Vdd, that is, to the power supply, and a drain electrode of the p-channel type MISFET QP21 is connected to a node n3 having a potential between the potential of the power supply voltage Vdd and the ground potential GND. One end of the resistor element RP21 is connected to the node n3, and the other end of the resistor element RP21 is connected to the ground potential GND, that is, is grounded. The substrate bias Vbp is applied as a substrate bias voltage to the p-channel type MISFET QP21.

An inverter circuit DC221 provided in the speed monitor circuit DC22 shown in FIG. 29 is composed of, for example, a p-channel type MISFET QP22, a p-channel type MISFET QP23 and a resistor element RP22. A source electrode of the p-channel type MISFET QP22 is connected to the power supply voltage Vdd, that is, to the power supply. A drain electrode of the p-channel type MISFET QP22 is connected to a source electrode of the p-channel type MISFET QP23. A drain electrode of the p-channel type MISFET QP23 is connected to a node n3 having a potential between the potential of the power supply voltage Vdd and the ground potential GND. One end of the resistor element RP22 is connected to the node n3, and the other end of the resistor element RP22 is connected to the ground potential GND, that is, is grounded. The substrate bias Vbp is applied as a substrate bias voltage to the p-channel type MISFET QP22 and the p-channel type MISFET QP23.

An inverter circuit DC311 provided in the speed monitor circuit DC31 shown in FIG. 30 is composed of, for example, a resistor element RN21 and an n-channel type MISFET QN21. One end of the resistor element RN21 is connected to the power supply voltage Vdd, that is, to the power supply, and the other end of the resistor element RN21 is connected to a node 4 having a potential between the potential of the power supply voltage Vdd and the ground potential GND. A drain electrode of the n-channel type MISFET QN21 is connected to the node n4, and a source electrode of the n-channel type MISFET QN21 is connected to the ground potential GND, that is, is grounded. The substrate bias Vbn is applied as a substrate bias voltage to the n-channel type MISFET QN21.

An inverter circuit DC321 provided in the speed monitor circuit DC32 shown in FIG. 31 is composed of, for example, a resistor element RN22, an n-channel type MISFET QN22 and an n-channel type MISFET QN23. One end of the resistor element RN22 is connected to the power supply voltage Vdd, that is, to the power supply, and the other end of the resistor element RN22 is connected to a node n4 having a potential between the potential of the power supply voltage Vdd and the ground potential GND. A drain electrode of the n-channel type MISFET QN22 is connected to the node n4. A source electrode of the n-channel type MISFET QN22 is connected to a drain electrode of the n-channel type MISFET QN23. A source electrode of the n-channel type MISFET QN23 is connected to the ground potential GND, that is, is grounded. The substrate bias Vbn is applied as a substrate bias voltage to the n-channel type MISFET QN22 and the n-channel type MISFET QN23.

In each of the speed monitor circuits DC2 shown in FIGS. 28 and 29 and the speed monitor circuits DC3 shown in FIGS. 30 and 31, a plurality of inverter circuits, for example, N inverter circuits are arranged, supposing that N is an integer of 2 or more. Also, the output side of each of the first to N−1 th inverter circuits is connected to the input side of the inverter circuit that is arranged next. In this manner, by connecting the plurality of inverter circuits in series between the input node and the output node, a delay circuit in which each inverter circuit has a delay time Tpd can be formed.

Note that, by setting N to an odd number of 3 or more and connecting the output node and the input node to configure a feedback circuit in the same manner as the speed monitor circuit DC1 (see FIG. 4) in the first embodiment, the speed monitor circuit DC2 and the speed monitor circuit DC3 can be prepared as ring oscillator circuits. In this manner, the delay time Tpd can be measured with higher precision like the speed monitor circuit DC1 in the first embodiment.

Moreover, as the speed monitor circuit DC2 and the speed monitor circuit DC3, a circuit made up of one inverter circuit may be used.

In the third embodiment, the respective p-channel type MISFETs (see FIG. 28 and FIG. 29) indicated by the QP21, QP22 and QP23 are formed on the SOI layer 3a shown in FIG.

11 in the same manner as the MISFET QP5 in the first embodiment, and the substrate bias Vbp can be applied to the n-type well 5 shown in FIG. 11. Moreover, the respective n-channel type MISFETs (see FIG. 30 and FIG. 31) indicated by the QN21, QN22 and QN23 are formed on the SOI layer 3b shown in FIG. 12 in the same manner as the MISFET QN5 in the first embodiment, and the substrate bias Vbn can be applied to the p-type well 6 shown in FIG. 12.

With this configuration, since the substrate bias Vbp can be applied to the n-type well 5 electrically insulated from the SOI layer 3a and the substrate bias Vbn can be applied to the p-type well 6 electrically insulated from the SOI layer 3b, it is possible to adjust the voltage value of the substrate bias Vbp and the substrate bias Vbn in a wide range. Therefore, the substrate bias to be applied to the MISFETs constituting the main circuit MC2 can be controlled with high precision.

<Control Method of Substrate Bias>

Figure 32:
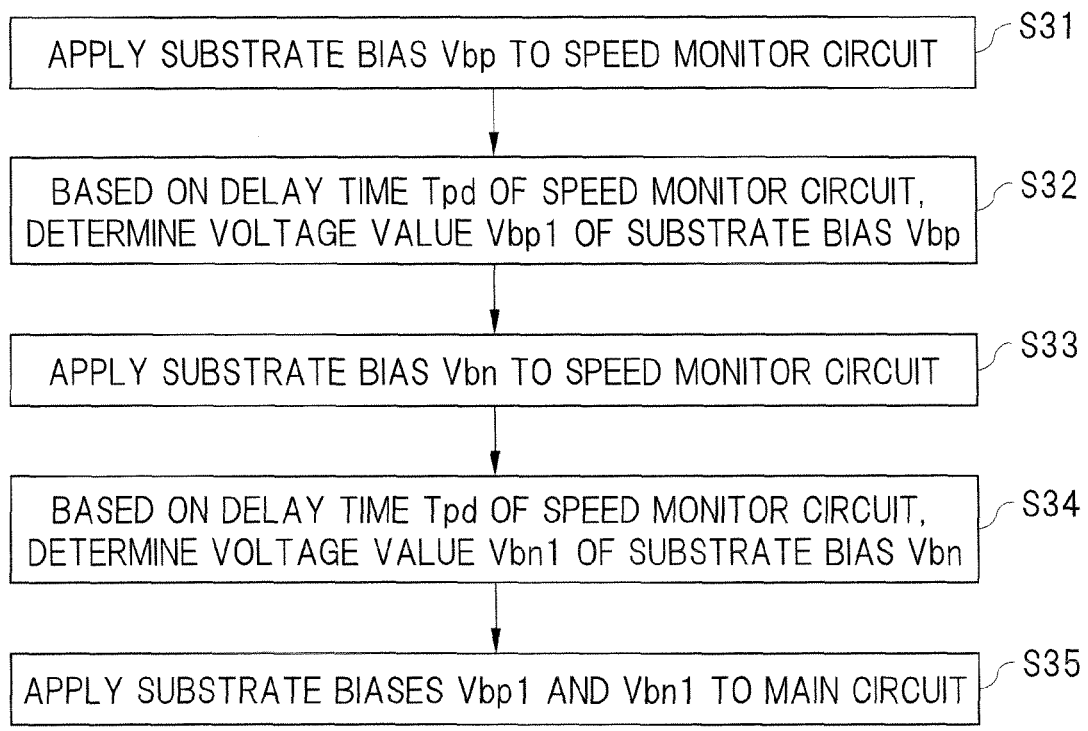
FIG. 32 is a flowchart showing a part of a process for controlling a substrate bias to be applied to the main circuit in the semiconductor integrated circuit device of the third embodiment.

Next, a control method of a substrate bias in the semiconductor integrated circuit device of the third embodiment will be described. FIG. 32 is a flowchart showing a part of a process for controlling the substrate bias to be applied to the main circuit in the semiconductor integrated circuit device of the third embodiment.

First, the substrate bias control circuit CC2 applies the substrate bias Vbp to the speed monitor circuit DC2 (see FIG. 28 and FIG. 29) (step S31 of FIG. 32), and determines a voltage value Vbp1 of the substrate bias Vbp based on the delay time Tpd of the speed monitor circuit DC2 (step S32 of FIG. 32).

In the case where the main circuit MC2 (see FIG. 27) is a NAND circuit (see FIG. 2), in step S31, the substrate bias control circuit CC2 makes the substrate bias generating circuit GC2 (see FIG. 27) generate the substrate bias Vbp and apply it to the MISFET QP21 of the speed monitor circuit DC21 (see FIG. 28). Then, in step S32, based on the delay time Tpd of the speed monitor circuit DC21 in a state where the substrate bias Vbp is being applied to the MISFET QP21, the voltage value Vbp1 of the substrate bias Vbp is determined.

On the other hand, in the case where the main circuit MC2 is a NOR circuit (see FIG. 3), in step S31, the substrate bias control circuit CC2 makes the substrate bias generating circuit GC2 generate the substrate bias Vbp and apply it to the p-channel type MISFET QP22 and the p-channel type MISFET QP23 of the speed monitor circuit DC22 (see FIG. 29). Then, in step S32, based on the delay time Tpd of the speed monitor circuit DC22 in a state where the substrate bias Vbp is being applied to the MISFET QP22 and the MISFET QP23, the voltage value Vbp1 of the substrate bias Vbp is determined.

A method of specifically determining the voltage value Vbp1 may be carried out in the same manner as step S11 and step S12 of FIG. 14.

Next, the substrate bias control circuit CC2 applies the substrate bias Vbn to the speed monitor circuit DC3 (see FIG. 30 and FIG. 31) (step S33 of FIG. 32), and determines the voltage value Vbn1 of the substrate bias Vbn based on the delay time Tpd of the speed monitor circuit DC3 (step S34 of FIG. 32).

In the case where the main circuit MC2 (see FIG. 27) is a NOR circuit (see FIG. 3), in step S33, the substrate bias control circuit CC2 makes the substrate bias generating circuit GC2 (see FIG. 27) generate the substrate bias Vbn and apply it to the n-type MISFET QN21 of the speed monitor circuit DC31 (see FIG. 30). Then, in step S34, based on the delay time Tpd of the speed monitor circuit DC31 in a state where the substrate bias Vbn is being applied to the MISFET QN21, the voltage value Vbn1 of the substrate bias Vbn is determined.

On the other hand, in the case where the main circuit MC2 is a NAND circuit (see FIG. 2), in step S33, the substrate bias control circuit CC2 makes the substrate bias generating circuit GC2 generate the substrate bias Vbn and apply it to the n-channel type MISFET QN22 and the n-channel type MISFET QN23 of the speed monitor circuit DC32 (see FIG. 31). Then, in step S34, based on the delay time Tpd of the speed monitor circuit DC32 in a state where the substrate bias Vbn is being applied to the MISFET QN22 and the MISFET QN23, the voltage value Vbn1 of the substrate bias Vbn is determined.

A method of specifically determining the voltage value Vbn1 may be carried out in the same manner as step S21 and step S22 of FIG. 16.

Note that step S33 and step S34 may be carried out in parallel with step S31 and step S32, or may be carried out prior to step S31 and step S32.

Next, the substrate bias control circuit CC2 applies the substrate bias Vbp1 and the substrate bias Vbn1 to the main circuit MC2 (step S35 of FIG. 32). In this step S35, the substrate bias control circuit CC2 makes the substrate bias generating circuit GC2 generate the substrate bias Vbp set to the voltage value Vbp1, that is, the substrate bias Vbp1 and apply it to the p-channel type MISFETs of the main circuit MC2. Moreover, in step S35, the substrate bias control circuit CC2 makes the substrate bias generating circuit GC2 generate the substrate bias Vbn set to the voltage value Vbn1, that is, the substrate bias Vbn1 and apply it to the n-channel type MISFETs of the main circuit MC2. A controlling method of specifically applying the substrate bias Vbp1 and the substrate bias Vbn1 may be carried out in the same manner as step S18 of FIG. 14 or step S28 of FIG. 16.

<Main Characteristics and Effects of Present Embodiment>

The semiconductor integrated circuit device of the third embodiment does not include a current monitor circuit, but includes, as a speed monitor circuit, a circuit provided with an inverter circuit in which MISFETs of one channel type out of p-channel type and n-channel type are connected in series with each other in the same manner as the main circuit. Moreover, the semiconductor integrated circuit device of the third embodiment includes, as a speed monitor circuit, a circuit provided with an inverter circuit including MISFETs of the other channel type in the same manner as the main circuit. Based on the delay time of the speed monitor circuit in a state where the substrate bias is being applied to the speed monitor circuit including the MISFETs of the other channel type, the voltage value of the substrate bias to be applied to the MISFETs of the other channel type is determined. Also, based on the delay time of the speed monitor circuit in a state where the substrate bias is being applied to the speed monitor circuit in which the MISFETs of the one channel type are connected in series with each other, the voltage value of the substrate bias to be applied to the MISFETs of the one channel type is determined.

By using these two speed monitor circuits in combination, even in the case where the circuit in which MISFETs of one channel type out of the p-channel type and the n-channel type are connected in series with each other is provided as the main circuit, the voltage value of the substrate bias can be controlled with high precision so that the delay time of the main circuit becomes a target time. Therefore, since it is possible to easily compensate for variations in characteristics such as the threshold voltage of the MISFETs constituting the main circuit, the performances of the semiconductor integrated circuit device can be improved. Moreover, since it is possible to control the voltage value of the substrate bias with high precision so that the delay time of the main circuit becomes the target time without the necessity of forming the same circuit as the main circuit, that is, the replica circuit, the performances of the semiconductor integrated circuit device can be improved.

Even in the case where the variations in characteristics such as the threshold voltage of MISFETs are so-called global variations, since it is possible to easily control the threshold voltage by applying the same substrate bias to the plurality of MISFETs in a chip, the effect of compensating for the variations in the threshold voltage is enhanced.

(Fourth Embodiment)

The semiconductor integrated circuit device of the first embodiment includes, as the speed monitor circuit, a circuit provided with a CMIS inverter circuit composed of p-channel type MISFETs and n-channel type MISFETs. In contrast, the semiconductor integrated circuit device of the fourth embodiment includes, as the speed monitor circuit, a speed monitor circuit provided with an inverter circuit composed of only the p-channel type MISFETs or a speed monitor circuit provided with an inverter circuit composed of only the n-channel type MISFETs.

The semiconductor integrated circuit device of the fourth embodiment is the same as the semiconductor integrated circuit device of the first embodiment except that any one of the speed monitor circuits described with reference to FIG. 28 and FIG. 30 in the third embodiment is provided as the speed monitor circuit in place of the speed monitor circuit described with reference to FIG. 4 in the first embodiment.

The control method of a substrate bias of the fourth embodiment is the same as the control method of a substrate bias of the first embodiment except that any one of the speed monitor circuits described with reference to FIG. 28 and FIG. 30 in the third embodiment is used in place of the speed monitor circuit described with reference to FIG. 4 in the first embodiment.

In the case where the main circuit is a NAND circuit (see FIG. 2), first, the same step as step S11 of FIG. 14 is carried out to apply the substrate bias Vbp to the speed monitor circuit, and the same step as step S12 of FIG. 14 is carried out to determine the voltage value Vbp1 of the substrate bias Vbp based on the delay time Tpd of the speed monitor circuit.

However, in the fourth embodiment, the substrate bias Vbp is applied to the speed monitor circuit DC21 shown in FIG. 28 in place of the speed monitor circuit DC1 shown in FIG. 4. Also in this method, the voltage value Vbp1 of the substrate bias Vbp can be determined based on the delay time Tpd of the speed monitor circuit DC21.

Thereafter, the same steps as step S13 to step S18 of FIG. 14 are carried out. Thus, the substrate bias control circuit CC1 (see FIG. 1) controls the substrate bias Vbp1 so as to be applied to the p-channel type MISFET QP1 and the p-channel type MISFET QP2 of the main circuit MC1. Moreover, the substrate bias control circuit CC1 controls the substrate bias Vbn1 so as to be applied to the n-channel type MISFET QN1 and the n-channel type MISFET QN2 of the main circuit MC1.

On the other hand, in the case where the main circuit is a NOR circuit (see FIG. 3), first, the same step as step S21 of FIG. 16 is carried out to apply the substrate bias Vbn to the speed monitor circuit, and the same step as step S22 of FIG. 16 is carried out to determine the voltage value Vbn1 of the substrate bias Vbn based on the delay time Tpd of the speed monitor circuit.

However, in the fourth embodiment, the substrate bias Vbn is applied to the speed monitor circuit DC31 shown in FIG. 30 in place of the speed monitor circuit DC1 shown in FIG. 4. Also in this method, the voltage value Vbn1 of the substrate bias Vbn can be determined based on the delay time Tpd of the speed monitor circuit DC31.

Thereafter, the same steps as step S23 to step S28 of FIG. 16 are carried out. Thus, the substrate bias control circuit CC1 controls the substrate bias Vbp1 so as to be applied to the p-channel type MISFET QP3 and the p-channel type MISFET QP4 of the main circuit MC1 and controls the substrate bias Vbn1 so as to be applied to the n-channel type MISFET QN3 and the n-channel type MISFET QN4 of the main circuit MC1.

In the semiconductor integrated circuit device of the fourth embodiment, different from the semiconductor integrated circuit device of the first embodiment, the speed monitor circuit is provided with an inverter circuit composed of only the p-channel type MISFETs and an inverter circuit composed of only the n-channel type MISFETs in place of the CMIS inverter circuit. Therefore, in the fourth embodiment, in the case where both of the NAND circuit and the NOR circuit are provided as the main circuit, two kinds of speed monitor circuits, which are larger in number than that of the first embodiment, are provided.

However, even in this case, in the same manner as the case where the speed monitor circuit is provided with a CMIS inverter circuit, by using the current monitor circuit in combination with the speed monitor circuit, the substrate bias control circuit can control the voltage value of the substrate bias with high precision so that the delay time of the main circuit becomes a target time. Therefore, since it is possible to easily compensate for variations in characteristics such as the threshold voltage of the MISFETs constituting the main circuit, the performances of the semiconductor integrated circuit device can be improved. Moreover, since it is possible to control the voltage value of the substrate bias with high precision so that the delay time of the main circuit becomes the target time without the necessity of forming the replica circuit with the same configuration as the main circuit, although the effect of reducing the area of the substrate bias control circuit becomes smaller in comparison with that of the first embodiment, the performances of the semiconductor integrated circuit device can be improved.

(Fifth Embodiment)

In the semiconductor integrated circuit device of the first embodiment, the substrate biases applied to each of the two MISFETs of the same channel type connected in series in a NAND circuit and a NOR circuit have the same voltage value. In contrast, in the semiconductor integrated circuit device of the fifth embodiment, substrate biases having voltage values adjusted differently are respectively applied to each of the two MISFETs of the same channel type connected in series in a NAND circuit and a NOR circuit.

The NAND circuit includes two n-channel type MISFETs connected in series with each other, and the NOR circuit includes two p-channel type MISFETs connected in series with each other. On the other hand, in the case where inverter circuits each having a p-channel type MISFET and an n-channel type MISFET connected in series with each other are connected in series with each other to form a speed monitor circuit, the speed monitor circuit thus formed does not include the two MISFETs of the same channel type connected in series with each other. More specifically, the method of connecting the MISFETs is different between the speed monitor circuit and the main circuit. Therefore, in the case where the voltage value of the substrate bias voltage is determined based on the delay time of this speed monitor circuit, the effect of compensating for variations in characteristics such as the threshold voltage of the MISFETs may be decreased in the NAND circuit and the NOR circuit included in the main circuit in comparison with the inverter circuit included in the main circuit.

Therefore, in the fifth embodiment, as the speed monitor circuit, a speed monitor circuit formed by connecting NAND circuits in series with each other is used. Alternatively, in the fifth embodiment, as the speed monitor circuit, a speed monitor circuit formed by connecting NOR circuits in series with each other is used. Thus, the substrate bias voltages to be applied to the two MISFETs of the same channel type connected in series with each other in the NAND circuit or the NOR circuit included in the main circuit can be adjusted separately and can be determined separately. Therefore, it is possible to compensate for the variations in characteristics such as threshold voltages of the MISFETs with high precision even in the NAND circuit and the NOR circuit included in the main circuit in the same manner as the inverter circuit included in the main circuit.

<Configuration of Semiconductor Integrated Circuit Device>

First, a configuration of the semiconductor integrated circuit device of the fifth embodiment will be described.

Figure 33:
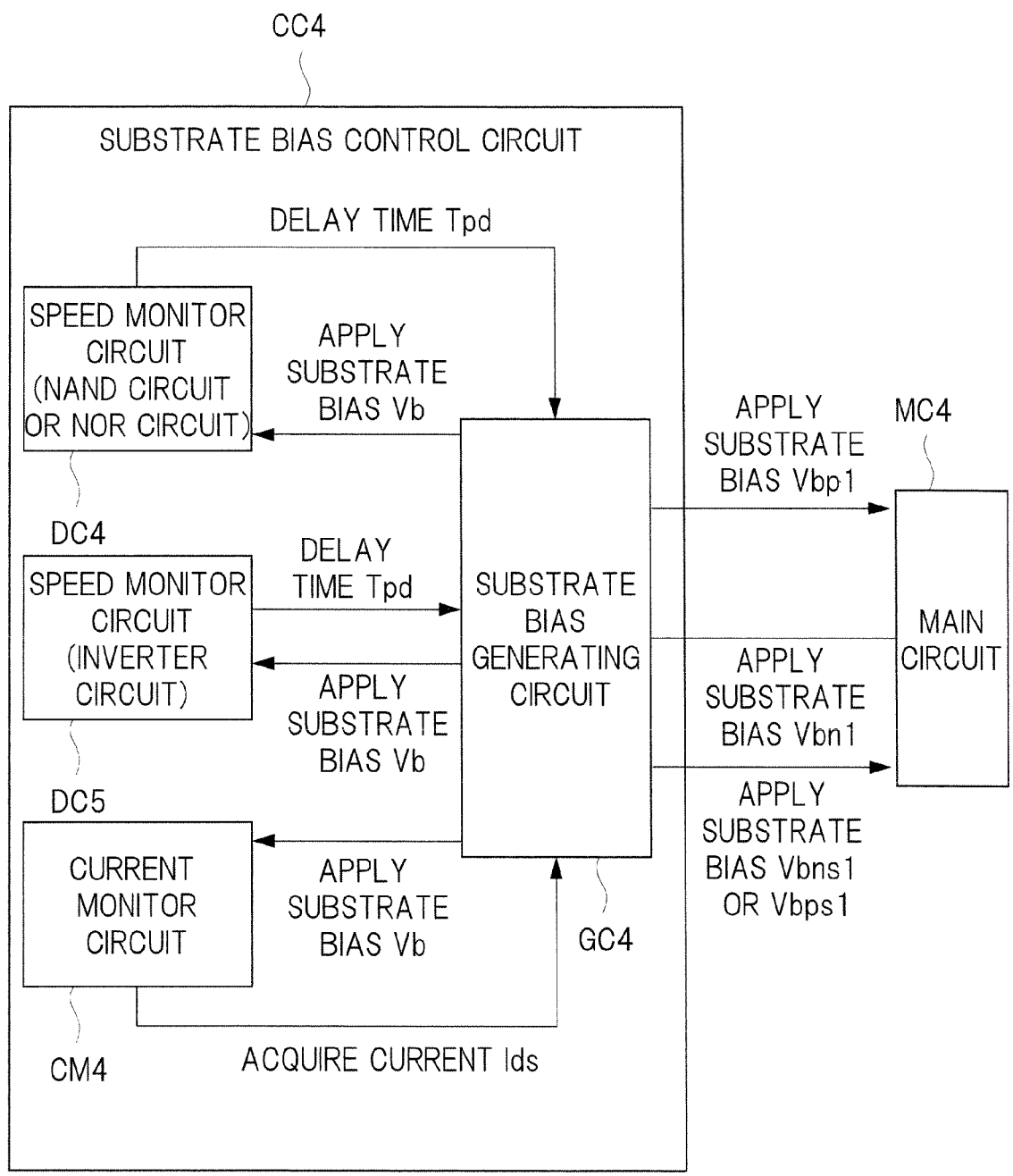
FIG. 33 is a block diagram showing a configuration of a semiconductor integrated circuit device of the fifth embodiment.
Figure 34:
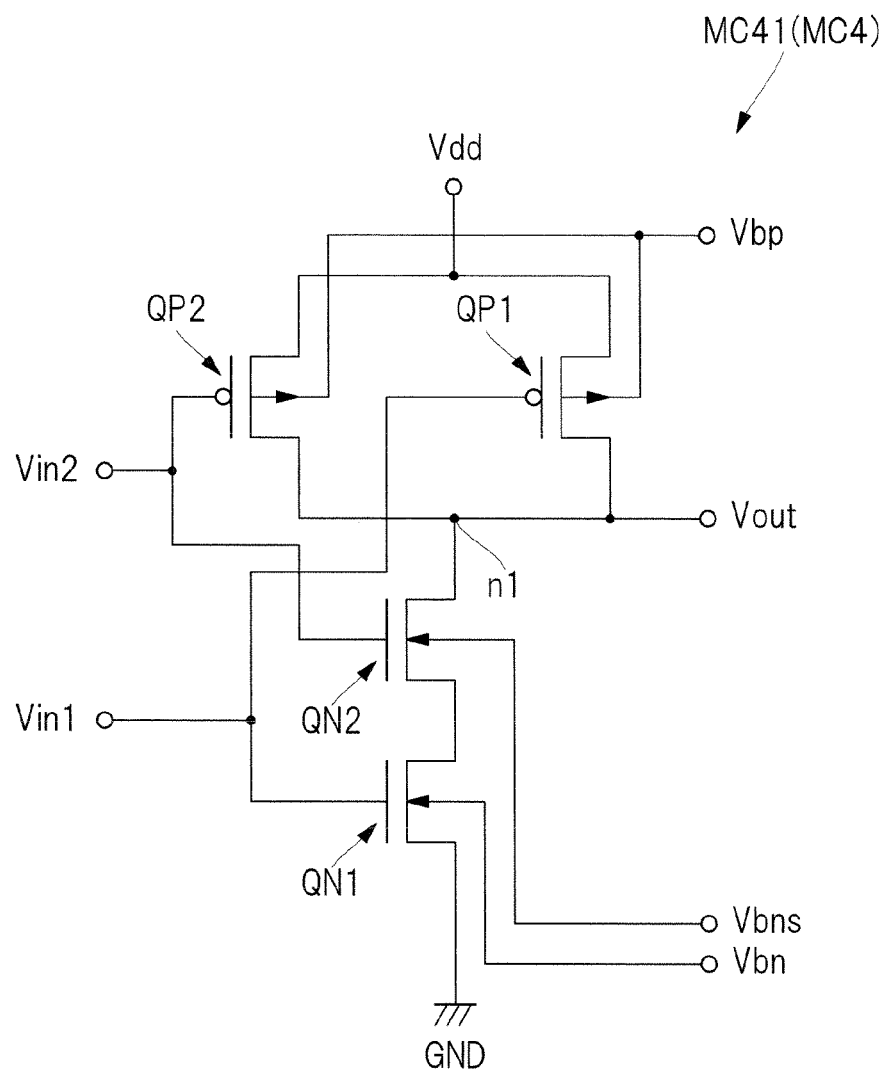
FIG. 34 is a circuit diagram showing a configuration of a NAND circuit as one example of a main circuit in the semiconductor integrated circuit device of the fifth embodiment.
Figure 35:
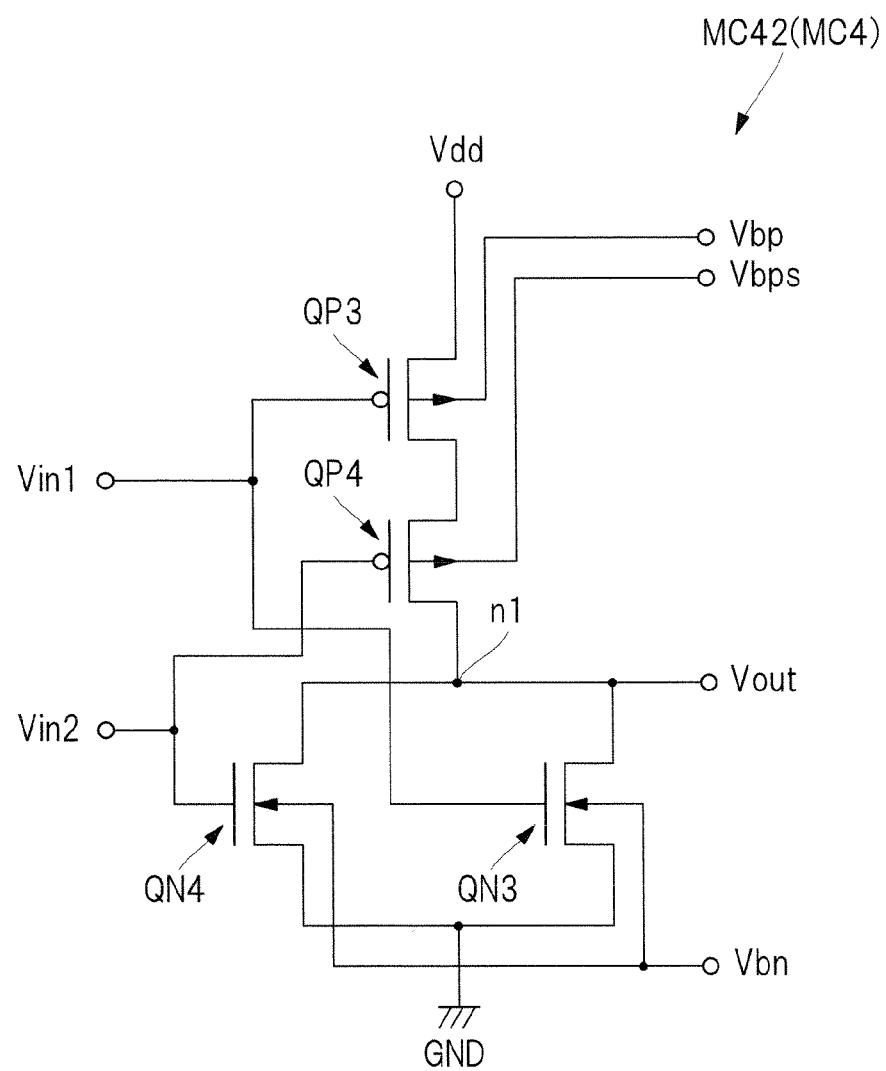
FIG. 35 is a circuit diagram showing a configuration of a NOR circuit as one example of the main circuit in the semiconductor integrated circuit device of the fifth embodiment.

FIG. 33 is a block diagram showing the configuration of the semiconductor integrated circuit device of the fifth embodiment. FIG. 34 is a circuit diagram showing a configuration of the NAND circuit as one example of the main circuit in the semiconductor integrated circuit device of the fifth embodiment. FIG. 35 is a circuit diagram showing a configuration of the NOR circuit as one example of the main circuit in the semiconductor integrated circuit device of the fifth embodiment. Note that, in FIG. 33, the substrate bias Vbp and the substrate bias Vbn are indicated as substrate bias Vb, a delay time Tpd41, a delay time Tpd42 and a delay time Tpd5 are indicated as delay time Tpd, and the current Idsp and the current Idsn are indicated as current Ids.

As shown in FIG. 33, the semiconductor integrated circuit device of the fifth embodiment includes a main circuit MC4 and a substrate bias control circuit CC4. The main circuit MC4 and the substrate bias control circuit CC4 are circuits composed of a plurality of MISFETs.

As shown in FIG. 34, when the main circuit MC4 in the semiconductor integrated circuit device of the fifth embodiment has a NAND circuit, the main circuit MC4 has two input nodes to which a voltage Vin1 and a voltage Vin2 are input and one output node from which a voltage Vout is output. Moreover, at this time, the main circuit MC4 includes a p-channel type MISFET QP1 and a p-channel type MISFET QP2 and further an n-channel type MISFET QN1 and an n-channel type MISFET QN2, which are different from the p-channel type. In the case where the main circuit MC4 has a NAND circuit, the main circuit MC4 is referred to as a main circuit MC41.

The p-channel type MISFET QP1 and the p-channel type MISFET QP2 are connected in parallel with each other between the power supply line having a potential equal to the power supply voltage Vdd relative to the ground potential GND, that is, the power supply line to which the power supply voltage Vdd is applied and a node n1 having a potential between the potential of the power supply voltage Vdd and the ground potential GND. A source electrode of the p-channel type MISFET QP1 and a source electrode of the p-channel type MISFET QP2 are connected to the power supply voltage Vdd, that is, to the power supply. A drain electrode of the p-channel type MISFET QP1 and a drain electrode of the p-channel type MISFET QP2 are connected to the node n1.

The n-channel type MISFET QN1 and the n-channel type MISFET QN2 are connected in series with each other between the node n1 and the ground line having the ground potential GND. A drain electrode of the n-channel type MISFET QN2 is connected to the node n1. A source electrode of the n-channel type MISFET QN2 is connected to a drain electrode of the n-channel type MISFET QN1. A source electrode of the n-channel type MISFET QN1 is connected to the ground potential GND, that is, is grounded. Therefore, the MISFET QN1 is connected in series with the MISFET QN2 on the side opposite to the MISFET QP1 side of the MISFET QN2.

A gate electrode of the p-channel type MISFET QP1 and a gate electrode of the n-channel type MISFET QN1 are connected to an input node to which the voltage Vin1 is input. Also, a gate electrode of the p-channel type MISFET QP2 and a gate electrode of the n-channel type MISFET QN2 are connected to an input node to which the voltage Vin2 is input. Moreover, the node n1 is connected to the output node from which the voltage Vout is output.

The substrate bias Vbp is applied as the substrate bias voltage to the p-channel type MISFET QP1 and the p-channel type MISFET QP2. On the other hand, the substrate bias Vbn is applied as the substrate bias voltage to the n-channel type MISFET QN1, and the substrate bias Vbns is applied as the substrate bias voltage to the n-channel type MISFET QN2. The substrate bias Vbn and the substrate bias Vbns are separately adjusted and determined separately.

On the other hand, as shown in FIG. 35, in the case where the main circuit MC4 in the semiconductor integrated circuit device of the fifth embodiment has a NOR circuit, the main circuit MC4 has two input nodes to which the voltage Vin1 and the voltage Vin2 are input and one output node from which the voltage Vout is output. Moreover, at this time, the main circuit MC4 includes a p-channel type MISFET QP3, a p-channel type MISFET QP4, an n-channel type MISFET QN3 and an n-channel type MISFET QN4. Note that, when the main circuit MC4 has a NOR circuit, the main circuit MC4 is referred to as a main circuit MC42.

The p-channel type MISFET QP3 and the p-channel type MISFET QP4 are connected in series with each other between the power supply line to which the power supply voltage Vdd is applied and the node n1 having a potential between the potential of the power supply voltage Vdd and the ground potential GND. A source electrode of the p-channel type MISFET QP3 is connected to the power supply voltage Vdd, that is, to the power supply. A drain electrode of the p-channel type MISFET QP3 is connected to a source electrode of the p-channel type MISFET QP4. A drain electrode of the p-channel type MISFET Q4 is connected to the node n1.

The n-channel type MISFET QN3 and the n-channel type MISFET QN4 are connected in parallel with each other between the node n1 and the ground line having the ground potential GND. A drain electrode of the n-channel type MISFET QN3 and a drain electrode of the n-channel type MISFET Q4 are connected to the node n1. Also, a source electrode of the n-channel type MISFET QN3 and a source electrode of the n-channel type MISFET QN4 are connected to the ground potential GND, that is, are grounded. Therefore, the MISFET QP3 is connected in series with the MISFET QP4 on the side opposite to the MISFET QN3 side of the MISFET QP4.

A gate electrode of the p-channel type MISFET QP3 and a gate electrode of the n-channel type MISFET QN3 are connected to an input node to which the voltage Vin1 is input.

Moreover, a gate electrode of the p-channel type MISFET QP4 and a gate electrode of the n-channel type MISFET QN4 are connected to an input node to which the voltage Vin2 is input. Furthermore, the node n1 is connected to the output node from which the voltage Vout is output.

The substrate bias Vbp is applied as the substrate bias voltage to the p-channel type MISFET QP3, and the substrate bias Vbps is applied as the substrate bias voltage to the p-channel type MISFET QP4. The substrate bias Vbp and the substrate bias Vbps are separately adjusted and determined separately. On the other hand, the substrate bias Vbn is applied as the substrate bias voltage to the n-channel type MISFET QN3 and the n-channel type MISFET QN4.

In other words, in the fifth embodiment, the main circuit has a circuit in which at least two MISFETs of one channel type out of the p-channel type and the n-channel type are connected in series with each other.

Note that the main circuit may have the same inverter circuit as the inverter circuit DC11 included in the speed monitor circuit DC1 described with reference to FIG. 4 and FIG. 9 in the first embodiment. This inverter circuit is a CMIS inverter circuit composed of, for example, a p-channel type MISFET and an n-channel type MISFET.

As shown in FIG. 33, the substrate bias control circuit CC4 in the semiconductor integrated substrate device of the fifth embodiment includes speed monitor circuits DC4 and DC5 serving as delay circuits, a current monitor circuit CM4 for monitoring a current and a substrate bias generating circuit GC4 serving as a voltage generating circuit.

Figure 36:
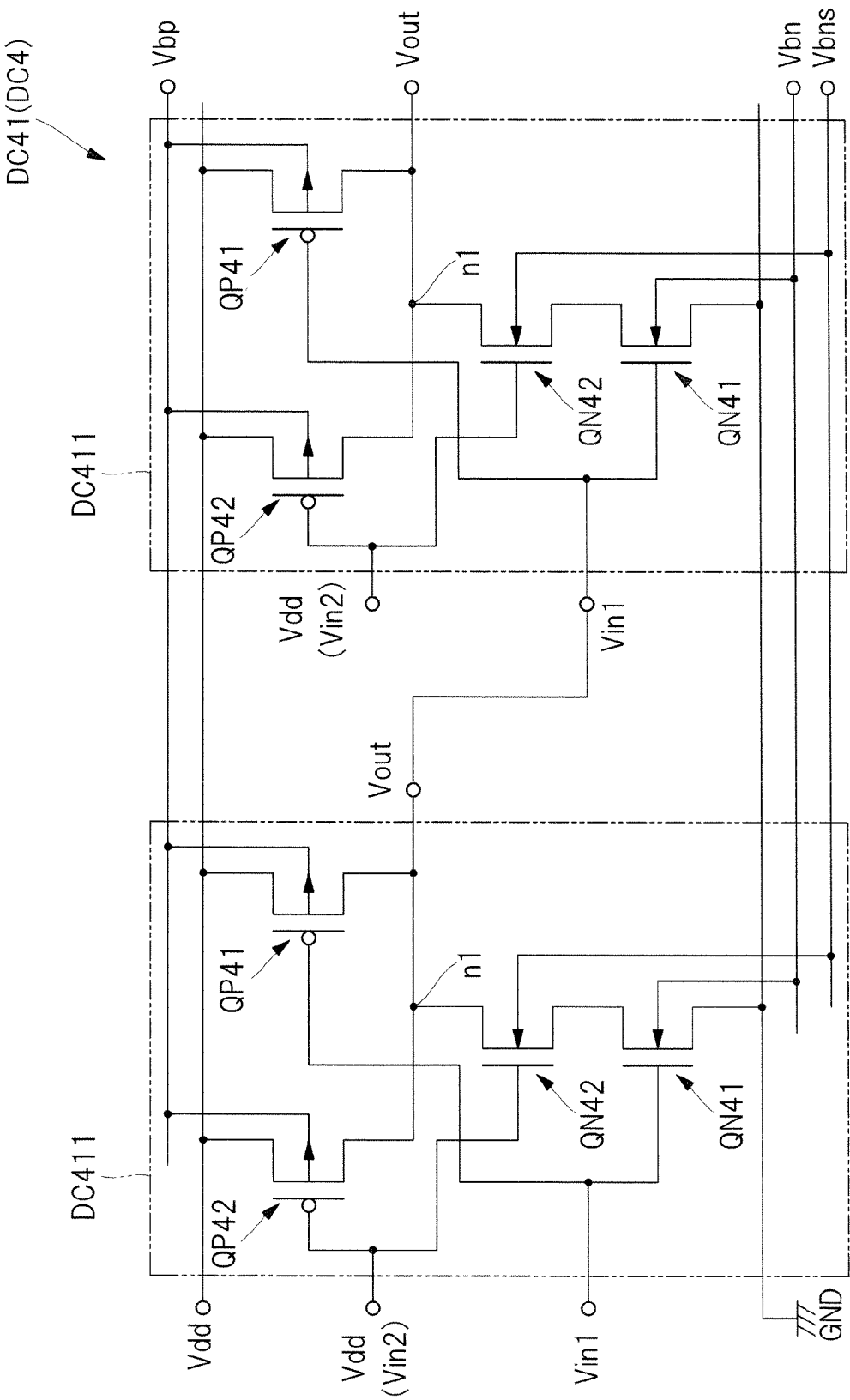
FIG. 36 is a circuit diagram showing a configuration of a speed monitor circuit in the semiconductor integrated circuit device of the fifth embodiment.
Figure 37:
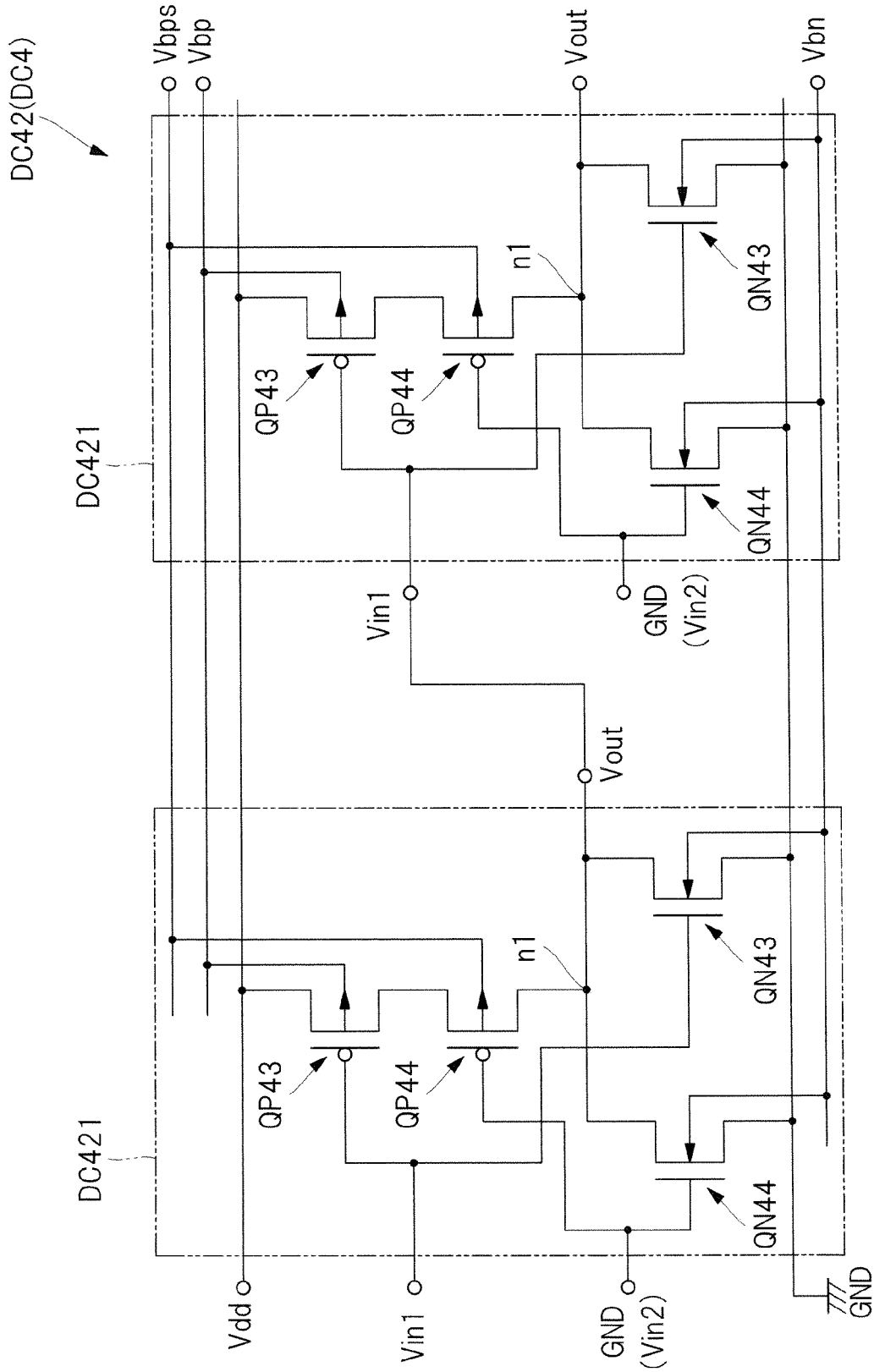
FIG. 37 is a circuit diagram showing a configuration of a speed monitor circuit in the semiconductor integrated circuit device of the fifth embodiment.
Figure 38:
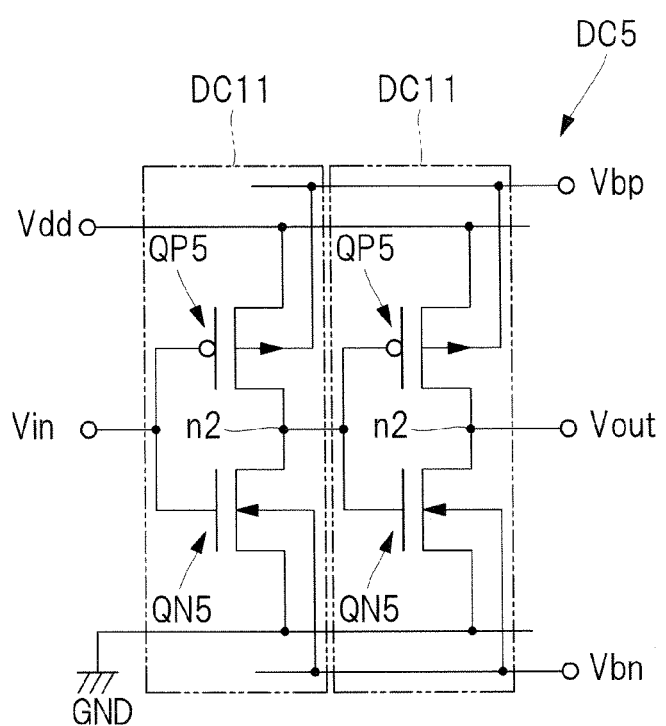
FIG. 38 is a circuit diagram showing a configuration of a speed monitor circuit in the semiconductor integrated circuit device of the fifth embodiment.

Also, in the fifth embodiment, as the speed monitor circuits, a speed monitor circuit DC4 shown in FIG. 36, a speed monitor circuit DC4 shown in FIG. 37 and a speed monitor circuit DC5 shown in FIG. 38 are provided.

FIGS. 36 to 38 are circuit diagrams showing configurations of the speed monitor circuits in the semiconductor integrated circuit of the fifth embodiment.

The speed monitor circuit DC4 shown in FIG. 36 is a delay circuit having a plurality of NAND circuits DC411 connected in series with each other. This speed monitor circuit DC4 having the plurality of NAND circuits DC411 is referred to as a speed monitor circuit DC41. Moreover, FIG. 36 shows two NAND circuits DC411 adjacent to each other among the plurality of NAND circuits DC411 included in the speed monitor circuit DC4.

Each of the plurality of NAND circuits DC411 has two input nodes to which the voltage Vin1 and voltage Vin2 are input and one output node from which the voltage Vout is output. In this case, each of the plurality of NAND circuits DC411 includes a p-channel type MISFET QP41 and a p-channel type MISFET QP42 and further an n-channel type MISFET QN41 and an n-channel type MISFET QN42, which are different from the p-channel type.

The p-channel type MISFET QP41 and the p-channel type MISFET QP42 are connected in parallel with each other between the power supply line having a potential equal to the power supply voltage Vdd relative to the ground potential GND, that is, the power supply line to which the power supply voltage Vdd is applied and a node n1 having a potential between the potential of the power supply voltage Vdd and the ground potential GND. A source electrode of the p-channel type MISFET QP41 and a source electrode of the p-channel type MISFET QP42 are connected to the power supply voltage Vdd, that is, to the power supply. A drain electrode of the p-channel type MISFET QP41 and a drain electrode of the p-channel type MISFET QP42 are connected to the node n1.

The n-channel type MISFET QN41 and the n-channel type MISFET QN42 are connected in series with each other between the node n1 and the ground line having the ground potential GND. A drain electrode of the n-channel type MISFET QN42 is connected to the node n1. A source electrode of the n-channel type MISFET QN42 is connected to a drain electrode of the n-channel type MISFET QN41. A source electrode of the n-channel type MISFET QN41 is connected to the ground potential GND, that is, is grounded. Therefore, the MISFET QN41 is connected in series with the MISFET QN42 on the side opposite to the MISFET QP41 side of the MISFET QN42.

A gate electrode of the p-channel type MISFET QP41 and a gate electrode of the n-channel type MISFET QN41 are connected to an input node to which the voltage Vin1 is input. Also, a gate electrode of the p-channel type MISFET QP42 and a gate electrode of the n-channel type MISFET QN42 are connected to an input node to which the voltage Vin2 is input. Furthermore, the node n1 is connected to the output node from which the voltage Vout is output.

In the speed monitor circuit DC41, a plurality of NAND circuits DC411 like those, for example, N NAND circuits DC411 are arranged, supposing that N is an integer of 2 or more. At this time, the output node of each of the first to N−1 th NAND circuits DC411 from which the voltage Vout is output is connected to the input node of the NAND circuit DC411 arranged next to which the voltage Vin1 is input. Moreover, the input node of each of the first to N th NAND circuits DC411 to which the voltage Vin2 is input is connected to the power supply voltage Vdd, that is, to the power supply. In this manner, by connecting the plurality of NAND circuits DC411 in series with each other, a delay circuit in which each of the NAND circuits DC411 has the delay time Tpd41 can be formed.

Note that, by connecting the output node of the last NAND circuit DC411 of the plurality of NAND circuits DC411 to the input node of the first NAND circuit DC411 to which the voltage Vin1 is input, thereby configuring a feedback circuit, the speed monitor circuit DC41 can be prepared as a ring oscillator circuit. In this manner, when the frequency of the ring oscillator circuit is defined as f, since the delay time Tpd41 of each of the NAND circuits DC411 can be easily obtained from, for example, 1/(2Nf) or the like based on the frequency f, the delay time Tpd41 can be measured with higher precision.

Alternatively, since it is only required to measure the time dependency of each of the voltage Vin1 at the input node and the voltage Vout at the output node, thereby measuring the delay time Tpd41, a circuit composed of one NAND circuit DC411 may be used as the speed monitor circuit.

In each of the plurality of NAND circuits DC411, the substrate bias Vbp is applied as the substrate bias voltage to the p-channel type MISFET QP41 and the p-channel type MISFET QP42. On the other hand, the substrate bias Vbn is applied as the substrate bias voltage to the n-channel type MISFET QN41, and the substrate bias Vbns is applied as the substrate bias voltage to the n-channel type MISFET QN42. The substrate bias Vbn and the substrate bias Vbns are separately adjusted and determined separately.

The speed monitor circuit DC4 shown in FIG. 37 is a delay circuit having a plurality of NOR circuits DC421 connected in series with each other. This speed monitor circuit DC4 having the plurality of NOR circuits DC421 is referred to as a speed monitor circuit DC42. Also, FIG. 37 shows two NOR circuits DC421 adjacent to each other among the plurality of NOR circuits 421 included in the speed monitor circuit DC4.

Each of the plurality of NOR circuits DC421 has two input nodes to which the voltage Vin1 and voltage Vin2 are input and one output node from which the voltage Vout is output. In this case, each of the plurality of NOR circuits DC421 includes a p-channel type MISFET QP43 and a p-channel type MISFET QP44 and further an n-channel type MISFET QN43 and an n-channel type MISFET QN44, which are different from the p-channel type.

The p-channel type MISFET QP43 and the p-channel type MISFET QP44 are connected in series with each other between the power supply line to which the power supply voltage Vdd is applied and the node n1 having a potential between the potential of the power supply voltage Vdd and the ground potential GND. A source electrode of the p-channel type MISFET QP43 is connected to the power supply voltage Vdd, that is, to the power supply. A drain electrode of the p-channel type MISFET QP43 is connected to a source electrode of the p-channel type MISFET QP44. A drain electrode of the p-channel type MISFET QP44 is connected to the node n1.

The n-channel type MISFET QN43 and the n-channel type MISFET QN44 are connected in parallel with each other between the node n1 and the ground line having the ground potential GND. A drain electrode of the n-channel type MISFET QN43 and a drain electrode of the n-channel type MISFET QN44 are connected to the node n1. Also, a source electrode of the n-channel type MISFET QN43 and a source electrode of the n-channel type MISFET QN44 are connected to the ground potential GND, that is, are grounded. Therefore, the MISFET QP43 is connected in series with the MISFET QP44 on the side opposite to the MISFET QN43 side of the MISFET QP44.

A gate electrode of the p-channel type MISFET QP43 and a gate electrode of the n-channel type MISFET QN43 are connected to an input node to which the voltage Vin1 is input. Also, a gate electrode of the p-channel type MISFET QP44 and a gate electrode of the n-channel type MISFET QN44 are connected to the input node to which the voltage Vin2 is input. Furthermore, the node n1 is connected to the output node from which the voltage Vout is output.

In the speed monitor circuit DC42, a plurality of NOR circuits DC421 like those, for example, N NOR circuits DC421 are arranged, supposing that N is an integer of 2 or more. At this time, the output node of each of the first to N−1 th NOR circuits DC421 from which the voltage Vout is output is connected to the input node of the NOR circuit DC421 arranged next to which the voltage Vin1 is input. Moreover, the input node of each of the first to N th NOR circuits DC421 to which the voltage Vin2 is input is connected to the ground potential GND, that is, is grounded. In this manner, by connecting the plurality of NOR circuits DC421 in series with each other, a delay circuit in which each of the NOR circuits DC421 has the delay time Tpd42 can be formed.

Note that, by connecting the output node of the last NOR circuit DC421 of the plurality of NOR circuits DC421 to the input node of the first NOR circuit DC421 to which the voltage Vin1 is input, thereby configuring a feedback circuit, the speed monitor circuit DC42 can be prepared as a ring oscillator circuit. In this manner, when the frequency of the ring oscillator circuit is defined as f, since the delay time Tpd42 of each of the NOR circuits DC421 can be easily obtained from, for example, 1/(2Nf) or the like based on the frequency f, the delay time Tpd42 can be measured with higher precision.

Alternatively, since it is only required to measure the time dependency of each of the voltage Vin2 at the input node and the voltage Vout at the output node, thereby measuring the delay time Tpd42, a circuit composed of one NOR circuit DC421 may be used as the speed monitor circuit.

In each of the plurality of NOR circuits DC421, the substrate bias Vbp is applied as the substrate bias voltage to the p-channel type MISFET QP43 and the substrate bias Vbps is applied as the substrate bias voltage to the p-channel type MISFET QP44. The substrate bias Vbp and the substrate bias Vbps are separately adjusted and determined separately. On the other hand, the substrate bias Vbn is applied as the substrate bias voltage to the n-channel type MISFET QN43 and the n-channel type MISFET QN44.

As shown in FIG. 38, the speed monitor circuit DC5 is a delay circuit having a plurality of inverter circuits DC11 connected in series with each other. Each of the plurality of inverter circuits DC11 is, for example, a CMIS inverter circuit composed of a p-channel type MISFET QP5 and an n-channel type MISFET QN5. As shown in FIG. 38, the speed monitor circuit DC5 is the same speed monitor circuit as the speed monitor circuit DC1 described with reference to FIG. 4 and FIG. 9 in the first embodiment, and the detailed description thereof will be omitted. However, the delay time of each of the plurality of inverter circuits DC11 included in the speed monitor circuit DC5 is referred to as a delay time Tpd5 in place of the delay time Tpd of each of the plurality of inverter circuits DC11 included in the speed monitor circuit DC1.

Note that, in the case where the main circuit MC4 does not have a NOR circuit but has a NAND circuit, the semiconductor integrated circuit device has the speed monitor circuit DC5 including inverter circuits DC11 and the speed monitor circuit DC41 including NAND circuits DC411, but is not required to have the speed monitor circuit 42 including NOR circuits DC421. Moreover, in the case where the main circuit MC4 does not have a NAND circuit but has a NOR circuit, the semiconductor integrated circuit device has the speed monitor circuit DC5 including inverter circuits DC11 and the speed monitor circuit DC42 including NOR circuits DC421, but is not required to have the speed monitor circuit DC41 including NAND circuits DC411.

Preferably, in the case where the main circuit MC4 has the NAND circuit described with reference to FIG. 34, that is, when the main circuit MC4 is the main circuit MC41, the threshold voltage of the MISFET QP41 and the MISFET QP42 constituting the NAND circuit DC411 is equal to the threshold voltage of the MISFET QP1 and the MISFET QP2 constituting the main circuit MC41. Moreover, the threshold voltage of the MISFET QN41 constituting the NAND circuit DC 411 is equal to the threshold voltage of the MISFET QN1 constituting the main circuit MC41 and the threshold voltage of the MISFET QN42 constituting the NAND circuit DC 411 is equal to the threshold voltage of the MISFET QN2 constituting the main circuit MC41. With this configuration, the substrate biases respectively applied to the MISFET QP1, MISFET QP2, MISFET QN1 and MISFET QN2 constituting the main circuit MC41 can be controlled with high precision.

Preferably, in the case where the main circuit MC4 has the NOR circuit described with reference to FIG. 35, that is, when the main circuit MC4 is the main circuit MC42, the threshold voltage of the MISFET QN43 and the MISFET QN44 constituting the NOR circuit DC421 is equal to the threshold voltage of the MISFET QN3 and the MISFET QN4 constituting the main circuit MC42. Moreover, the threshold voltage of the MISFET QP43 constituting the NOR circuit DC421 is equal to the threshold voltage of the MISFET QP3 constituting the main circuit MC42, and the threshold voltage of the MISFET QP44 constituting the NOR circuit DC421 is equal to the threshold voltage value of the MISFET QP4 constituting the main circuit MC42. With this configuration, the substrate biases respectively applied to the MISFET QP3, MISFET QP4, MISFET QN3 and MISFET QN4 constituting the main circuit MC42 can be controlled with high precision.

In the fifth embodiment, the two current monitor circuits, that is, the current monitor circuit CM11 shown in FIG. 5 and the current monitor circuit CM12 shown in FIG. 6 are provided as the current monitor circuit CM4. Moreover, for example, in any of the cases where the main circuit is the NAND circuit, the main circuit is the NOR circuit, and the main circuit is a circuit composed of the NAND circuit and the NOR circuit, the current monitor circuit CM11 shown in FIG. 5 and the current monitor circuit CM12 shown in FIG. 6 can be used.

Preferably, the threshold voltage of the MISFET QP6 constituting the current monitor circuit CM11 is equal to the threshold voltage of the MISFET QP1 to MISFET QP3 constituting the main circuit MC4. Thus, the substrate bias Vbp to be applied to the MISFET QP1 to MISFET QP3 constituting the main circuit MC4 can be controlled with high precision.

Preferably, the threshold voltage of the MISFET QN6 constituting the current monitor circuit CM12 is equal to the threshold voltage of the MISFET QN1, MISFET QN3 and MISFET QN4 constituting the main circuit MC4. Thus, the substrate bias Vbn to be applied to the MISFET QN1, MISFET QN3 and MISFET QN4 constituting the main circuit MC4 can be controlled with high precision.

As shown in FIG. 33, the substrate bias generating circuit GC4 generates the substrate bias Vbp and the substrate bias Vbn. Moreover, the substrate bias generating circuit GC4 generates the substrate bias Vbps and the substrate bias Vbns.

<Planar Configuration and Cross-sectional Configuration of SOI Substrate>

Next, a planar configuration and a cross-sectional configuration of an SOI substrate on which the semiconductor integrated circuit device of the fifth embodiment is formed will be described.

Figure 39:
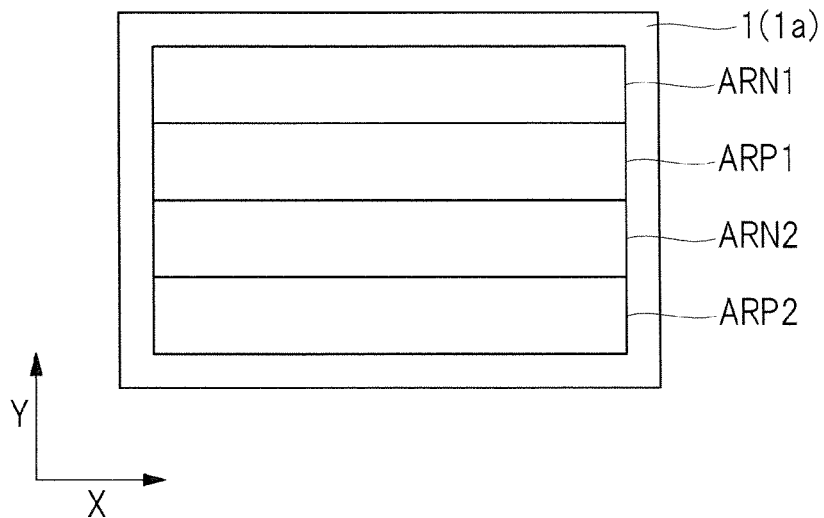
FIG. 39 is a plan view schematically showing a configuration of an SOI substrate in the fifth embodiment.
Figure 40:
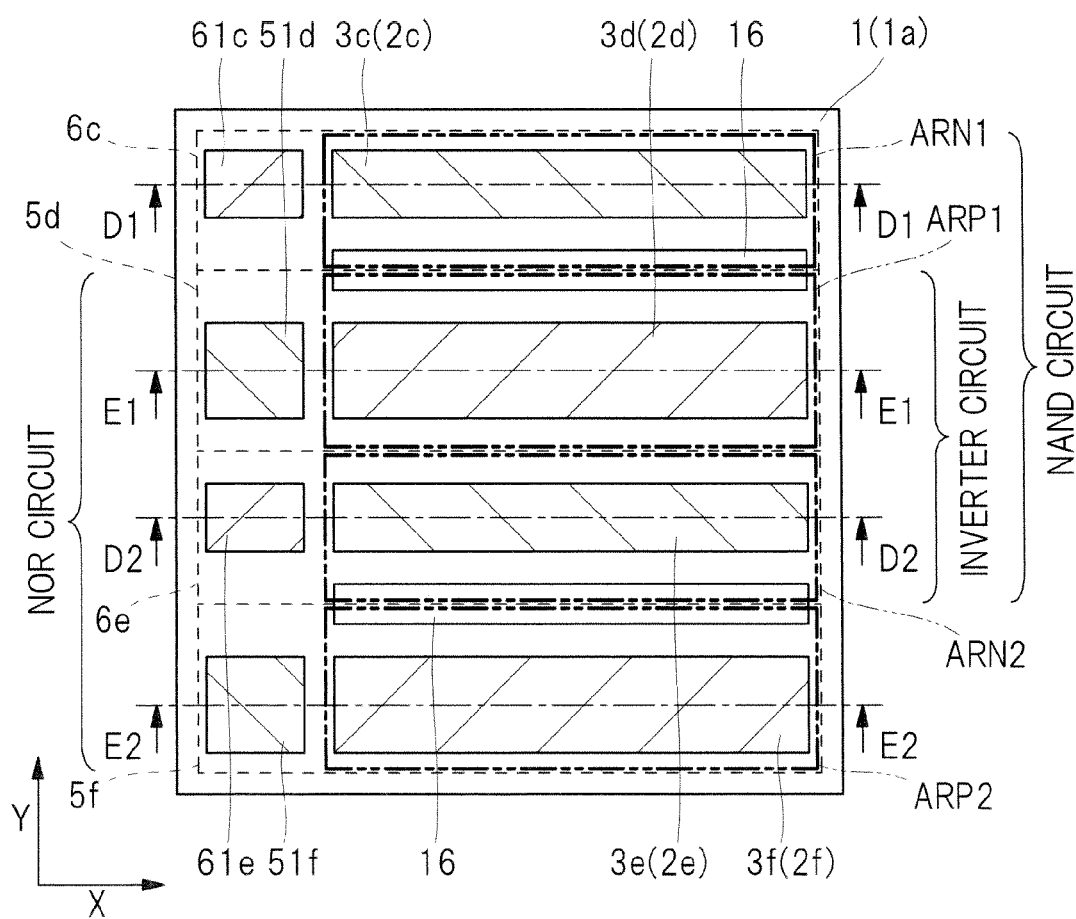
FIG. 40 is a plan view schematically showing the configuration of the SOI substrate in the fifth embodiment.
Figure 41:
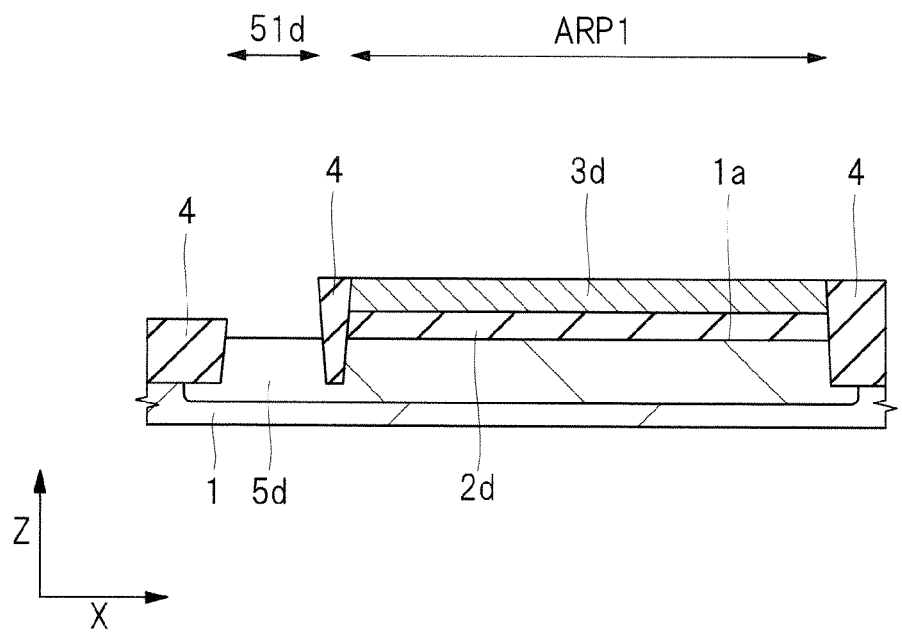
FIG. 41 is a sectional view schematically showing the configuration of the SOI substrate in the fifth embodiment.
Figure 42:
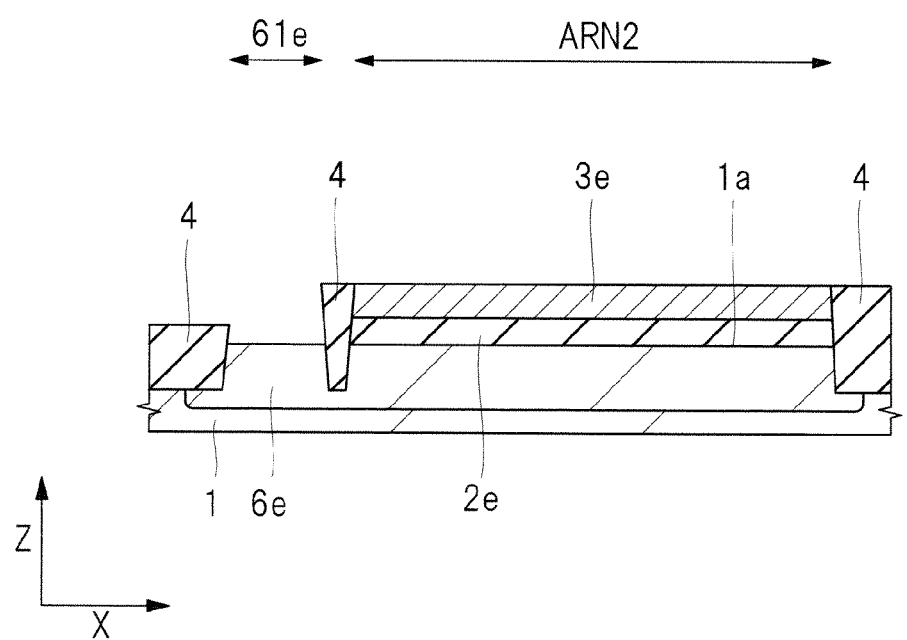
FIG. 42 is a sectional view schematically showing the configuration of the SOI substrate in the fifth embodiment.

FIG. 39 and FIG. 40 are plan views schematically showing a configuration of an SOI substrate in the fifth embodiment. FIG. 41 and FIG. 42 are sectional views schematically showing the configuration of the SOI substrate in the fifth embodiment. FIG. 39 shows the arrangement of four areas, and FIG. 40 shows the arrangement of the SOI layers and the like in each area. FIG. 41 is a sectional view taken along the line E1-E1 of FIG. 40, and FIG. 42 is a sectional view taken along the line D2-D2 of FIG. 40. Also, FIG. 40 shows the first layer wire 16.

In FIGS. 39 to 42, two directions which are in parallel with the surface 1a serving as the main surface of the support substrate 1 and mutually orthogonal to each other are defined as the X-axis direction and the Y-axis direction, and a direction perpendicular to the surface 1a of the support substrate 1 is defined as the Z-axis direction. Note that the X-axis direction and the Y-axis direction are only required to intersect with each other and not necessarily required to be orthogonal to each other (the same is true for the following fifth embodiment).

The sectional view taken along the line D1-D1 of FIG. 40 is the same as the sectional view taken along the line D2-D2 of FIG. 40 except that a BOX layer 2c, an SOI layer 3c and a p-type well 6c are formed in place of a BOX layer 2e, an SOI layer 3e and a p-type well 6e. Moreover, the sectional view taken along the line E2-E2 of FIG. 40 is the same as the sectional view taken along the line E1-E1 of FIG. 40 except that a BOX layer 2f, an SOI layer 3f and an n-type well 5f are formed in place of a BOX layer 2d, an SOI layer 3d and an n-type well 5d.

Preferably, the SOI substrate is composed of a BOX layer which is a buried oxide film formed on the support substrate and an SOI layer serving as a semiconductor layer formed on the BOX layer.

As shown in FIG. 39 and FIG. 40, the SOI substrate has the support substrate 1, an area ARN1, an area ARP1, an area ARN2 and an area ARP2 corresponding to four areas formed on the surface 1a side of the support substrate 1. The area ARN1, the area ARP1, the area ARN2 and the area ARP2 respectively extend in the X-axis direction when seen in a plan view. Moreover, the area ARN1, the area ARP1, the area ARN2 and the area ARP2 are arranged in the Y-axis direction in the order of the area ARN1, the area ARP1, the area ARN2 and the area ARP2. The areas ARN1 and ARN2 are areas in which n-channel type MISFETs are formed. The areas ARP1 and ARP2 are areas in which p-channel type MISFETs are formed.

As shown in FIGS. 40 to 42, the SOI substrate has a BOX layer 2c, a Box layer 2d, a BOX layer 2e and a BOX layer 2f. The BOX layer 2c is an insulating layer formed on the support substrate 1 in the area ARN1. The BOX layer 2d is an insulating layer formed on the support substrate 1 in the area ARP1. The BOX layer 2e is an insulating layer formed on the support substrate 1 in the area ARN2. The BOX layer 2f is an insulating layer formed on the support substrate 1 in the area ARP2. The BOX layer 2c, the BOX layer 2d, the BOX layer 2e and the BOX layer 2f extend in the X-axis direction in the surface 1a of the support substrate 1. Moreover, the BOX layer 2c, the BOX layer 2d, the BOX layer 2e and the BOX layer 2f are arranged in the Y-axis direction in the surface 1a of the support substrate 1 in the order of the BOX layer 2c, the BOX layer 2d, the BOX layer 2e and the BOX layer 2f.

As shown in FIGS. 40 to 42, the SOI substrate has an SOI layer 3c, an SOI layer 3d, an SOI layer 3e and an SOI layer 3f. The SOI layer 3c is a semiconductor layer formed on the BOX layer 2c in the area ARN1. The SOI layer 3d is a semiconductor layer formed on the BOX layer 2d in the area ARP1. The SOI layer 3e is a semiconductor layer formed on the BOX layer 2e in the area ARN2. The SOI layer 3f is a semiconductor layer formed on the BOX layer 2f in the area ARP2. The SOI layer 3c, the SOI layer 3d, the SOI layer 3e and the SOI layer 3f extend in the X-axis direction in the surface 1a of the support substrate 1. Moreover, the SOI layer 3c, the SOI layer 3d, the SOI layer 3e and the SOI layer 3f are arranged in the Y-axis direction in the surface 1a of the support substrate 1 in the order of the SOI layer 3c, the SOI layer 3d, the SOI layer 3e and the SOI layer 3f.

The support substrate 1 is made of, for example, a p-type single-crystal silicon having a plane orientation of (100) and a resistivity of about 5 Ωcm. The BOX layer 2c, the BOX layer 2d, the BOX layer 2e and the BOX layer 2f are made of a silicon oxide film having a thickness of, for example, about 10 nm. Preferably, each of the BOX layer 2d, the BOX layer 2e and the BOX layer 2f is an insulating layer of the same layer as the BOX layer 2c. The SOI layer 3c, the SOI layer 3d, the SOI layer 3e and the SOI layer 3f are respectively made of, for example, a single-crystal silicon having a plane orientation of (100) and a thickness of about 30 nm. More preferably, each of the SOI layer 3d, the SOI layer 3e and the SOI layer 3f is a semiconductor layer of the same layer as the SOI layer 3c. On the support substrate 1, an element isolation trench 4 which reaches the support substrate 1 from the surface of the SOI layer 3a and the SOI layer 3b and has a depth of, for example, about 300 nm is formed by a known STI technique. Inside the element isolation trench 4, an insulating film made of, for example, silicon oxide or the like is buried. Therefore, the SOI layer 3c, the SOI layer 3d, the SOI layer 3e and the SOI layer 3f are divided by the element isolation trench 4.

In the area ARN1, on the surface 1a side of the support substrate 1, a p-type well 6c serving as a p-type semiconductor region is formed. In the area ARP1, on the surface 1a side of the support substrate 1, an n-type well 5d serving as an n-type semiconductor region is formed. In the area ARN2, on the surface 1a side of the support substrate 1, a p-type well 6e serving as a p-type semiconductor region is formed. In the area ARP2, on the surface 1a side of the support substrate 1, an n-type well 5f serving as an n-type semiconductor region is formed.

Each of the p-type well 6c, the n-type well 5d, the p-type well 6e and the n-type well 5f extends in the X-axis direction in the surface 1a of the support substrate 1. Moreover, the p-type well 6c, then-type well 5d, the p-type well 6e and the n-type well 5f are arranged in the Y-axis direction in the surface 1a of the support substrate 1 in the order of the p-type well 6c, the n-type well 5d, the p-type well 6e and the n-type well 5f.

The BOX layer 2c is formed on the p-type well 6c in the area ARN1. The BOX layer 2d is formed on the n-type well 5d in the area ARP1. The BOX layer 2e is formed on the p-type well 6e in the area ARN2. The BOX layer 2f is formed on the n-type well 5f in the area ARP2.

The p-type impurity concentration in the p-type well 6c and the p-type well 6e may be set to about $10^{18}$ cm$^{-3}$, and the n-type impurity concentration in the n-type well 5d and the n-type well 5f may be set to about $10^{18}$ cm$^{-3}$.

As shown in FIG. 41, the n-type well 5d is formed from the area ARP1 toward the outside area on one side (left side in FIG. 41) in the X-axis direction of the area ARP1. Also, on a portion of the n-type well 5d formed in the outside area of the area ARP1 corresponding to an end portion on the one side (left side in FIG. 41) in the X-axis direction, the BOX layer 2d and the SOI layer 3d are not formed and the n-type well 5d is exposed. This area 51d in which the n-type well 5d is exposed is an area which is referred to as a tap, in which a plug 15 (see FIG. 43 to be described later) which is electrically connected to the n-type well 5d is formed. In the area 51d, the plug 15 is formed on the end portion of the n-type well 5d, and the end portion of the n-type well 5d is electrically connected to the plug 15. More specifically, the end portion of the n-type well 5d is electrically connected to a voltage generating circuit, which applies a substrate bias, through the plug 15.

Similarly, on one end portion of the n-type well 5f formed in the outside area of the area ARP2, the BOX layer 2f and the SOI layer 3f are not formed and the n-type well 5f is exposed. This area 51f in which the n-type well 5f is exposed is an area which is referred to as the tap. In the area 51f, the plug 15 (see FIG. 43 to be described later) is formed on the end portion of the n-type well 5f, and the end portion of the n-type well 5f is electrically connected to the plug 15. More specifically, the end portion of the n-type well 5f is electrically connected to the voltage generating circuit, which applies a substrate bias, through the plug 15.

As shown in FIG. 42, the p-type well 6e is formed from the area ARN2 toward the outside area on one side (left side in FIG. 42) in the X-axis direction of the area ARN2. Also, on a portion of the p-type well 6e formed in the outside area of the area ARN2 corresponding to an end portion on the one side (left side in FIG. 42) in the X-axis direction, the BOX layer 2e and the SOI layer 3e are not formed and the p-type well 6e is exposed. This area 61e in which the p-type well 6e is exposed is an area which is referred to as the tap. In the area 61e, the plug 15 (see FIG. 43 to be described later) is formed on the end portion of the p-type well 6e, and the end portion of the p-type well 6e is electrically connected to the plug 15. More specifically, the end portion of the p-type well 6e is electrically connected to a voltage generating circuit, which applies a substrate bias, through the plug 15.

Similarly, on one end portion of the p-type well 6c formed in the outside area of the area ARN1, the BOX layer 2c and the SOI layer 3c are not formed and the p-type well 6c is exposed. This area 61c in which the p-type well 6c is exposed is an area which is referred to as the tap. In the area 61c, the plug 15 (see FIG. 43 to be described later) is formed on the end portion of the p-type well 6c, and the end portion of the p-type well 6c is electrically connected to the plug 15. More specifically, the end portion of the p-type well 6c is electrically connected to the voltage generating circuit, which applies a substrate bias, through the plug 15.

In a comparative example to be described later with reference to FIG. 56, in the case where the respective p-type well and n-type well are electrically connected to the plug in an area located between the adjacent SOI layers, a space needs to be formed between the adjacent SOI layers. For this reason, the area of the semiconductor integrated circuit device cannot be reduced, or the BOX layer and the SOI layer on the p-type well or the n-type well need to be removed between the adjacent SOI layers, with the result that the manufacturing process might become complicated.

On the other hand, in the fifth embodiment, on the outside of each of the SOI layer 3c, the SOI layer 3d, the SOI layer 3e and the SOI layer 3f in the X-axis direction, each of the p-type well 6c, the n-type well 5d, the p-type well 6e and the n-type well 5f is electrically connected to the plug in the area referred to as the tap. Therefore, there is no need for forming a space between the adjacent SOI layers. For this reason, it becomes possible to reduce the area of the semiconductor integrated circuit device, and since there is no need for removing the BOX layer and the SOI layer on the p-type well or the n-type well between the adjacent SOI layers, it is possible to prevent or suppress the manufacturing process from becoming complicated.

<Configuration of Speed Monitor Circuit Including NAND Circuit>

Next, a configuration of a speed monitor circuit including a NAND circuit on an SOI substrate having the above-mentioned four areas, that is, the area ARN1, the area ARP1, the area ARN2 and the area ARP2 will be described. Note that the main circuit including a NAND circuit can be similarly configured by replacing the respective MISFET QP41, MISFET QP42, MISFET QN41 and MISFET QN42 with the MISFET QP1, MISFET QP2, MISFET QN1 and MISFET QN2.

Figure 43:
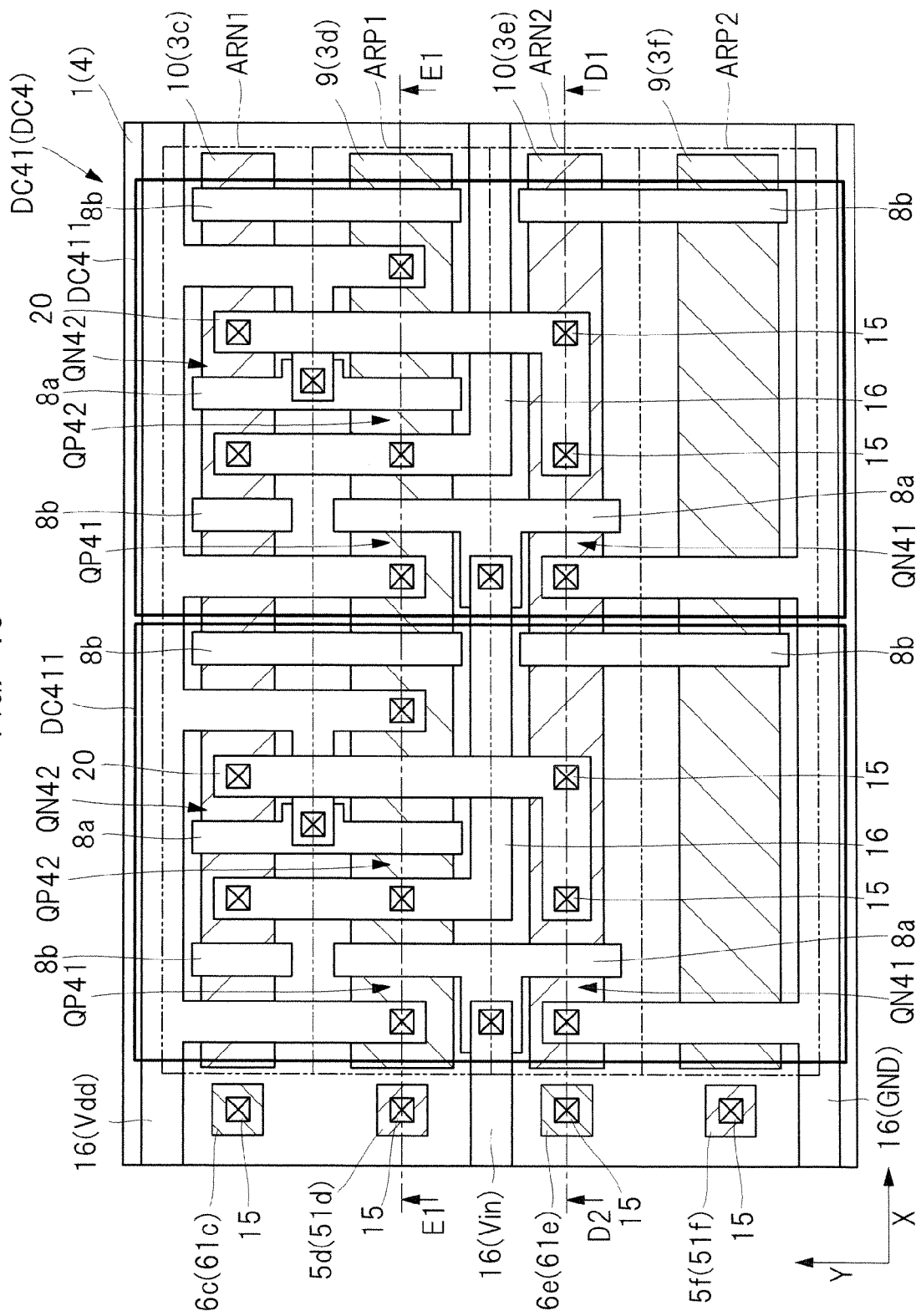
FIG. 43 is a plan view of a semiconductor integrated circuit device constituting a part of the speed monitor circuit including a NAND circuit shown in FIG. 36.
Figure 44:
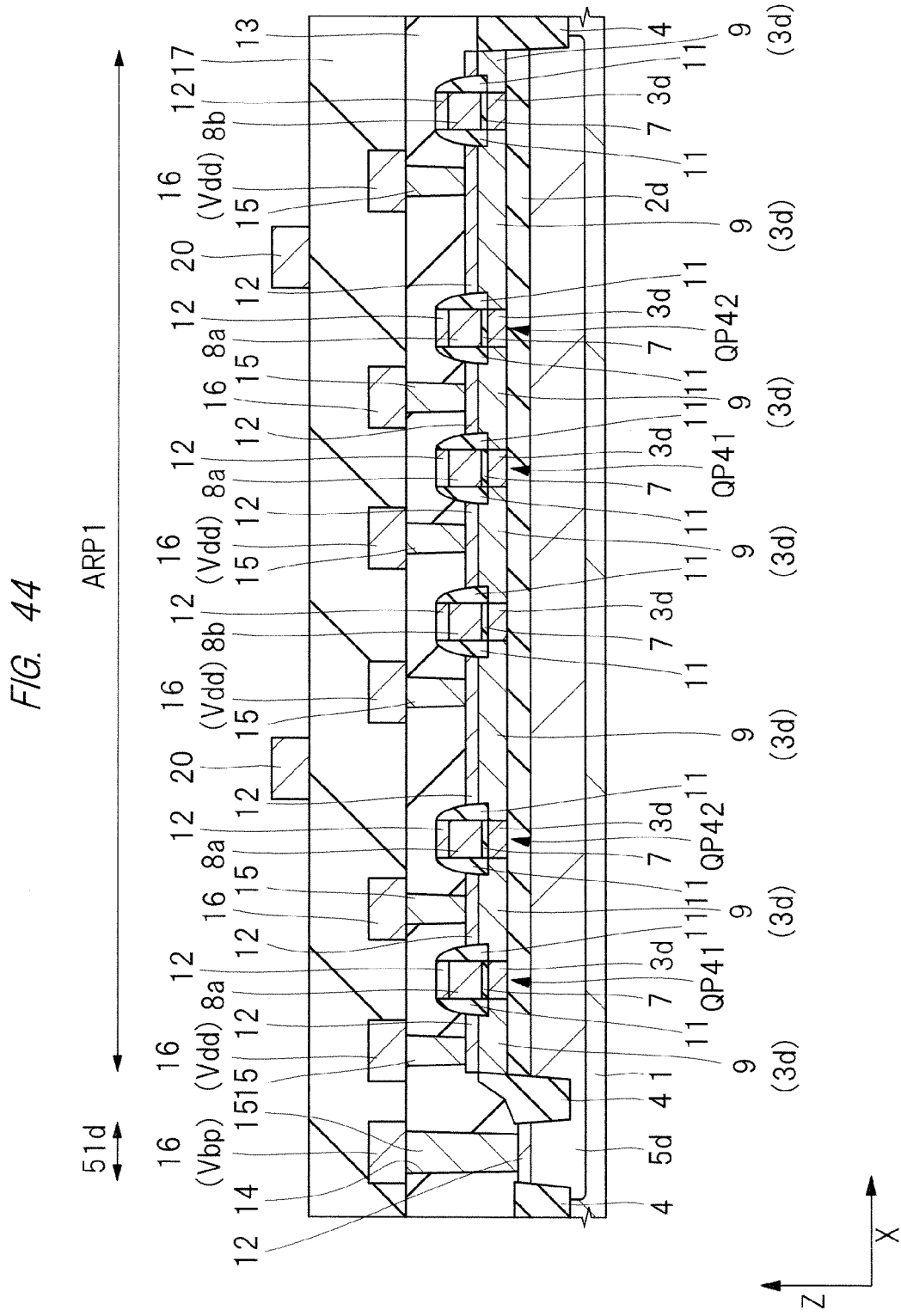
FIG. 44 is a sectional view of a semiconductor integrated circuit device constituting a part of the speed monitor circuit including a NAND circuit shown in FIG. 36.
Figure 45:
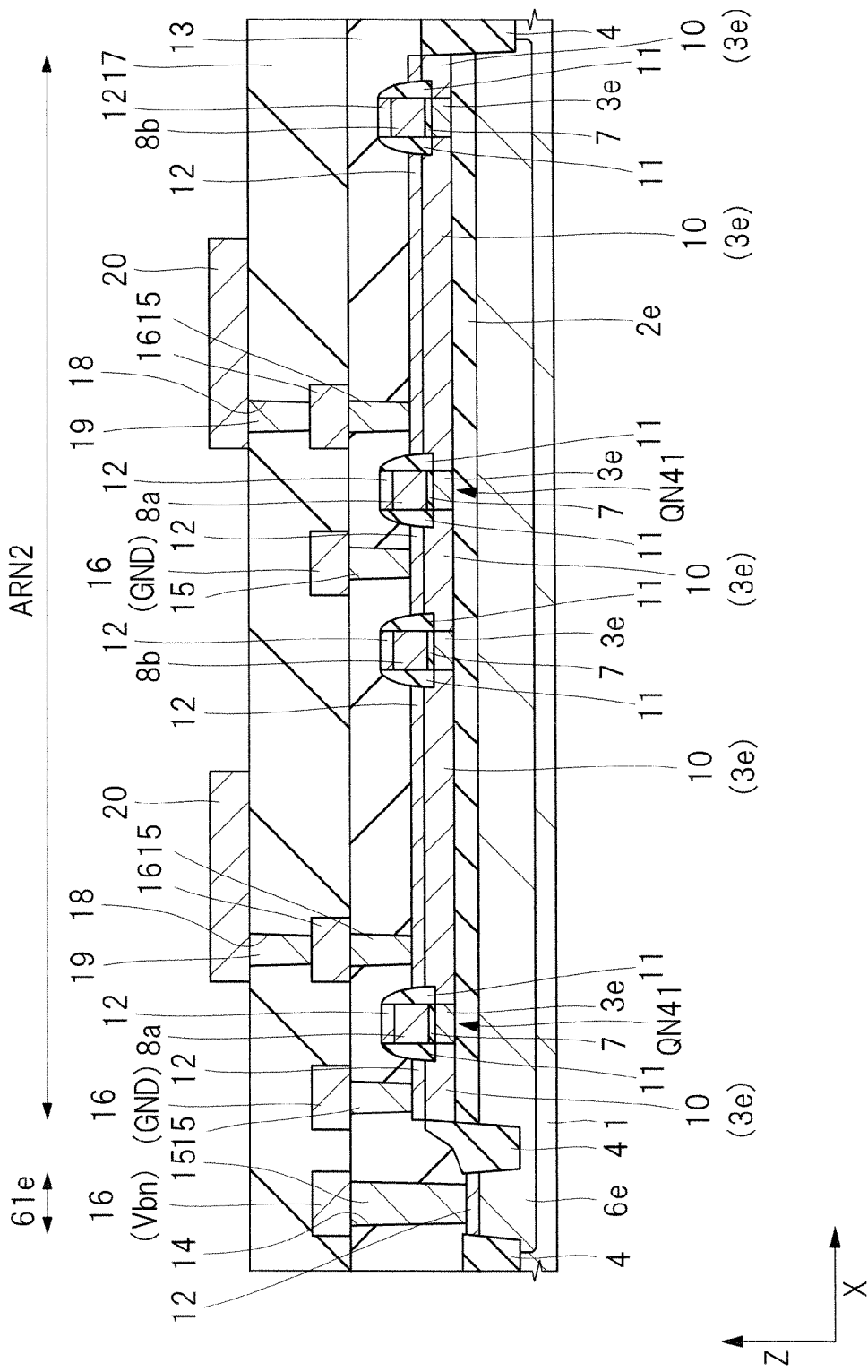
FIG. 45 is a sectional view of a semiconductor integrated circuit device constituting a part of the speed monitor circuit including a NAND circuit shown in FIG. 36.

FIG. 43 is a plan view of a semiconductor integrated circuit device constituting a part of a speed monitor circuit including the NAND circuit shown in FIG. 36. FIGS. 44 and 45 are sectional views of the semiconductor integrated circuit device constituting a part of the speed monitor circuit including the NAND circuit shown in FIG. 36. FIG. 44 is a sectional view taken along the line E1-E1 of FIG. 43, and FIG. 45 is a sectional view taken along the line D2-D2 of FIG. 43. Note that FIG. 43 shows a transparent state obtained by removing the interlayer insulating film 17, the interlayer insulating film 13, the silicide layer 12 and the sidewall spacer 11. Moreover, in FIGS. 43 to 45, two directions which are in parallel with the surface 1a serving as the main surface of the support substrate 1 and orthogonal to each other are defined as the X-axis direction and the Y-axis direction, and a direction perpendicular to the surface 1a of the support substrate 1 is defined as the Z-axis direction.

In the area ARP1, the p-channel type MISFET QP41 and the p-channel type MISFET QP42 are formed on the support substrate 1, that is, on the SOI layer 3d. Moreover, in the area ARN2, the n-channel type MISFET QN41 is formed on the support substrate 1, that is, on the SOI layer 3e, and in the area ARN1, the n-channel type MISFET QN42 is formed on the support substrate 1, that is, on the SOI layer 3c.

As shown in FIGS. 43 and 44, in the area ARP1, a gate electrode 8a is formed on the SOI layer 3d, with a gate insulating film 7 interposed therebetween. Moreover, as shown in FIGS. 43 and 45, in the area ARN2, the gate electrode 8a is formed on the SOI layer 3e, with the gate insulating film 7 interposed therebetween. Furthermore, although the illustration of the gate insulating film 7 is omitted in FIG. 43, in the area ARN1, the gate electrode 8a is formed on the SOI layer 3c, with the gate insulating film 7 interposed therebetween. As shown in FIG. 43, the gate electrodes 8a respectively extend in the Y-axis direction when seen in the plan view.

As shown in FIGS. 43 and 44, in the area ARP1, a dummy gate electrode 8b is formed on the SOI layer 3d, with the gate insulating film 7 interposed therebetween. Moreover, as shown in FIGS. 43 and 45, in the area ARN2, the dummy gate electrode 8b is formed on the SOI layer 3e, with the gate insulating film 7 interposed therebetween. Furthermore, although the illustration of the gate insulating film 7 is omitted in FIG. 43, in the area ARN1, the dummy gate electrode 8b is formed on the SOI layer 3c, with the gate insulating film 7 interposed therebetween, and in the area ARP2, the dummy gate electrode 8b is formed on the SOI layer 3f, with the gate insulating film 7 interposed therebetween. As shown in FIG. 43, the dummy gate electrodes 8b respectively extend in the Y-axis direction when seen in the plan view. The dummy gate electrode 8b does not function as the gate electrode of the MISFET, but has a function of, for example, adjusting the potential of the SOI layer 3c, the potential of the SOI layer 3d, the potential of the SOI layer 3e, and the potential of the SOI layer 3f.

The gate insulating film 7 is formed by, for example, thermally oxidizing the surface of the SOI layer 3c, the surface of the SOI layer 3d, the surface of the SOI layer 3e, and the surface of the SOI layer 3f. The gate electrode 8a or the dummy gate electrode 8b is formed by depositing a polycrystalline silicon film on the SOI layer 3c, the SOI layer 3d, the SOI layer 3e and the SOI layer 3f, with the gate insulating film 7 interposed therebetween and then dry etching the deposited polycrystalline silicon film.

As shown in FIG. 44, in the area ARP1, p-type semiconductor regions 9 are formed in the SOI layer 3d on the both sides of the gate electrode 8a and in the SOI layer 3d on the both sides of the dummy gate electrode 8b. Moreover, in the area ARP2, the p-type semiconductor regions 9 are formed in the SOI layer 3f on the both sides of the dummy gate electrode 8b. The p-type semiconductor region 9 is formed by ion-implanting a p-type impurity such as boron (B) into the SOI layer on the both sides of the gate electrode 8a and into the SOI layer on the both sides of the dummy gate electrode 8b.

As shown in FIG. 45, in the area ARN2, n-type semiconductor regions 10 are formed in the SOI layer 3e on the both sides of the gate electrode 8a and in the SOI layer 3e on the both sides of the dummy gate electrode 8b. Moreover, in the area ARN1, the n-type semiconductor regions 10 are formed in the SOI layer 3c on the both sides of the gate electrode 8a and in the SOI layer 3c on the both sides of the dummy gate electrode 8b. The n-type semiconductor region 10 is formed by ion-implanting an n-type impurity such as arsenic (As) or phosphorus (P) into the SOI layer on the both sides of the gate electrode 8a and into the SOI layer on the both sides of the dummy gate electrode 8b.

As shown in FIG. 44 and FIG. 45, a sidewall spacer 11 is formed on each of the side wall of the gate electrode 8a and the side wall of the dummy gate electrode 8b. The sidewall spacer 11 is formed by etching back a silicon oxide film, which is deposited on the surfaces of the gate electrode 8a and the dummy gate electrode 8b by, for example, a CVD method, by using an anisotropic etching.

On the support substrate 1 including the surfaces of the gate electrode 8a, the dummy gate electrode 8b, the sidewall spacer 11, the p-type semiconductor region 9 and the n-type semiconductor region 10, an interlayer insulating film 13 is formed.

As shown in FIG. 44, in the area ARP1, in the interlayer insulating film 13, a contact hole 14 which penetrates the interlayer insulating film 13 to reach the surface of any one of the n-type well 5d, the gate electrode 8a and the p-type semiconductor region 9 is formed. Inside the contact hole 14, a plug 15 made of a conductive film such as a tungsten (W) film buried inside the contact hole 14 is formed. The plug 15 is electrically connected to any one of the n-type well 5d, the gate electrode 8a and the p-type semiconductor region 9, which are exposed on the bottom portion of the contact hole 14 through the silicide layer 12. Note that illustrations of the contact hole which reaches the surface of the gate electrode 8a and the plug connected to the gate electrode 8a are omitted in FIG. 44.

As shown in FIG. 45, in the area ARN2, in the interlayer insulating film 13, a contact hole 14 which penetrates the interlayer insulating film 13 to reach the surface of any one of the p-type well 6e, the gate electrode 8a and the n-type semiconductor region 10 is formed. Inside the contact hole 14, a plug 15 made of a conductive film such as a tungsten film buried inside the contact hole 14 is formed. The plug 15 is electrically connected to any one of the p-type well 6e, the gate electrode 8a and the n-type semiconductor region 10, which are exposed on the bottom portion of the contact hole 14 through the silicide layer 12. Note that illustrations of the contact hole which reaches the surface of the gate electrode 8a and the plug connected to the gate electrode 8a are omitted in FIG. 45. Moreover, in the area ARN1, the same configuration as that of the area ARN2 is formed.

On the interlayer insulating film 13, a first layer wire 16 which is made of, for example, an aluminum (Al) alloy film and electrically connected to the plug 15 is formed. Moreover, on the interlayer insulating film 13 including the surface of the first layer wire 16, an interlayer insulating film 17 is formed. In the interlayer insulating film 17, a contact hole 18 which penetrates the interlayer insulating film 17 to reach the first layer wire 16 is formed. Inside the contact hole 18, a plug 19 made of a conductive film such as a copper (Cu) film buried inside the contact hole 18 is formed. On the interlayer insulating film 17, a second layer wire 20 which is made of, for example, an aluminum alloy film and electrically connected to the plug 19 is formed. Moreover, although not shown, wires in a plurality of layers can be formed on the second layer wire 20.

As shown in FIGS. 43 to 45, in the area ARP1, the p-channel type MISFET QP41 and the p-channel type MISFET QP42 made up of the SOI layer 3d, the gate insulating film 7, the gate electrode 8a and the p-type semiconductor region 9 are formed. In the area ARP1, the p-channel type MISFET QP41 and the p-channel type MISFET QP42 are disposed on the SOI layer 3d, with a space being formed therebetween in the X-axis direction. Also, in the area ARN2, the n-channel type MISFET QN41 made up of the SOI layer 3e, the gate insulating film 7, the gate electrode 8a and the n-type semiconductor region 10 is formed. Furthermore, in the area ARN1, the n-channel type MISFET QN42 made up of the SOI layer 3c, the gate insulating film 7 (not shown), the gate electrode 8a and the n-type semiconductor region 10 is formed.

More specifically, the speed monitor circuit DC41 including the NAND circuit DC411 is formed in the three areas composed of the area ARN1, the area ARP1 and the area ARN2 among the four areas composed of the area ARN1, the area ARP1, the area ARN2 and the area ARP2. This configuration is the same not only in the case where the speed monitor circuit DC41 including the NAND circuit DC411 is formed on the SOI substrate, but also in the case where the main circuit MC4 including the NAND circuit is formed on the SOI substrate.

As shown in FIG. 43, the first layer wire 16 for inputting the voltage Vin to the gate electrode 8a of the MISFET QP41 and the gate electrode 8a of the MISFET QN41 is formed. Moreover, the first layer wire 16 for connecting the power supply voltage Vdd to the p-type semiconductor region 9 serving as the source electrode of the MISFET QP41, the p-type semiconductor region 9 serving as the source electrode of the MISFET QP42, the gate electrode 8a of the MISFET QP42 and the gate electrode 8a of the MISFET QN42 is formed. Furthermore, the first layer wire 16 for outputting the voltage Vout from the p-type semiconductor region 9 serving as the drain electrode of the MISFET QP41 and the drain electrode of the MISFET QP42 and the n-type semiconductor region 10 serving as the drain electrode of the MISFET QN42 is formed. Also, the first layer wire 16 for connecting the n-type semiconductor region 10 serving as the source electrode of the MISFET QN41 to the ground potential GND is formed.

On the other hand, in the example shown in FIG. 43, since a wire for connecting the n-type semiconductor region 10 serving as the source electrode of the MISFET QN42 to the n-type semiconductor region 10 serving as the drain electrode of the MISFET QN41 crosses the first layer wire 16 for outputting the voltage Vout, it is formed as a second layer wire 20.

By the first layer wire 16 (see FIG. 44) electrically connected to the n-type well 5d through the plug 15, the substrate bias Vbp is applied to the n-type well 5d. Moreover, by the first layer wire 16 (see FIG. 45) electrically connected to the p-type well 6e through the plug 15, the substrate bias Vbn is applied to the p-type well 6e, and by the first layer wire 16 (not shown) electrically connected to the p-type well 6c through the plug 15, the substrate bias Vbns is applied to the p-type well 6c.

With this configuration, the substrate bias Vbp can be applied to the n-type well 5d electrically insulated from the SOI layer 3d, the substrate bias Vbn can be applied to the p-type well 6e electrically insulated from the SOI layer 3e, and the substrate bias Vbns can be applied to the p-type well 6c electrically insulated from the SOI layer 3c. Moreover, voltage values of the respective substrate bias Vbp, substrate bias Vbn and substrate bias Vbns can be adjusted in a wide range. Therefore, the substrate bias to be applied to the MISFETs constituting the main circuit MC4 can be controlled with high precision so that the delay time of the main circuit MC4 becomes a target time.

Moreover, the voltage value of the substrate bias Vbn and the voltage value of the substrate bias Vbns can be separately adjusted and determined separately. More specifically, preferably, the voltage value of the substrate bias Vbns is different from the voltage value of the substrate bias Vbn. In this case, in comparison with the case in which the voltage value of the substrate bias Vbn and the voltage value of the substrate bias Vbns are not adjusted separately, the substrate bias to be applied to the MISFETs constituting the main circuit MC4 can be controlled with higher precision so that the delay time of the main circuit MC4 becomes a target time.

<Configuration of Speed Monitor Circuit including NOR Circuit>

Next, a configuration of a speed monitor circuit including a NOR circuit on an SOI substrate having the above-mentioned four areas, that is, the area ARN1, the area ARP1, the area ARN2 and the area ARP2 will be described. Note that the descriptions of the same portions as those of the speed monitor circuit including the NAND circuit are partly omitted, and portions different from those of the speed monitor circuit including the NAND circuit will be mainly described. Also, the main circuit including a NOR circuit can be similarly configured by replacing the respective MISFET QP43, MISFET QP44, MISFET QN43 and MISFET QN44 with the MISFET QP3, MISFET QP4, MISFET QN3 and MISFET QN4

Figure 46:
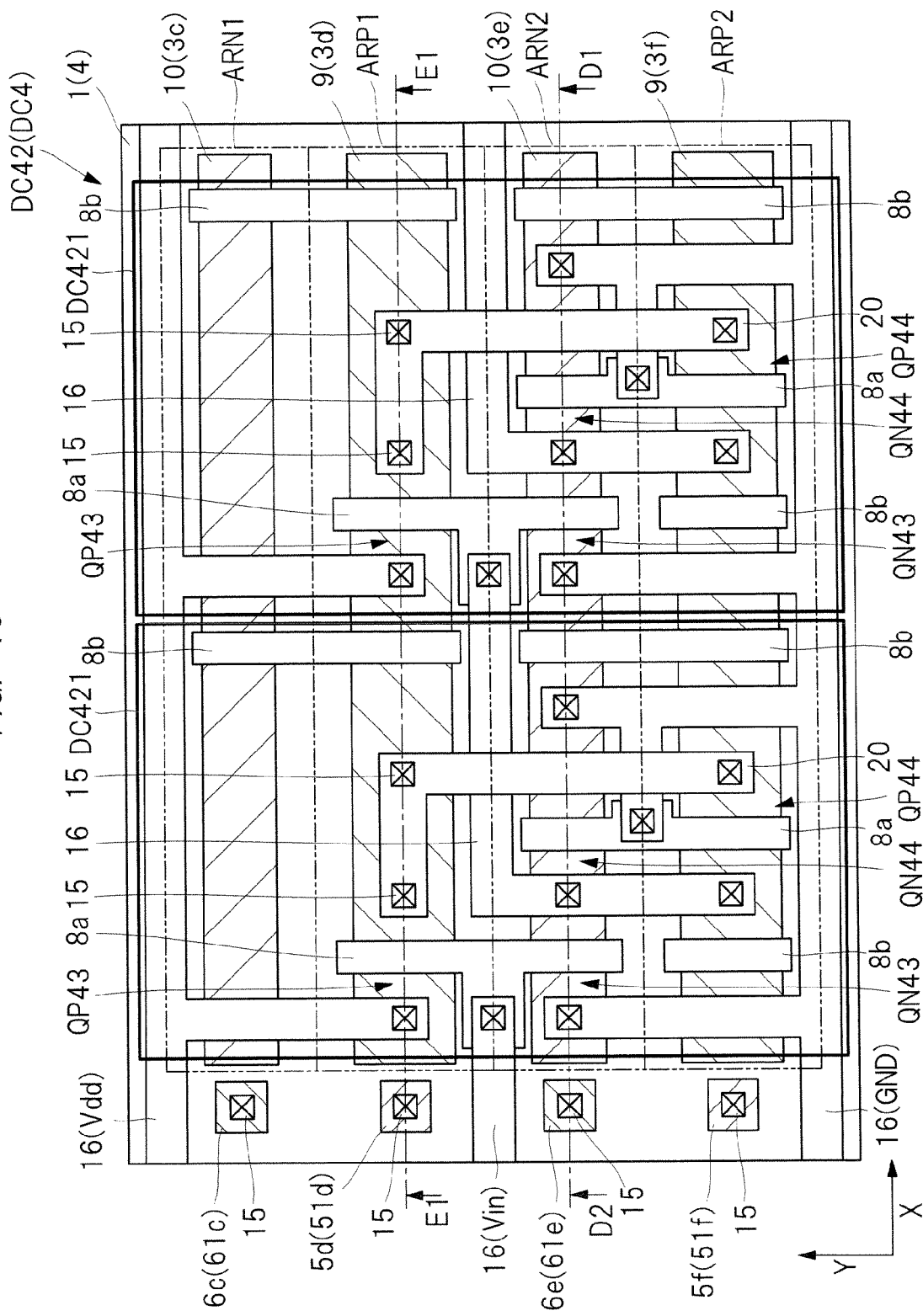
FIG. 46 is a plan view of a semiconductor integrated circuit device constituting a part of the speed monitor circuit including a NOR circuit shown in FIG. 37.
Figure 47:
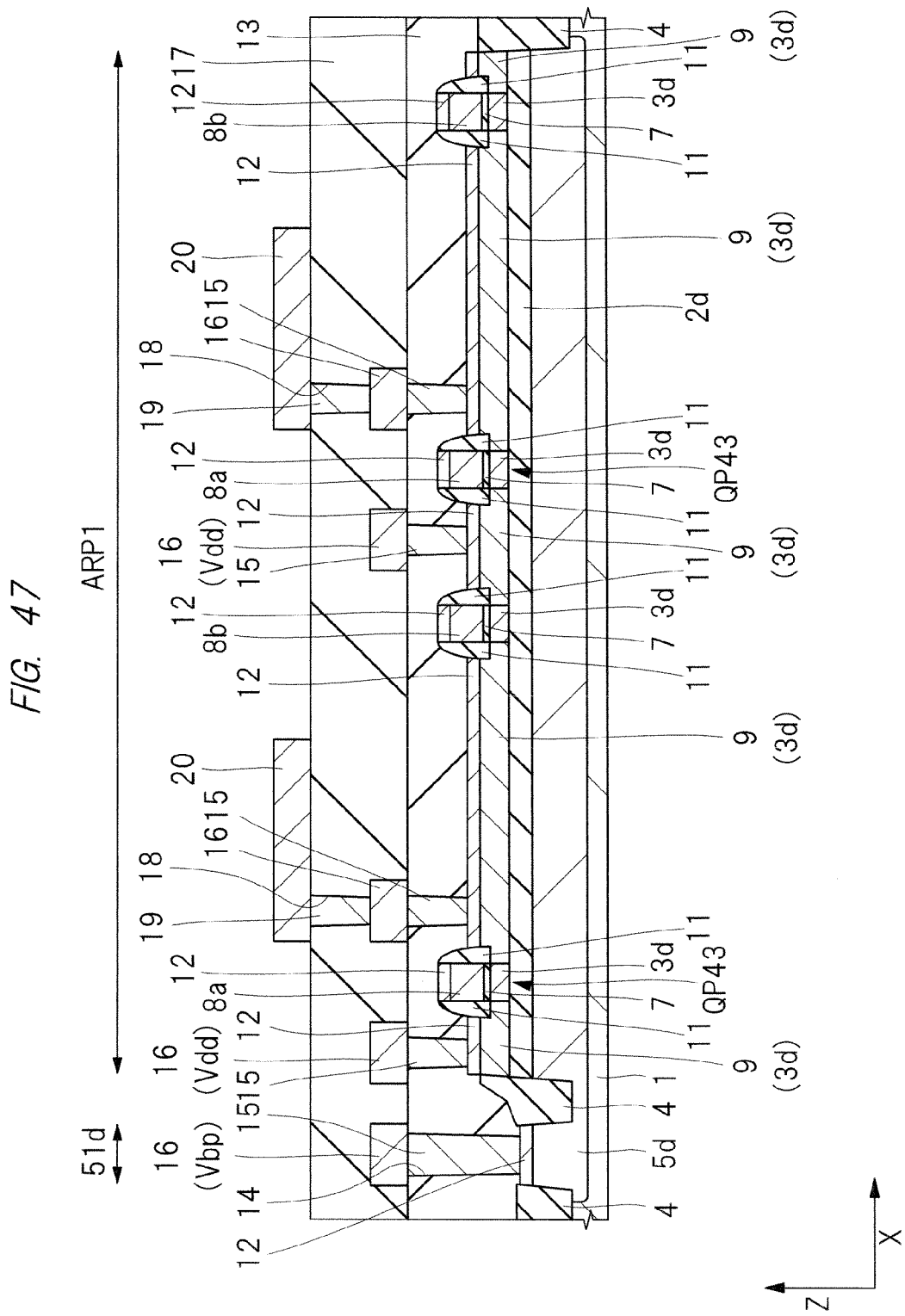
FIG. 47 is a sectional view of a semiconductor integrated circuit device constituting a part of the speed monitor circuit including a NOR circuit shown in FIG. 37.
Figure 48:
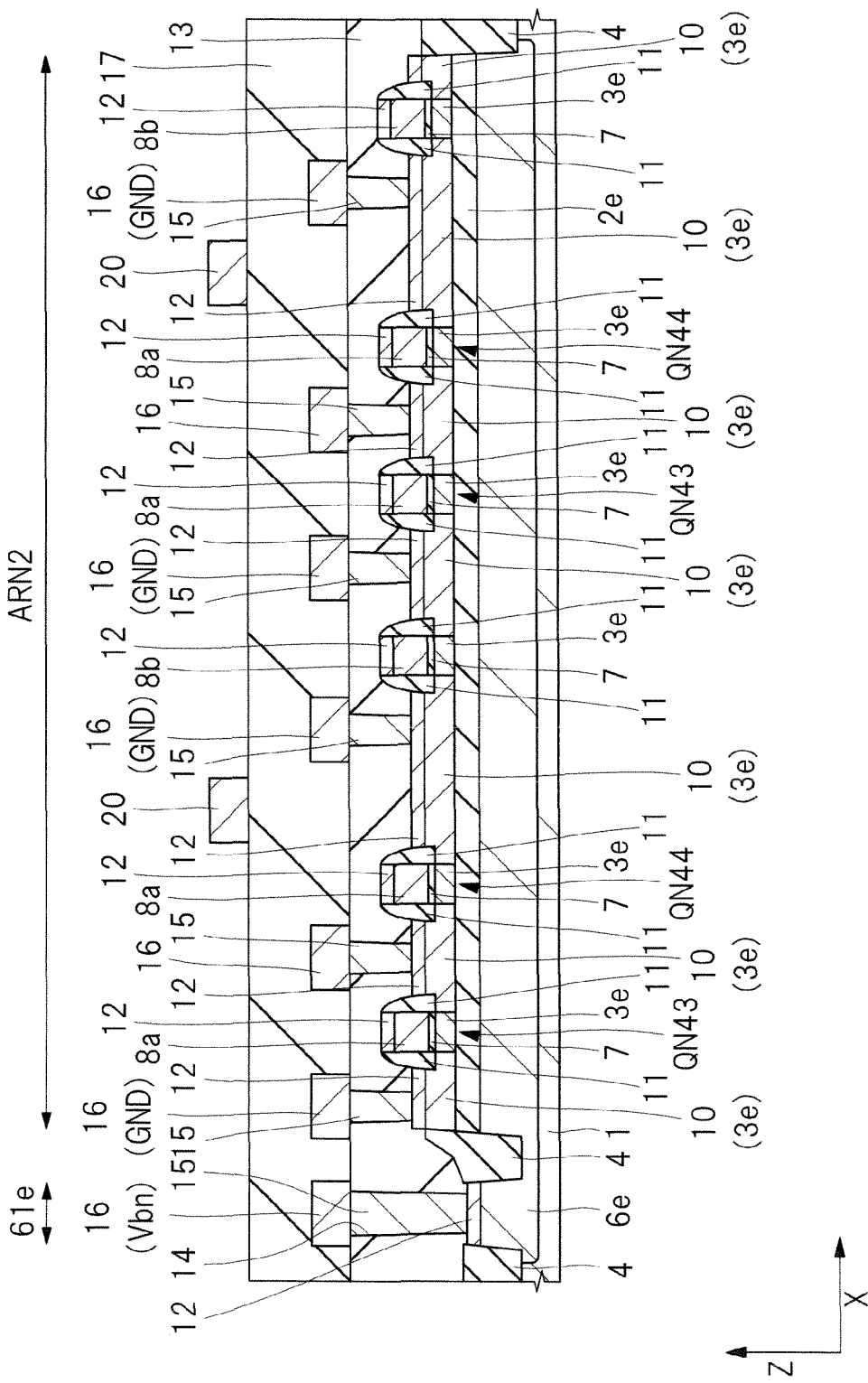
FIG. 48 is a sectional view of a semiconductor integrated circuit device constituting a part of the speed monitor circuit including a NOR circuit shown in FIG. 37.

FIG. 46 is a plan view of a semiconductor integrated circuit device constituting a part of a speed monitor circuit including a NOR circuit shown in FIG. 37. FIGS. 47 and 48 are sectional views of the semiconductor integrated circuit device constituting a part of the speed monitor circuit including the NOR circuit shown in FIG. 37. FIG. 47 is a sectional view taken along the line E1-E1 of FIG. 46, and FIG. 48 is a sectional view taken along the line D2-D2 of FIG. 46. Note that FIG. 46 shows a transparent state obtained by removing the interlayer insulating film 17, the interlayer insulating film 13, the silicide layer 12 and the sidewall spacer 11. Moreover, in FIGS. 46 to 48, two directions which are in parallel with the surface 1a serving as the main surface of the support substrate 1 and orthogonal to each other are defined as the X-axis direction and the Y-axis direction, and a direction perpendicular to the surface 1a of the support substrate 1 is defined as the Z-axis direction.

In the area ARP1, the p-channel type MISFET QP43 is formed on the support substrate 1, that is, on the SOI layer 3d, and in the area ARP2, the p-channel type MISFET QP44 is formed on the support substrate 1, that is, on the SOI layer 3f. Moreover, in the area ARN2, the n-channel type MISFET QN43 and the n-channel type MISFET QN44 are formed on the support substrate 1, that is, on the SOI layer 3e.

As shown in FIGS. 46 to 48, on the SOI layer 3d, the SOI layer 3e and the SOI layer 3f, the gate electrode 8a or the dummy gate electrode 8b is formed, with a gate insulating film 7 interposed therebetween. As shown in FIG. 46, the gate electrode 8a and the dummy gate electrode 8b respectively extend in the Y-axis direction when seen in the plan view.

As shown in FIG. 47, in the area ARP1, the p-type semiconductor region 9 is formed in the SOI layer 3d on the both sides of the gate electrode 8a and in the SOI layer 3d on the both sides of the dummy gate electrode 5b. Moreover, in the area ARP2, the p-type semiconductor region 9 is formed in the SOI layer 3f on the both sides of the gate electrode 8a and in the SOI layer 3f on the both sides of the dummy gate electrode 8b.

As shown in FIG. 48, in the area ARN2, the n-type semiconductor region 10 is formed in the SOI layer 3e on the both sides of the gate electrode 8a and in the SOI layer 3e on the both sides of the dummy gate electrode 8b. Also, in the area ARN1, the n-type semiconductor region 10 is formed in the SOI layer 3c on the both sides of the dummy gate electrode 8b.

The sidewall spacer 11 is formed on the side wall of the gate electrode 8a and the side wall of the dummy gate electrode 8b. Also, on the support substrate 1 including the surfaces of the gate electrode 8a, the dummy gate electrode 8b, the sidewall spacer 11, the p-type semiconductor region 9 and the n-type semiconductor region 10, the interlayer insulating film 13 is formed.

As shown in FIG. 47, in the area ARP1, the contact hole 14 which penetrates the interlayer insulating film 13 to reach the surface of any one of the n-type well 5d, the gate electrode 8a and the p-type semiconductor region 9 is formed in the interlayer insulating film 13, and inside the contact hole 14, the plug 15 is formed. The plug 15 is electrically connected to any one of the n-type well 5d, the gate electrode 8a and the p-type semiconductor region 9, which are exposed on the bottom portion of the contact hole 14, through the silicide layer 12. Note that, in FIG. 47, illustrations of the contact hole which reaches the surface of the gate electrode 8a and the plug connected to the gate electrode 8a are omitted. Also, the area ARP2 has the same configuration as the area ARP1.

As shown in FIG. 48, in the area ARN2, the contact hole 14 which penetrates the interlayer insulating film 13 to reach the surface of any one of the p-type well 6e, the gate electrode 8a and the n-type semiconductor region 10 is formed in the interlayer insulating film 13. Inside the contact hole 14, the plug 15 is formed. The plug 15 is electrically connected to any one of the p-type well 6e, the gate electrode 8a and the n-type semiconductor region 10, which are exposed on the bottom portion of the contact hole 14, through the silicide layer 12. Note that, in FIG. 48, illustrations of the contact hole which reaches the surface of the gate electrode 8a and the plug connected to the gate electrode 8a are omitted.

On the interlayer insulating film 13, the first layer wire 16 electrically connected to the plug 15 is formed. Also, on the interlayer insulating film 13 including the surface of the first layer wire 16, an interlayer insulating film 17 is formed. In the interlayer insulating film 17, a contact hole 18 which penetrates the interlayer insulating film 17 to reach the first layer wire 16 is formed. Inside the contact hole 18, a plug 19 is formed. On the interlayer insulating film 17, a second layer wire 20 electrically connected to the plug 19 is formed. Moreover, although not shown, wires in a plurality of layers can be formed on the second layer wire 20.

As shown in FIGS. 46 to 48, in the area ARN2, the n-channel type MISFET QN43 and the n-channel type MISFET QN44 which are made up of the SOI layer 3e, the gate insulating film 7, the gate electrode 8a and the n-type semiconductor region 10 are formed. In the area ARN2, the n-channel type MISFET QN43 and the n-channel type MISFET QN44 are disposed on the SOI layer 3e, with a space being formed therebetween in the X-axis direction. Furthermore, in the area ARP1, the p-channel type MISFET QP43 made up of the SOI layer 3d, the gate insulating film 7, the gate electrode 8a and the p-type semiconductor region 9 is formed. In the area ARP2, the p-channel type MISFET QN44 made up of the SOI layer 3f, the gate insulating film 7 (not shown), the gate electrode 8a and the p-type semiconductor region 9 is formed.

More specifically, the speed monitor circuit DC42 including the NOR circuit DC421 is formed in the three areas composed of the area ARP1, the area ARN2 and the area ARP2 among the four areas composed of the area ARN1, the area ARP1, the area ARN2 and the area ARP2. This configuration is the same not only in the case where the speed monitor circuit DC42 including the NOR circuit DC421 is formed on the SOI substrate, but also in the case where the main circuit MC4 including the NOR circuit is formed on the SOI substrate.

As shown in FIG. 46, the first layer wire 16 for inputting the voltage Vin to the gate electrode 8a of the MISFET QP43 and the gate electrode 8a of the MISFET QN43 is formed. Also, the first layer wire 16 for connecting the ground potential GND to the n-type semiconductor region 10 serving as the source electrode of the MISFET QN43, the n-type semiconductor region 10 serving as the source electrode of the MISFET QN44, the gate electrode 8a of the MISFET QN44 and the gate electrode 8a of the MISFET QP44 is formed. Moreover, the first layer wire 16 for outputting the voltage Vout from the n-type semiconductor region 10 serving as the drain electrode of the MISFET QN43 and serving as the drain electrode of the MISFET QN44 and the p-type semiconductor region 9 serving as the drain electrode of the MISFET QP44 is formed. Furthermore, the first layer wire 16 for connecting the p-type semiconductor region 9 serving as the source electrode of the MISFET QP43 to the power supply voltage Vdd is formed.

On the other hand, in the example shown in FIG. 46, since a wire for connecting the p-type semiconductor region 9 serving as the drain electrode of the MISFET QP43 to the p-type semiconductor region 9 serving as the source electrode of the MISFET QP44 crosses the first layer wire 16 for outputting the voltage Vout, it is formed as a second layer wire 20.

By the first layer wire 16 (see FIG. 48) electrically connected to the p-type well 6e through the plug 15, the substrate bias Vbn is applied to the p-type well 6e. Also, by the first layer wire 16 (see FIG. 47) electrically connected to the n-type well 5d through the plug 15, the substrate bias Vbp is applied to the n-type well 5d, and by the first layer wire 16 (not shown) electrically connected to the n-type well 5f through the plug 15, the substrate bias Vbps is applied to the n-type well 5f.

With this configuration, the substrate bias Vbn can be applied to the p-type well 6e electrically insulated from the SOI layer 3e, the substrate bias Vbp can be applied to the n-type well 5d electrically insulated from the SOI layer 3d, and the substrate bias Vbps can be applied to the n-type well 5f electrically insulated from the SOI layer 3f. Moreover, voltage values of the respective substrate bias Vbn, substrate bias Vbp and substrate bias Vbps can be adjusted in a wide range. Therefore, the substrate bias to be applied to the MISFETs constituting the main circuit MC4 can be controlled with high precision so that the delay time of the main circuit MC4 becomes a target time.

Moreover, the voltage value of the substrate bias Vbp and the voltage value of the substrate bias Vbps can be separately adjusted and determined separately. More specifically, preferably, the voltage value of the substrate bias Vbps is different from the voltage value of the substrate bias Vbp. In this case, in comparison with the case in which the voltage value of the substrate bias Vbp and the voltage value of the substrate bias Vbps are not adjusted separately, the substrate bias to be applied to the MISFETs constituting the main circuit MC4 can be controlled with higher precision so that the delay time of the main circuit MC4 becomes a target time.

Note that, on the SOI substrate, the speed monitor circuit DC41 including the NAND circuit DC411 formed in the area ARN1, the area ARP1 and the area ARN2 and the speed monitor circuit DC42 including the NOR circuit DC421 formed in the area ARP1, the area ARN2 and the area ARP2 can be disposed next to each other in the X-axis direction.

<Configuration of Speed Monitor Circuit Including Inverter Circuit>

Next, a configuration of a speed monitor circuit including an inverter circuit on an SOI substrate having the above-mentioned four areas, that is, the area ARN1, the area ARP1, the area ARN2 and the area ARP2 will be described. Note that the descriptions of the same portions as those of the speed monitor circuit including the NAND circuit are partly omitted, and portions different from those of the speed monitor circuit including the NAND circuit will be mainly described. Also, the main circuit including an inverter circuit can be configured in the same manner as the speed monitor circuit including an inverter circuit.

As described above, the speed monitor circuit DC5 including an inverter circuit is the same kind of speed monitor circuit as the speed monitor circuit DC1 described with reference to FIG. 4 and FIG. 9.

Figure 49:
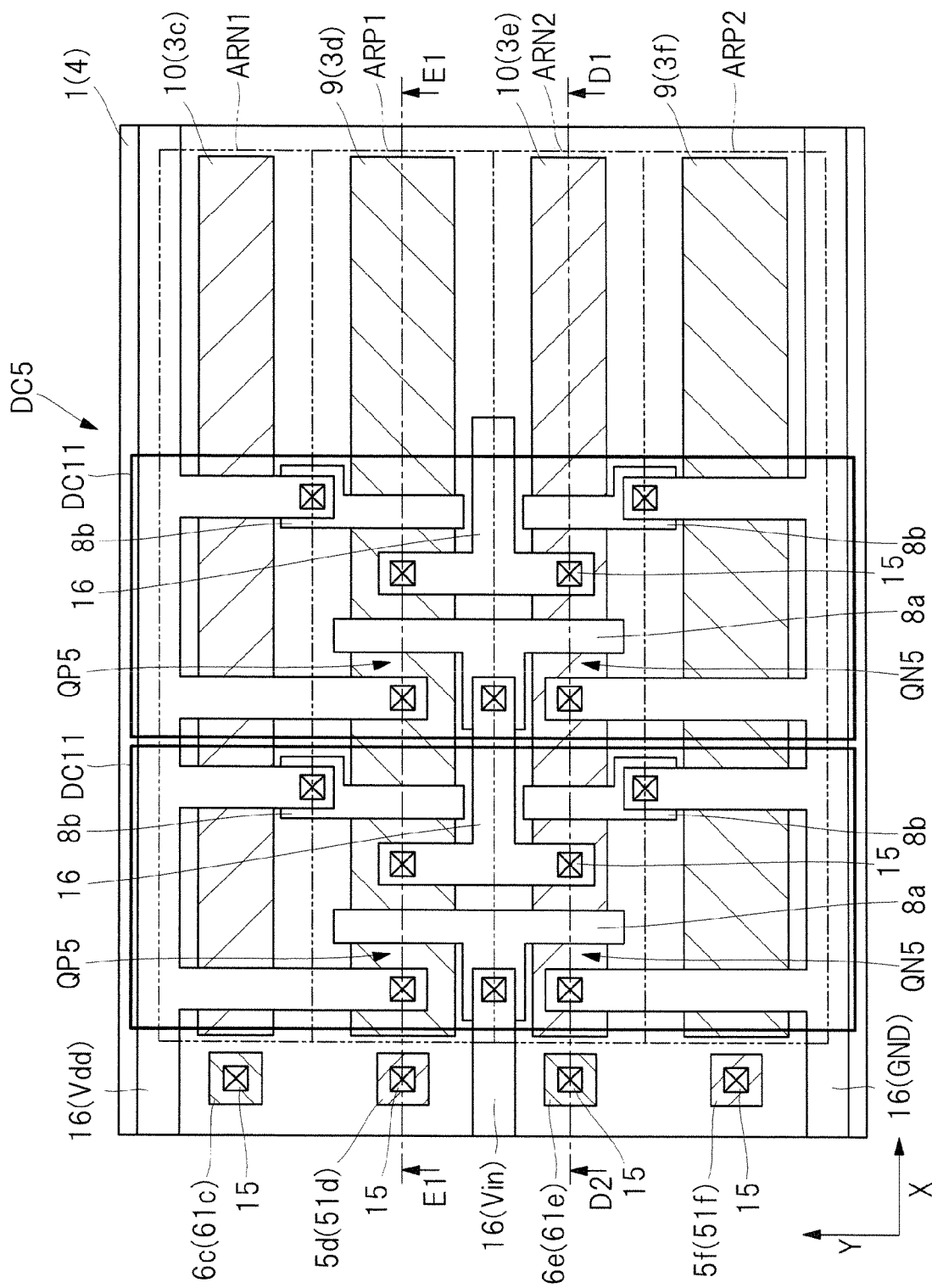
FIG. 49 is a plan view of a semiconductor integrated circuit device constituting a part of the speed monitor circuit including an inverter circuit.
Figure 50:
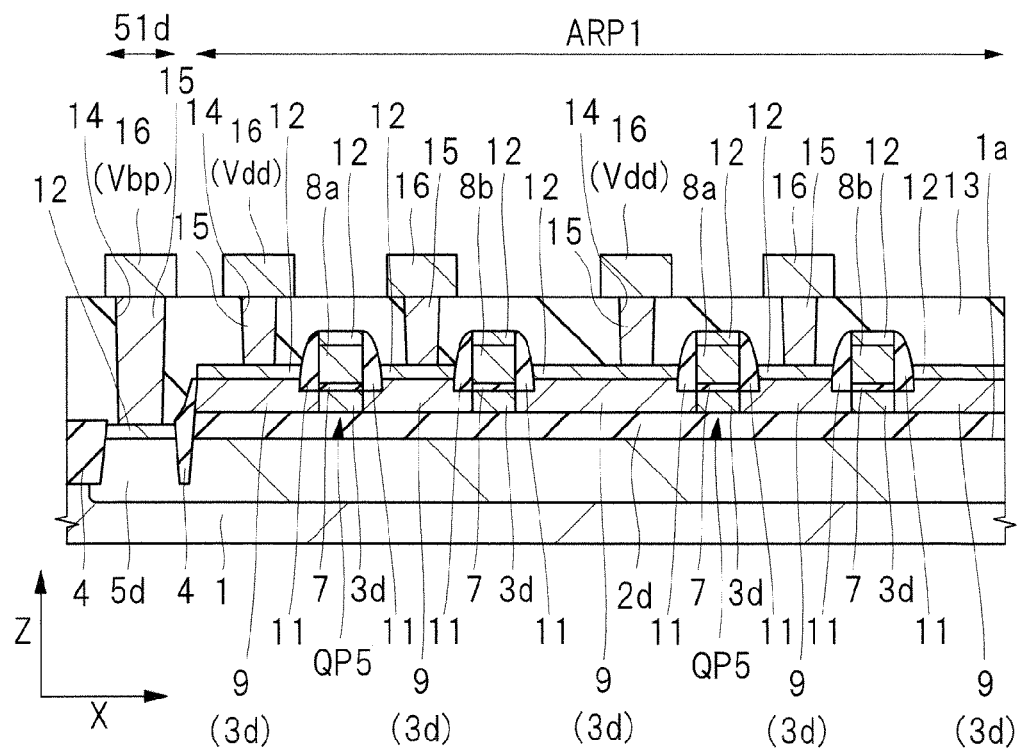
FIG. 50 is a sectional view of a semiconductor integrated circuit device constituting a part of the speed monitor circuit including an inverter circuit shown in FIG. 38.
Figure 51:
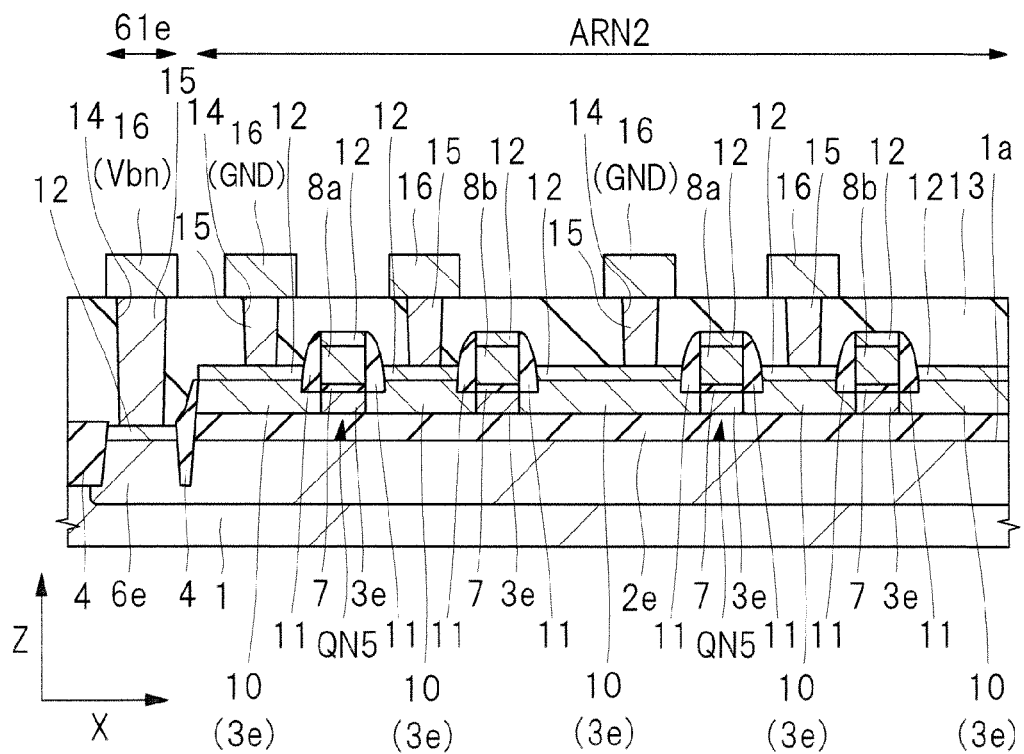
FIG. 51 is a sectional view of a semiconductor integrated circuit device constituting a part of the speed monitor circuit including an inverter circuit shown in FIG. 38.

FIG. 49 is a plan view of a semiconductor integrated circuit device constituting a part of a speed monitor circuit including an inverter circuit. FIGS. 50 and 51 are sectional views of the semiconductor integrated circuit device constituting a part of the speed monitor circuit including an inverter circuit shown in FIG. 38. FIG. 50 is a sectional view taken along the line E1-E1 of FIG. 49, and FIG. 51 is a sectional view taken along the line D2-D2 of FIG. 49. Note that FIG. 49 shows a transparent state obtained by removing the interlayer insulating film 13, the silicide layer 12 and the sidewall spacer 11. Also, in FIGS. 49 to 51, two directions which are in parallel with the surface 1a serving as the main surface of the support substrate 1 and orthogonal to each other are defined as the X-axis direction and the Y-axis direction, and a direction perpendicular to the surface 1a of the support substrate 1 is defined as the Z-axis direction.

In the area ARP1, the p-channel type MISFET QP5 is formed on the support substrate 1, that is, on the SOI layer 3d, and in the area ARN2, the n-channel type MISFET QN5 is formed on the support substrate 1, that is, on the SOI layer 3e.

As shown in FIGS. 49 to 51, on each of the SOI layer 3d and the SOI layer 3e, the gate electrode 8a and the dummy gate electrode 8b are formed, with the gate insulating film 7 interposed therebetween. As shown in FIG. 49, the gate electrode 8a and the dummy gate electrode 8b respectively extend in the Y-axis direction when seen in the plan view.

As shown in FIG. 50, in the area ARP1, the p-type semiconductor region 9 is formed in the SOI layer 3d on the both sides of the gate electrode 8a and in the SOI layer 3d on the both sides of the dummy gate electrode 8b. Moreover, in the area ARP2, the p-type semiconductor region 9 is formed on the SOI layer 3f.

As shown in FIG. 51, in the area ARN2, the n-type semiconductor region 10 is formed in the SOI layer 3e on the both sides of the gate electrode 8a and in the SOI layer 3e on the both sides of the dummy gate electrode 8b. Moreover, in the area ARN1, the n-type semiconductor region 10 is formed on the SOI layer 3c.

The sidewall spacer 11 is formed on the side wall of the gate electrode 8a and the side wall of the dummy gate electrode 8b. Also, on the support substrate 1 including the surfaces of the gate electrode 8a, the dummy gate electrode 8b, the sidewall spacer 11, the p-type semiconductor region 9 and the n-type semiconductor region 10, the interlayer insulating film 13 is formed.

As shown in FIG. 50, in the area ARP1, the contact hole 14 which penetrates the interlayer insulating film 13 to reach the surface of any one of the n-type well 5d, the gate electrode 8a and the p-type semiconductor region 9 is formed in the interlayer insulating film 13. Inside the contact hole 14, the plug 15 is formed. The plug 15 is electrically connected to any one of the n-type well 5d, the gate electrode 8a and the p-type semiconductor region 9, which are exposed on the bottom portion of the contact hole 14, through the silicide layer 12. Note that, in FIG. 50, illustrations of the contact hole which reaches the surface of the gate electrode 8a and the plug connected to the gate electrode 8a are omitted.

As shown in FIG. 51, in the area ARN2, the contact hole 14 which penetrates the interlayer insulating film 13 to reach the surface of any one of the p-type well 6e, the gate electrode 8a and the n-type semiconductor region 10 is formed in the interlayer insulating film 13. Inside the contact hole 14, the plug 15 is formed. The plug 15 is electrically connected to any one of the p-type well 6e, the gate electrode 8a and the n-type semiconductor region 10, which are exposed on the bottom portion of the contact hole 14, through the silicide layer 12. Note that, in FIG. 51, illustrations of the contact hole which reaches the surface of the gate electrode 8a and the plug connected to the gate electrode 8a are omitted.

On the interlayer insulating film 13, the first layer wire 16 electrically connected to the plug 15 is formed. Moreover, although not shown, wires in a plurality of layers can be formed on the first layer wire 16.

As shown in FIGS. 49 to 51, in the area ARP1, the p-channel type MISFET QP5 which is made up of the SOI layer 3d, the gate insulating film 7, the gate electrode 8a and the p-type semiconductor region 9 is formed. Also, in the area ARN2, the n-channel type MISFET QN5 which is made up of the SOI layer 3e, the gate insulating film 7, the gate electrode 8a and the n-type semiconductor region 10 is formed.

More specifically, the speed monitor circuit DC5 including the inverter circuit DC11 is formed in the two areas composed of the area ARP1 and the area ARN2 among the four areas composed of the area ARM, the area ARP1, the area ARN2 and the area ARP2. This configuration is the same not only in the case where the speed monitor circuit DC5 including the inverter circuit DC11 is formed on the SOI substrate, but also in the case where the main circuit MC4 including the inverter circuit is formed on the SOI substrate.

Note that a speed monitor circuit including an XOR circuit in place of the inverter circuit can be formed in the two areas composed of the area ARP1 and the area ARN2 among the four areas composed of the area ARN1, the area ARP1, the area ARN2 and the area ARP2. Further, not only the speed monitor circuit including the XOR circuit can be formed on the SOI substrate, but also the main circuit including the XOR circuit can be formed on the SOI substrate.

As shown in FIG. 49, the first layer wire 16 for inputting the voltage Vin to the gate electrode 8a of the MISFET QP5 and the gate electrode 8a of the MISFET QN5 is formed. Also, the first layer wire for connecting the power supply voltage Vdd to the p-type semiconductor region 9 serving as the source electrode of the MISFET QP5 is formed. Furthermore, the first layer wire 16 for connecting the ground potential GND to the n-type semiconductor region 10 serving as the source electrode of the MISFET QN5 is formed. Moreover, the first layer wire 16 for outputting the voltage Vout from the p-type semiconductor region 9 serving as the drain electrode of the MISFET QP5 and the n-type semiconductor region 10 serving as the drain electrode of the MISFET QN5 is formed.

By the first layer wire 16 electrically connected to the n-type well 5d through the plug 15, the substrate bias Vbp is applied to the n-type well 5d. Also, by the first layer wire 16 electrically connected to the p-type well 6e through the plug 15, the substrate bias Vbn is applied to the p-type well 6e.

With this configuration, the substrate bias Vbp can be applied to the n-type well 5d electrically insulated from the SOI layer 3d, and the substrate bias Vbn can be applied to the p-type well 6e electrically insulated from the SOI layer 3e. Thus, voltage values of the respective substrate bias Vbp and substrate bias Vbn can be adjusted in a wide range. Therefore, the substrate bias to be applied to the MISFETs constituting the main circuit MC4 can be controlled with high precision so that the delay time of the main circuit MC4 becomes a target time.

Note that, on the SOI substrate, the speed monitor circuit DC41 including the NAND circuit DC411 formed in the area ARP1, the area ARN2 and the area ARP2 and the speed monitor circuit DC5 including the inverter circuit DC11 formed in the area ARP1 and the area ARN2 can be disposed next to each other in the X-axis direction. Alternatively, on the SOI substrate, the speed monitor circuit DC42 including the NOR circuit DC421 formed in the area ARP1, the area ARN2 and the area ARP2 and the speed monitor circuit DC5 including the inverter circuit DC11 formed in the area ARP1 and the area ARN2 can be disposed next to each other in the X-axis direction.

<Control Method of Substrate Bias for NAND Circuit>

Next, a control method of a substrate bias in the semiconductor integrated circuit device of the fifth embodiment will be described.

Figure 52:
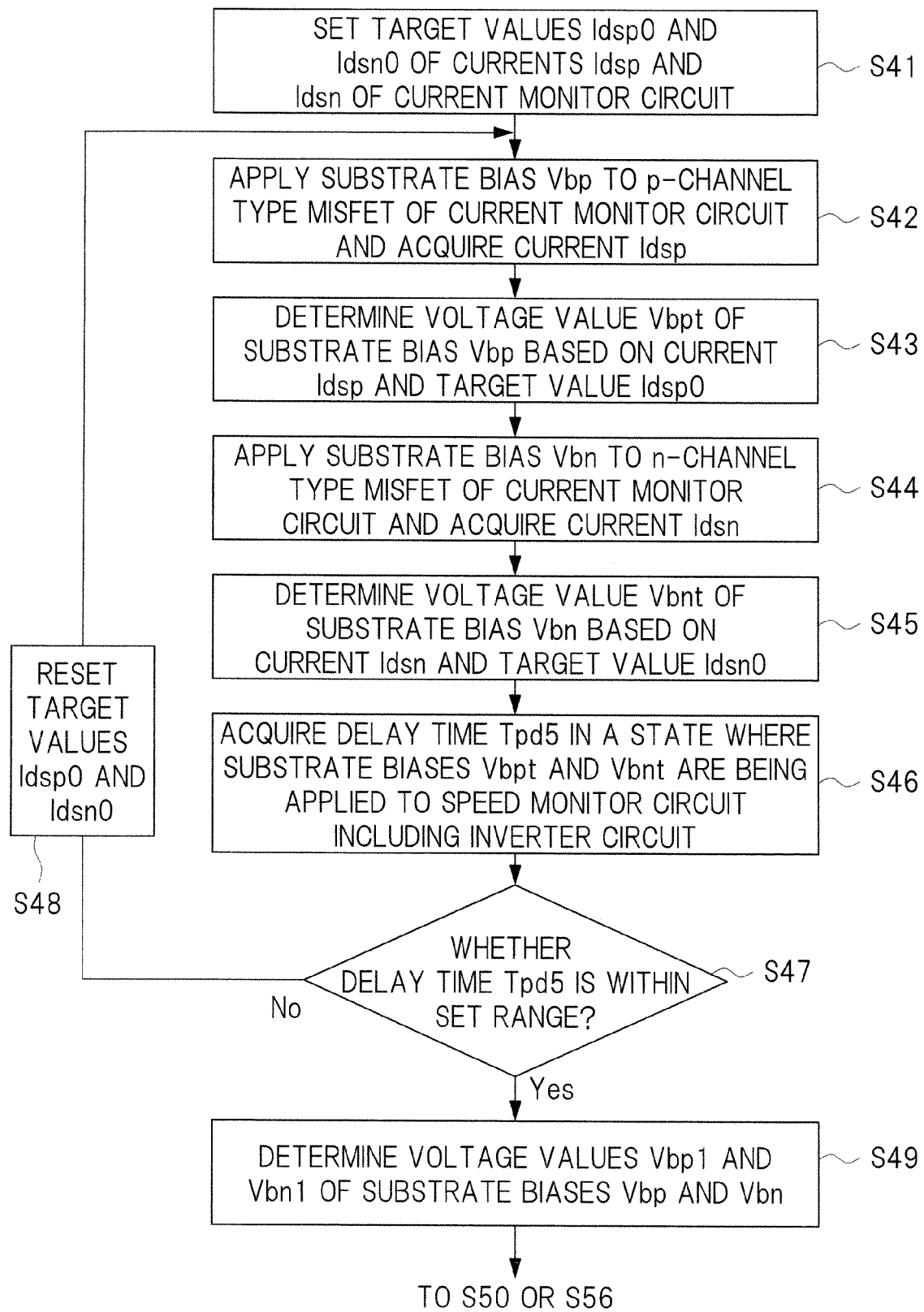
FIG. 52 is a flowchart showing a part of a process for controlling a substrate bias to be applied to the main circuit in the semiconductor integrated circuit device of the fifth embodiment.
Figure 53:
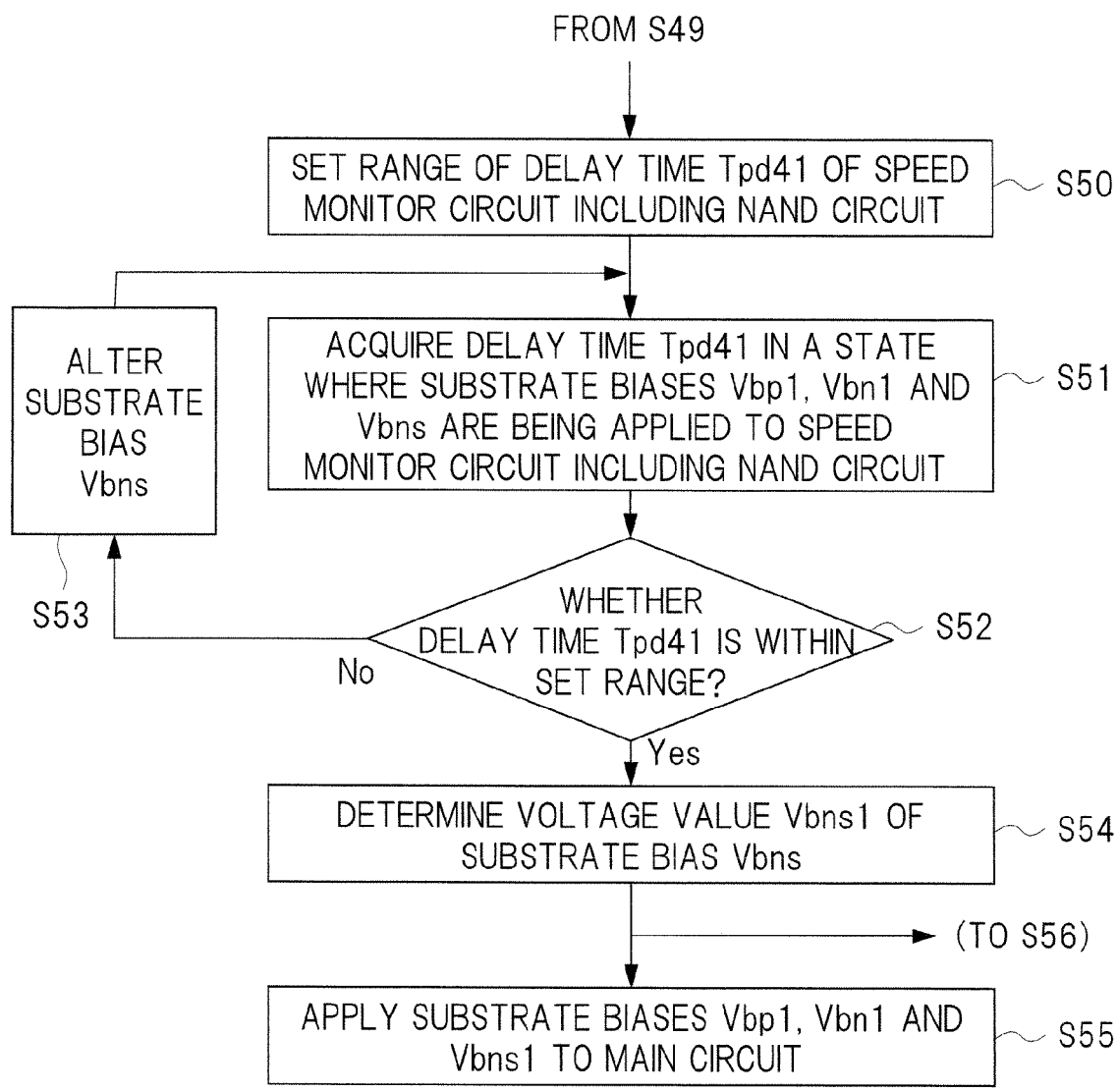
FIG. 53 is a flowchart showing a part of a process for controlling a substrate bias to be applied to the main circuit in the semiconductor integrated circuit device of the fifth embodiment.

First, an example in which the main circuit is a NAND circuit will be described. FIG. 52 and FIG. 53 are flowcharts showing a part of a process for controlling a substrate bias to be applied to a main circuit of the semiconductor integrated circuit device of the fifth embodiment.

The substrate bias control circuit CC4 first sets a target value Idsp0 of the current Idsp of the current monitor circuit CM4, and then sets a target value Idsn0 of the current Idsn of the current monitor circuit CM4 (step S41 of FIG. 52).

In this step S41, the target value Idsp0 of the current Idsp flowing through the MISFET QP6 of the current monitor circuit CM11 (see FIG. 5) serving as the current monitor circuit CM4 is set, and the target value Idsn0 of the current Idsn flowing through the MISFET QN6 of the current monitor circuit CM12 (see FIG. 6) serving as the current monitor circuit CM4 is set. As the method of setting the target value Idsp0 and the target value Idsn0, the target value Idsp0 and the target value Idsn0 can be set so as to achieve a balance between the target value Idsp0 and the target value Idsn0, that is, so that a ratio between the target value Idsp0 and the target value Idsn0 falls within a preset range. For example, the target value Idsp0 and the target value Idsn0 are set so that the ratio between the target value Idsp0 and the target value Idsn0 becomes a predetermined ratio.

Next, the substrate bias control circuit CC4 applies the substrate bias Vbp to the p-channel type MISFET QP6 of the current monitor circuit CM11 and acquires the current Idsp (step S42 of FIG. 52). Then, based on the acquired current Idsp and the target value Idsp0, the voltage value Vbpt of the substrate bias Vbp is determined (step S43 of FIG. 52).

In these step S42 and step S43, the substrate bias control circuit CC4 makes the substrate bias generating circuit GC4 generate the substrate bias Vbp and apply it to the p-channel type MISFET QP6 of the current monitor circuit CM11. Moreover, the substrate bias control circuit CC4 acquires the current Idsp flowing through the p-channel type MISFET QP6 in a state where the substrate bias Vbp is being applied thereto, by using the current monitor circuit CM11. Then, the substrate bias control circuit CC4 determines the voltage value Vbpt so that the acquired current Idsp becomes the target value Idsp0. Specifically, the current Idsp is repeatedly acquired while altering the substrate bias Vbp, and when the acquired current Idsp is within a range set in accordance with the target value Idsp0, that is, within the set range, the substrate bias voltage Vbp at this time is determined as the voltage value Vbpt.

Next, the substrate bias control circuit CC4 applies the substrate bias Vbn to the n-channel type MISFET QN6 of the current monitor circuit CM12 and acquires the current Idsn (step S44 of FIG. 52). Then, based on the acquired current Idsn and the target value Idsn0, the voltage value Vbnt of the substrate bias Vbn is determined (step S45 of FIG. 52).

In these step S44 and step S45, the substrate bias control circuit CC4 makes the substrate bias generating circuit GC4 generate the substrate bias Vbn and apply it to the n-channel type MISFET QN6 of the current monitor circuit CM12. Moreover, the substrate bias control circuit CC4 acquires the current Idsn flowing through the n-channel type MISFET QN6 in a state where the substrate bias Vbn is being applied thereto, by using the current monitor circuit CM12. Furthermore, the substrate bias control circuit CC4 determines the voltage value Vbnt so that the acquired current Idsn becomes the target value Idsn0. Specifically, the current Idsn is repeatedly acquired while altering the substrate bias Vbn, and when the acquired current Idsn is within a range set in accordance with the target value Idsn0, that is, within the set range, the substrate bias voltage Vbn at this time is determined as the voltage value Vbnt.

Next, the substrate bias control circuit CC4 acquires the delay time Tpd5 (step S46 of FIG. 52) in a state where the substrate bias voltage Vbpt and the substrate bias voltage Vbnt are being applied to the speed monitor circuit DC5 (see FIG. 38) including the inverter circuit DC11.

In this step S46, the substrate bias control circuit CC4 makes the substrate bias generating circuit GC4 generate the substrate bias Vbp set to the voltage value Vbpt, that is, the substrate bias Vbpt and apply it to the MISFET QP5 of the speed monitor circuit DC5 including the inverter circuit DC11. Moreover, in step S46, the substrate bias control circuit CC4 makes the substrate bias generating circuit GC4 generate the substrate bias Vbn set to the voltage value Vbnt, that is, the substrate bias Vbnt and apply it to the MISFET QN5 of the speed monitor circuit DC5 including the inverter circuit DC11. Furthermore, in step S46, the substrate bias control circuit CC4 acquires the delay time Tpd5 of the speed monitor circuit DC5 in a state where the substrate bias Vbpt is being applied to MISFET QP5 and the substrate bias Vbnt is being applied to the MISFET QN5.

Next, it is determined whether the acquired delay time Tpd5 is within the set range (step S47 of FIG. 52).

In this step S47, it is determined whether the acquired delay time Tpd5 of the speed monitor circuit DC5 is within a range set in accordance with the target time Tpd50 of the delay time Tpd5, that is, within a set range. Then, when the delay time Tpd5 is not within the set range as a result of the determination of step S47, the target value Idsp0 and the target value Idsn0 are reset (step S48 of FIG. 52). Then, after the step S48, the flow returns to step S42, and steps S42 to S47 are carried out.

As the method of resetting the target value Idsp0 and the target value Idsn0, the target value Idsp0 and the target value Idsn0 can be reset so as to alter the ratio between the target value Idsp0 and the target value Idsn0 while keeping the sum of the target value Idsp0 and the target value Idsn0 constant. Alternatively, the target value Idsp0 and the target value Idsn0 can be reset by using various methods such as altering only one of the target value Idsp0 and the target value Idsn0.

Meanwhile, when the delay time Tpd5 is within the set range as a result of the determination of step S47, the voltage value Vbp1 and the voltage value Vbn1 are determined (step S49 of FIG. 52). In this step S49, the substrate bias Vbpt at the time when the delay time Tpd5 is within the set range is determined as the voltage value Vbp1, and the substrate bias Vbnt at the time when the delay time Tpd5 is within the set range is determined as the voltage value Vbn1.

More specifically, in steps S41 to S49, the determination of the voltage value Vbpt (step S43), the determination of the voltage value Vbnt (step S45) and the acquisition of the delay time Tpd5 (step S46) are repeated, while altering the target value Idsp0 and the target value Idsn0. Then, in the case where the acquired delay time Tpd5 is within the set range determined in accordance with the target time Tpd50, the voltage value Vbpt is determined as the voltage value Vbp1 of the substrate bias Vbp, and the voltage value Vbnt is determined as the voltage value Vbn1 of the substrate bias Vbn. In other words, the substrate bias control circuit CC4 determines the voltage value Vbp1 and the voltage value Vbn1 based on the acquired delay time Tpd5.

Next, the substrate bias control circuit CC4 sets the range of the delay time Tpd41 of the speed monitor circuit DC41 (see FIG. 36) including the NAND circuit DC411 (step S50 of FIG. 53). In this step S50, the substrate bias control circuit CC4 sets the target time Tpd410 of the delay time Tpd41 of the speed monitor circuit DC41, and also sets the range set in accordance with the set target time Tpd410, that is, the set range.

Next, the substrate bias control circuit CC4 acquires the delay time Tpd41 in a state where the substrate bias Vbp1, the substrate bias Vbn1 and the substrate bias Vbns are being applied to the speed monitor circuit DC41 including the NAND circuit DC411 (step S51 of FIG. 53).

In this step S51, the substrate bias control circuit CC4 makes the substrate bias generating circuit GC4 generate the substrate bias Vbp set to the voltage value Vbp1, that is, the substrate bias Vbp1 and apply it to the p-channel type MISFET QP41 and the p-channel type MISFET QP42 of the NAND circuit DC411. Moreover, in step S51, the substrate bias control circuit CC4 makes the substrate bias generating circuit GC4 generate the substrate bias Vbn set to the voltage value Vbn1, that is, the substrate bias Vbn1 and apply it to the n-channel type MISFET QN41 of the NAND circuit DC411. Furthermore, in step S51, the substrate bias control circuit CC4 makes the substrate bias generating circuit GC4 generate the substrate bias Vbns and apply it to the n-channel type MISFET QN42 of the NAND circuit DC411. Then, the substrate bias control circuit CC4 acquires the delay time Tpd41 of the speed monitor circuit DC41 in a state where the substrate bias Vbp1 is being applied to the MISFET QP41 and the MISFET QP42, the substrate bias Vbn1 is being applied to the MISFET QN41 and the substrate bias Vbns is being applied to the MISFET QN42.

Next, the substrate bias control circuit CC4 determines whether the delay time Tpd41 is within the set range (step S52 of FIG. 53).

In this step S52, it is determined whether the acquired delay time Tpd41 of the speed monitor circuit DC41 is within a range set in accordance with the target time Tpd410 of the delay time Tpd41, that is, the set range. Then, when the delay time Tpd41 is not within the set range as a result of the determination in step S52, the substrate bias Vbns is altered (step S53 of FIG. 52). After this step S53, step S51 is carried out again.

On the other hand, when the delay time Tpd41 is within the set range as a result of the determination of step S52, the voltage value Vbns1 of the substrate bias Vbns is determined (step S54 of FIG. 52). In this step S54, the substrate bias Vbns at the time when the delay time Tpd41 is within the set range is determined as the voltage value Vbns1.

More specifically, in steps S50 to S54, the substrate bias control circuit CC4 repeats the acquisition of the delay time Tpd41, while altering the substrate bias Vbns, and when the acquired delay time Tpd41 is within the set range determined in accordance with the target time Tpd410, the substrate bias Vbns at this time is determined as the voltage value Vbns1. In other words, in steps S50 to S54, the substrate bias control circuit CC4 determines the voltage value Vbns1 so that the delay time Tpd41 becomes the target time Tpd410. At this time, the substrate bias control circuit CC4 determines the voltage value Vbns1 based on the acquired delay time Tpd41.

Next, the substrate bias control circuit CC4 applies the substrate bias Vbp1, the substrate bias Vbn1 and the substrate bias Vbns1 to the main circuit MC4 (step S55 of FIG. 53). In this step S55, the substrate bias control circuit CC4 makes the substrate bias generating circuit GC4 generate the substrate bias Vbp set to the voltage value Vbp1, that is, the substrate bias Vbp1 and apply it to the p-channel type MISFET QP1 and the p-channel type MISFET QP2 of the main circuit MC4. Moreover, in step S55, the substrate bias control circuit CC4 makes the substrate bias generating circuit GC4 generate the substrate bias Vbn set to the voltage value Vbn1, that is, the substrate bias Vbn1 and apply it to the n-channel type MISFET QN1 of the main circuit MC4. Furthermore, in step S55, the substrate bias control circuit CC4 makes the substrate bias generating circuit GC4 generate the substrate bias Vbns set to the voltage value Vbns1, that is, the substrate bias Vbns1 and apply it to the n-channel type MISFET QN2 of the main circuit MC4.

In this control method, of the MISFET QN1 and the MISFET QN2 connected in series with each other, the voltage value of the substrate bias Vbn to be applied to the MISFET QN1 and the voltage value of the substrate bias Vbns to be applied to the MISFET QN2 can be separately adjusted and determined separately. For this reason, in comparison with the case in which the voltage value of the substrate bias Vbn and the voltage value of the substrate bias Vbns are not adjusted separately, the substrate bias to be applied to the MISFET constituting the main circuit MC4 can be controlled with higher precision so that the delay time of the main circuit MC4 becomes the target time.

<Control Method of Substrate Bias for NOR Circuit>

Figure 54:
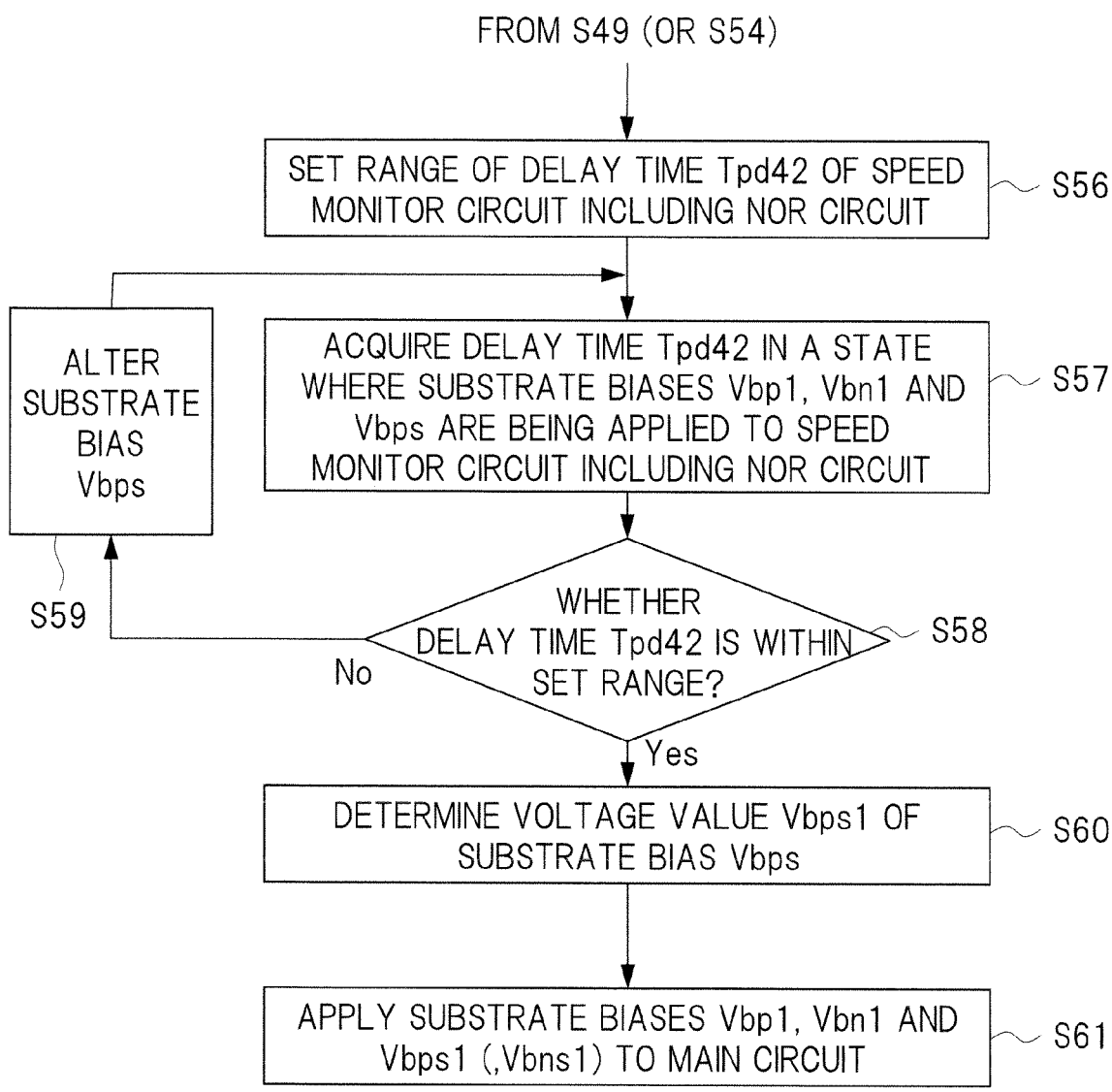
FIG. 54 is a flowchart showing a part of a process for controlling a substrate bias to be applied to the main circuit in the semiconductor integrated circuit device of the fifth embodiment.

Next, an example in which the main circuit is a NOR circuit will be described. FIG. 54 is a flowchart showing a part of a process for controlling a substrate bias to be applied to a main circuit of the semiconductor integrated circuit device of the fifth embodiment.

First, in the same manner as the case where the main circuit is a NAND circuit, steps S41 to S49 of FIG. 52 are carried out.

Next, the substrate bias control circuit CC4 sets the range of the delay time Tpd42 of the speed monitor circuit DC42 (see FIG. 37) including the NOR circuit DC421 (step S56 of FIG. 54). In this step S56, the substrate bias control circuit CC4 sets the target time Tpd420 of the delay time Tpd42 of the speed monitor circuit DC42, and also sets the range set in accordance with the set target time Tpd420, that is, a set range.

Next, the substrate bias control circuit CC4 acquires the delay time Tpd42 in a state where the substrate bias Vbp1, the substrate bias Vbn1 and the substrate bias Vbps are being applied to the speed monitor circuit DC42 including the NOR circuit DC421 (step S57 of FIG. 54).

In this step S57, the substrate bias control circuit CC4 makes the substrate bias generating circuit GC4 generate the substrate bias Vbp set to the voltage value Vbp1, that is, the substrate bias Vbp1 and apply it to the p-channel type MISFET QP43 of the NOR circuit DC421. Moreover, in step S57, the substrate bias control circuit CC4 makes the substrate bias generating circuit GC4 generate the substrate bias Vbn set to the voltage value Vbn1, that is, the substrate bias Vbn1 and apply it to the n-channel type MISFET QN43 and the n-channel type MISFET QN44 of the NOR circuit DC421. Furthermore, in step S57, the substrate bias control circuit CC4 makes the substrate bias generating circuit GC4 generate the substrate bias Vbps and apply it to the p-channel type MISFET QP44 of the NOR circuit DC421. Then, the delay time Tpd42 of the speed monitor circuit DC42 in a state where the substrate bias Vbp1 is being applied to the MISFET QP43, the substrate bias Vbn1 is being applied to the MISFET QN43 and the MISFET QN44, and the substrate bias Vbps is being applied to the MISFET QP44 is acquired.

Next, the substrate bias control circuit CC4 determines whether the delay time Tpd42 is within the set range (step S58 of FIG. 54).

In this step S58, it is determined whether the acquired delay time Tpd42 of the speed monitor circuit DC42 is within a range set in accordance with the target time Tpd420 of the delay time Tpd42, that is, the set range. Then, when the delay time Tpd42 is not within the set range as a result of the determination in step S58, the substrate bias Vbps is altered (step S59 of FIG. 54). After this step S59, step S57 is carried out again.

On the other hand, when the delay time Tpd42 is within the set range as a result of the determination of step S58, the voltage value Vbps1 of the substrate bias Vbps is determined (step S60 of FIG. 54). In this step S60, the substrate bias Vbps at the time when the delay time Tpd42 is within the set range is determined as the voltage value Vbps1.

More specifically, in steps S56 to S60, the substrate bias control circuit CC4 repeats the acquisition of the delay time Tpd42, while altering the substrate bias Vbps, and when the acquired delay time Tpd42 is within the set range determined in accordance with the target time Tpd420, the substrate bias Vbps at this time is determined as the voltage value Vbps1. In other words, in steps S56 to S60, the substrate bias control circuit CC4 determines the voltage value Vbps1 so that the delay time Tpd42 becomes the target time Tpd420. At this time, the substrate bias control circuit CC4 determines the voltage value Vbps1 based on the acquired delay time Tpd42.

Next, the substrate bias control circuit CC4 applies the substrate bias Vbp1, the substrate bias Vbn1 and the substrate bias Vbps1 to the main circuit MC4 (step S61 of FIG. 54). In this step S61, the substrate bias control circuit CC4 makes the substrate bias generating circuit GC4 generate the substrate bias Vbp set to the voltage value Vbp1, that is, the substrate bias Vbp1 and apply it to the p-channel type MISFET QP3 of the main circuit MC4. Moreover, in step S61, the substrate bias control circuit CC4 makes the substrate bias generating circuit GC4 generate the substrate bias Vbn set to the voltage value Vbn1, that is, the substrate bias Vbn1 and apply it to the n-channel type MISFET QN3 and the n-channel type MISFET QN4 of the main circuit MC4. Furthermore, in step S61, the substrate bias control circuit CC4 makes the substrate bias generating circuit GC4 generate the substrate bias Vbps set to the voltage value Vbps1, that is, the substrate bias Vbps1 and apply it to the p-channel type MISFET QP4 of the main circuit MC4.

In this control method, of the MISFET QP3 and the MISFET QP4 connected in series with each other, the voltage value of the substrate bias Vbp to be applied to the MISFET QP3 and the voltage value of the substrate bias Vbps to be applied to the MISFET QP4 can be separately adjusted and determined separately. For this reason, in comparison with the case in which the voltage value of the substrate bias Vbp and the voltage value of the substrate bias Vbps are not adjusted separately, the substrate bias to be applied to the MISFET constituting the main circuit MC4 can be controlled with higher precision so that the delay time of the main circuit MC4 becomes the target time.

Note that, when the main circuit includes a NAND circuit and a NOR circuit, by carrying out steps S41 to S49 of FIG. 52, carrying out steps 950 to S54 of FIG. 53 and then carrying out steps S56 to S61 of FIG. 54, the main circuit including the NAND circuit and the NOR circuit can be controlled. At this time, in step S61 of FIG. 54, the substrate bias control circuit CC4 executes control so as to apply the substrate bias Vbp1, the substrate bias Vbn1, the substrate bias Vbps1 and the substrate bias Vbns1 to the main circuit MC4. Alternatively, after steps S41 to S49 of FIG. 52 are carried out, steps S56 to S60 of FIG. 54 are carried out, and then steps S50 to S54 of FIG. 53 are carried out, step S61 of FIG. 54 may be carried out.

<Planar Configuration of SOI Substrate in Comparative Example>

Next, a planar configuration of an SOI substrate on which the semiconductor integrated circuit device of a comparative example is formed will be described.

Figure 55:
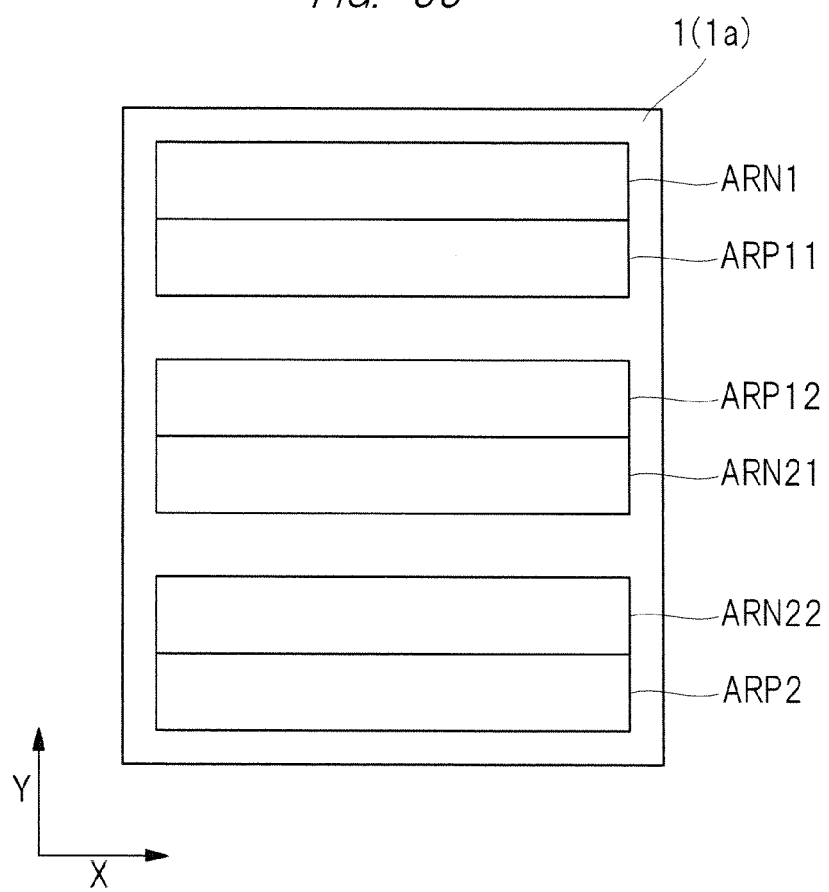
FIG. 55 is a plan view schematically showing a configuration of an SOI substrate in a comparative example.
Figure 56:
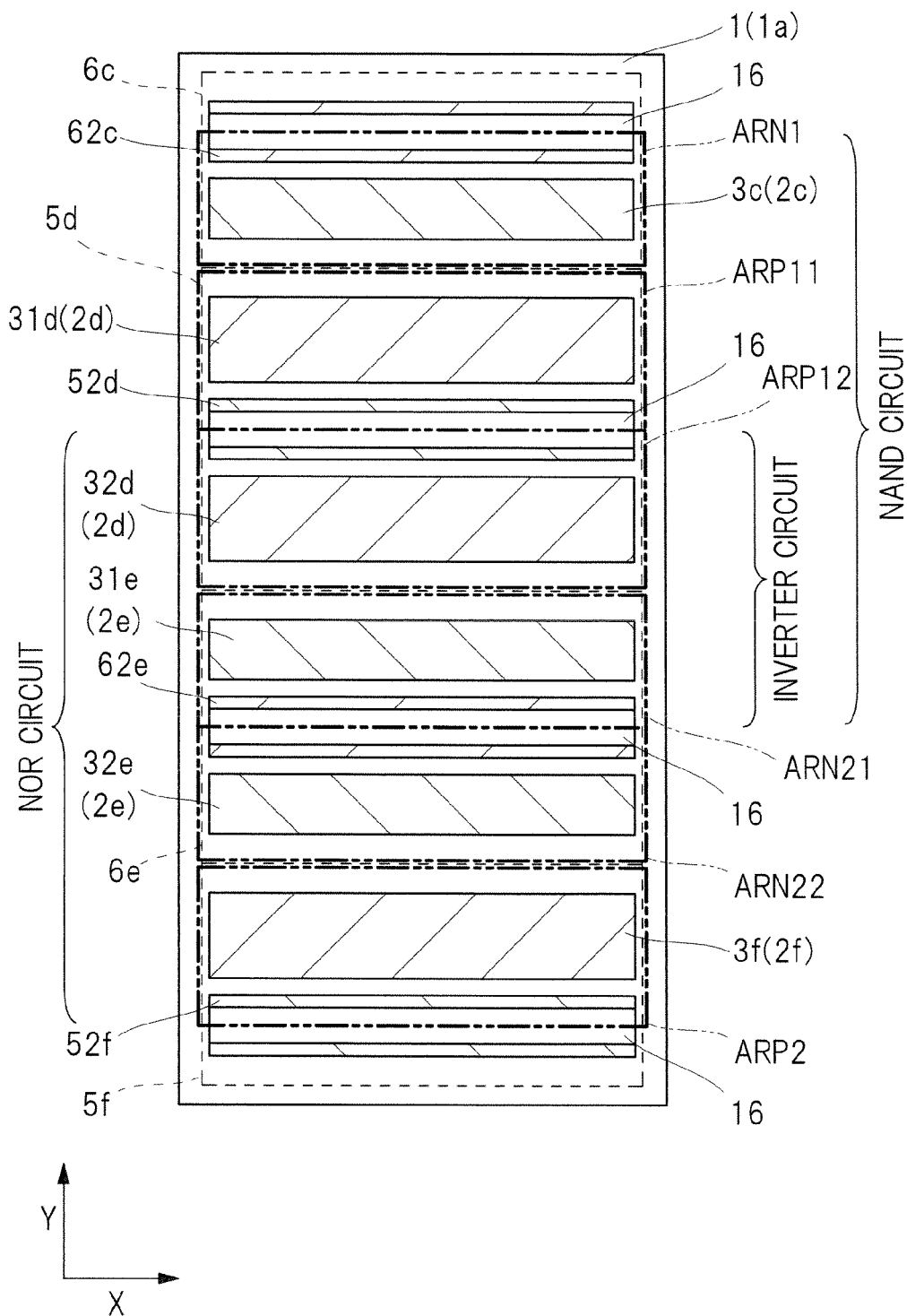
FIG. 56 is a plan view schematically showing a configuration of an SOI substrate in a comparative example.

FIG. 55 and FIG. 56 are plan views schematically showing the configuration of the SOI substrate in the comparative example. FIG. 55 shows the arrangement of six areas, and FIG. 56 shows the arrangement of the SOI substrates and the like in each area. Moreover, FIG. 56 shows the first layer wire 16.

In FIGS. 55 and 56, two directions which are in parallel with the surface 1a serving as the main surface of the support substrate 1 and orthogonal to each other are defined as the X-axis direction and the Y-axis direction.

As shown in FIG. 55 and FIG. 56, in the comparative example, the SOI substrate has the support substrate 1, an area ARN1, an area ARP11, an area ARP12, an area ARN21, an area ARN22 and an area ARP2 corresponding to six areas formed on the surface 1a side of the support substrate 1. The area ARN1, the area ARP11, the area ARP12, the area ARN21, the area ARN22 and the area ARP2 respectively extend in the X-axis direction when seen in a plan view. Moreover, the area ARN1, the area ARP11, the area ARP12, the area ARN21, the area ARN22 and the area ARP2 are arranged in the Y-axis direction in the order of the area ARN1, the area ARP11, the area ARP12, the area ARN21, the area ARN22 and the area ARP2. The areas ARN1, ARN21 and ARN22 are areas in which n-channel type MISFETs are formed. The areas ARP11, ARP12 and ARP2 are areas in which p-channel type MISFETs are formed.

In the area ARN1, on the surface 1a side of the support substrate 1, a p-type well 6c is formed. In the area ARP11 and the area ARP12, on the surface 1a side of the support substrate 1, an n-type well 5d is formed. In the area ARN21 and area ARN22, on the surface 1a side of the support substrate 1, a p-type well 6e is formed. In the area ARP2, on the surface 1a side of the support substrate 1, an n-type well 5f is formed.

In the area ARN1, an SOI layer 3c is formed on the p-type well 6c, with a BOX layer 2c interposed therebetween. In the area ARP11, an SOI layer 31d is formed on the n-type well 5d, with a BOX layer 2d interposed therebetween, and in the area ARP12, an SOI layer 32d is formed on the n-type well 5d, with the BOX layer 2d interposed therebetween. In the area ARN21, an SOI layer 31e is formed on the p-type well 6e, with the BOX layer 2e interposed therebetween, and in the area ARN22, an SOI layer 32e is formed on the p-type well 6e, with the BOX layer 2e interposed therebetween. In the area ARP2, an SOI layer 3f is formed on the n-type well 5f, with a BOX layer 2f interposed therebetween.

The SOI layer 3c, SOI layer 31d, SOI layer 32d, SOI layer 31e, SOI layer 32e and SOI layer 3f respectively extend in the X-axis direction in the surface 1a of the support substrate 1. Moreover, the SOI layer 3c, SOI layer 31d, SOI layer 32d, SOI layer 31e, SOI layer 32e and SOI layer 3f are respectively arranged in the Y-axis direction in the surface 1a of the support substrate 1 in the order of the SOT layer 3c, the SOI layer 31d, the SOI layer 32d, the SOI layer 31e, the SOI layer 32e and the SOI layer 3f.

A portion of the n-type well 5d located between the SOI layer 31d and the SOI layer 32d is exposed, and this area 52d in which the n-type well 5d is exposed is an area which is referred to as a tap, in which a plug (not shown) which is electrically connected to the n-type well 5d is formed. Similarly, an area 52f corresponding to a portion of the n-type well 5f located on the side of the SOI layer 3f opposite to the SOI layer 32e is also exposed.

A portion of the p-type well 6e located between the SOI layer 31e and the SOI layer 32e is exposed, and this area 62e in which the p-type well 6e is exposed is an area which is referred to as a tap, in which a plug (not shown) which is electrically connected to the p-type well 6e is formed. Similarly, an area 62c corresponding to a portion of the p-type well 6c located on the side of the SOI layer 3c opposite to the SOI layer 31d is also exposed.

In the comparative example, the NAND circuit is formed in the four areas composed of the area ARN1, the area ARP11, the area ARP12 and the area ARN21 among the six areas composed of the area ARN1, the area ARP11, the area ARP12, the area ARN21, the area ARN22 and the area ARP2. At this time, different substrate biases are respectively applied to the MISFET QN1 (see FIG. 34) formed in the area ARN21 and the MISFET QN2 (see FIG. 34) formed in the area ARN1.

In the comparative example, the NOR circuit is formed in the four areas composed of the area ARP12, the area ARN21, the area ARN22 and the area ARP2 among the six areas composed of the area ARN1, the area ARP11, the area ARP12, the area ARN21, the area ARN22 and the area ARP2. Also, different substrate biases are respectively applied to the MISFET QP3 (see FIG. 35) formed in the area ARP12 and the MISFET QP4 (see FIG. 35) formed in the area ARP2.

Furthermore, in the comparative example, the inverter circuit is formed in the two areas composed of the area ARP12 and the area ARN21 among the six areas composed of the area ARN1, the area ARP11, the area ARP12, the area ARN21, the area ARN22 and the area ARP2.

Here, considerations are given to the case where the main circuit includes the NAND circuit, the NOR circuit and the inverter circuit and different substrate biases are respectively applied to two MISFETs of the same channel type which are included in the NAND circuit and the NOR circuit and connected in series with each other. Also, considerations are given also to the case where six areas composed of three areas which extend in the X-axis direction and in which n-channel type MISFETs are formed and three areas which extend in the X-axis direction and in which p-channel type MISFETs are formed are arranged in the manner as described in the comparative example.

At this time, in the areas in which the NAND circuit is formed, two areas composed of the area ARN22 and the area ARP2 are empty areas in which nothing is formed, and in the areas in which the NOR circuit is formed, two areas composed of the area ARN1 and the area ARP11 are empty areas in which nothing is formed. Moreover, in areas in which the inverter circuit is formed, four areas composed of the area ARN1, the area ARP11, the area ARN22 and the area ARP2 are empty areas in which nothing is formed. Therefore, it is not possible to reduce the area of the semiconductor integrated circuit device.

<Main Characteristics and Effects of Present Embodiment>

The semiconductor integrated circuit device of the fifth embodiment has four semiconductor regions which are formed on the surface 1a side of the support substrate 1 of an SOI substrate, respectively extend in the X-axis direction in the surface 1a of the support substrate 1, and are arranged in the Y-axis direction. As the four semiconductor regions, the p-type well 6c, the n-type well 5d, the p-type well 6e and the n-type well 5f are arranged in this order. On the p-type well 6c, the n-type well 5d, the p-type well 6e and the n-type well 5f, SOI layers are respectively formed, with BOX layers interposed therebetween.

Moreover, for example, on the SOI layer 3d on the n-type well 5d, a p-channel type MISFET is formed, and on the SOI layer 3c on the p-type well 6c or the SOI layer 3e on the p-type well 6e, an n-channel type MISFET is formed. Thus, even in the case where the NAND circuit is included in the main circuit, respective voltage values of substrate bias voltages to be applied to the two n-channel type MISFETs connected in series with each other in the NAND circuit can be separately adjusted and determined separately.

Alternatively, for example, on the SOI layer 3e on the p-type well 6e, an n-channel type MISFET is formed, and on the SOI layer 3d on the n-type well 5d or the SOI layer 3f on the n-type well 5f, a p-channel type MISFET is formed. Thus, even in the case where the NOR circuit is included in the main circuit, respective voltage values of substrate bias voltages to be applied to the two n-channel type MISFETs connected in series with each other in the NOR circuit can be separately adjusted and determined separately.

More specifically, in the fifth embodiment, voltage values of the substrate biases to be respectively applied to the two MISFETs of the same channel type which are connected in series with each other can be separately adjusted and determined separately. For this reason, in comparison with the case in which the voltage values of substrate biases to be applied to the respective two MISFETs of the same channel type which are connected in series with each other are not adjusted separately, the substrate bias to be applied to the MISFETs constituting the main circuit can be controlled with higher precision so that the delay time of the main circuit becomes a target time.

In the fifth embodiment, the p-type well 6c is formed in the area ARN1, the n-type well 5d is formed in the area ARP1, the p-type well 6e is formed in the area ARN2, and the n-type well 5f is formed in the area ARP2. The NAND circuit is formed in the three areas composed of the area ARN1, the area ARP1 and the area ARN2 among the four areas composed of the area ARN1, the area ARP1, the area ARN2 and the area ARP2. Also, the NOR circuit is formed in the three areas composed of the area ARP1, the area ARN2 and the area ARP2 among the four areas composed of the area ARN1, the area ARP1, the area ARN2 and the area ARP2. Furthermore, the inverter circuit is formed in the two areas composed of the area ARP1 and the area ARN2 among the four areas composed of the area ARN1, the area ARP1, the area ARN2 and the area ARP2.

At this time, in the areas in which the NAND circuit is formed, one area composed of the area ARP2 is an empty area in which nothing is formed, and in the areas in which the NOR circuit is formed, one area composed of the area ARN1 is an empty area in which nothing is formed. Moreover, in the areas in which the inverter circuit is formed, two areas composed of the area ARN1 and the area ARP2 are empty areas in which nothing is formed. More specifically, the area of the empty areas in the fifth embodiment is smaller than that of the empty areas in the comparative example. Therefore, in the fifth embodiment, it is possible to easily reduce the area of the semiconductor integrated circuit device.

Moreover, the semiconductor integrated circuit device of the fifth embodiment includes, as a second speed monitor circuit, a circuit in which two MISFETs of one channel type out of a p-channel type and an n-channel type are connected in series with each other in the same manner as a main circuit, in addition to a first speed monitor circuit and a current monitor circuit. Based on a current flowing through the current monitor circuit in a state where a first substrate bias is being applied to the MISFET of the other channel type, the voltage value of the first substrate bias is temporarily determined. Based on a current flowing through the current monitor circuit in a state where a second substrate bias is being applied to the MISFET of the one channel type, a voltage value of the second substrate bias is temporarily determined. A first delay time of the first speed monitor circuit in a state where the first substrate bias having the temporarily determined voltage value is being applied to the MISFET of the other channel type and the second substrate bias having the temporarily determined voltage value is being applied to the MISFET of the one channel type is acquired. Moreover, based on the acquired first delay time, the voltage value of the first substrate bias and the voltage value of the second substrate bias are determined.

Then, a second delay time of the second speed monitor circuit in a state where the first substrate bias having the determined voltage value is being applied to the MISFET of the other channel type and the second substrate bias having the determined voltage value is being applied to the first MISFET of the two MISFETs of the one channel type is acquired. At this time, a third substrate bias is applied to the second MISFET of the two MISFETs of the one channel type connected in series with each other. Then, based on the acquired second delay time, the voltage value of the third substrate bias to be applied to the second MISFET of the two MISFETs of the one channel type is determined.

By using this second speed monitor circuit in combination with the first speed monitor circuit and the current monitor circuit, even in the case where the main circuit has a circuit in which two MISFETs of one channel type out of the p-channel type and the n-channel type are connected in series with each other, the voltage value of the substrate bias can be controlled with high precision so that the delay time of the main circuit becomes a target time. Therefore, since it becomes possible to easily compensate for variations in characteristics such as the threshold voltage of MISFETs constituting the main circuit, the performances of the semiconductor integrated circuit device can be improved. Moreover, since the voltage value of the substrate bias can be controlled with high precision so that the delay time of the main circuit becomes a target time without the necessity of forming the same circuit as the main circuit, that is, a replica circuit, the performances of the semiconductor integrated circuit device can be improved.

In the case where the semiconductor integrated circuit device is formed on an SOI substrate having four areas composed of the area ARN1, the area ARP1, the area ARN2 and the area ARP2, even when respectively different substrate biases are applied to the two MISFETs of the same channel type connected in series with each other, the area of the semiconductor integrated circuit device can be easily reduced. In other words, even in the case where the main circuit of the semiconductor integrated circuit device has a circuit including two MISFETs of the same channel type connected in series with each other, it becomes possible to easily compensate for variations in the threshold voltages of MISFETs included in the main circuit, and the semiconductor integrated circuit device can be easily downsized.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:
1. A semiconductor integrated circuit device, comprising:
a first substrate;
a p-type first semiconductor region which is formed on a first main surface side of the first substrate and extends in a first direction in the first main surface;
an n-type second semiconductor region which is formed on the first main surface side of the first substrate and extends in the first direction in the first main surface;
a p-type third semiconductor region which is formed on the first main surface side of the first substrate and extends in the first direction in the first main surface;
an n-type fourth semiconductor region which is formed on the first main surface side of the first substrate and extends in the first direction in the first main surface;
a first insulating layer formed on the first semiconductor region;
a second insulating layer formed on the second semiconductor region;
a third insulating layer formed on the third semiconductor region;
a fourth insulating layer formed on the fourth semiconductor region;
a first semiconductor layer formed on the first insulating layer;
a second semiconductor layer formed on the second insulating layer;
a third semiconductor layer formed on the third insulating layer;
a fourth semiconductor layer formed on the fourth insulating layer;
a p-channel type first MISFET formed on the second semiconductor layer;
an n-channel type second MISFET formed on the third semiconductor layer;
an n-channel type third MISFET formed on the first semiconductor layer; and
a p-channel type fourth MISFET formed on the second semiconductor layer,
wherein the first semiconductor region, the second semiconductor region, the third semiconductor region and the fourth semiconductor region are arranged in a second direction which intersects with the first direction in the first main surface in an order of the first semiconductor region, the second semiconductor region, the third semiconductor region and the fourth semiconductor region,
the third MISFET is connected in series with the first MISFET,
the second MISFET is connected in series with the third MISFET on a side opposite to the first MISFET side of the third MISFET,
the fourth MISFET is connected in parallel with the first MISFET,
the first MISFET, the second MISFET, the third MISFET and the fourth MISFET form a NAND circuit, a first substrate bias voltage is applied to the second semiconductor region, a second substrate bias voltage is applied to the third semiconductor region, and a third substrate bias voltage different from the second substrate bias voltage is applied to the first semiconductor region.

2. The semiconductor integrated circuit device according to claim 1, further comprising:

an n-channel type fifth MISFET formed on the third semiconductor layer;

a p-channel type sixth MISFET formed on the second semiconductor layer;

a p-channel type seventh MISFET formed on the fourth semiconductor layer; and an n-channel type eighth MISFET formed on the third semiconductor layer, wherein the seventh MISFET is connected in series with the fifth MISFET, the sixth MISFET is connected in series with the seventh MISFET on a side opposite to the fifth MISFET side of the seventh MISFET, the eighth MISFET is connected in parallel with the fifth MISFET, the fifth MISFET, the sixth MISFET, the seventh MISFET and the eighth MISFET form a NOR circuit, and a fourth substrate bias voltage different from the second substrate bias voltage is applied to the fourth semiconductor region.

3. The semiconductor integrated circuit device according to claim 1, wherein a source electrode of the first MISFET and a source electrode of the fourth MISFET are connected to a power supply, a drain electrode of the first MISFET and a drain electrode of the fourth MISFET are connected to a drain electrode of the third MISFET, a source electrode of the third MISFET is connected to a drain electrode of the second MISFET, and a source electrode of the second MISFET is grounded.

4. A semiconductor integrated circuit device, comprising:

a first substrate;

an n-type first semiconductor region which is formed on a first main surface side of the first substrate and extends in a first direction in the first main surface;

a p-type second semiconductor region which is formed on the first main surface side of the first substrate and extends in the first direction in the first main surface;

an n-type third semiconductor region which is formed on the first main surface side of the first substrate and extends in the first direction in the first main surface;

a p-type fourth semiconductor region which is formed on the first main surface side of the first substrate and extends in the first direction in the first main surface;

a first insulating layer formed on the first semiconductor region;

a second insulating layer formed on the second semiconductor region;

a third insulating layer formed on the third semiconductor region;

a fourth insulating layer formed on the fourth semiconductor region;

a first semiconductor layer formed on the first insulating layer;

a second semiconductor layer formed on the second insulating layer;

a third semiconductor layer formed on the third insulating layer;

a fourth semiconductor layer formed on the fourth insulating layer;

an n-channel type first MISFET formed on the second semiconductor layer;

a p-channel type second MISFET formed on the third semiconductor layer;

a p-channel type third MISFET formed on the first semiconductor layer; and an n-channel type ninth MISFET formed on the second semiconductor layer, wherein the first semiconductor region, the second semiconductor region, the third semiconductor region and the fourth semiconductor region are arranged in a second direction which intersects with the first direction in the first main surface in an order of the first semiconductor region, the second semiconductor region, the third semiconductor region and the fourth semiconductor region, the third MISFET is connected in series with the first MISFET, the second MISFET is connected in series with the third MISFET on a side opposite to the first MISFET side of the third MISFET, the ninth MISFET is connected in parallel with the first MISFET, the first MISFET, the second MISFET, the third MISFET and the ninth MISFET form a NOR circuit, a fifth substrate bias voltage is applied to the second semiconductor region, a sixth substrate bias voltage is applied to the third semiconductor region, and a seventh substrate bias voltage different from the sixth substrate bias voltage is applied to the first semiconductor region.

5. The semiconductor integrated circuit device according to claim 4, wherein a source electrode of the first MISFET and a source electrode of the ninth MISFET are grounded, a drain electrode of the first MISFET and a drain electrode of the ninth MISFET are connected to a drain electrode of the third MISFET, a source electrode of the third MISFET is connected to a drain electrode of the second MISFET, and a source electrode of the second MISFET is connected to a power supply.

6. A semiconductor integrated circuit device comprising:

a first substrate;

a first semiconductor region of a first conductivity type which is formed on a first main surface side of the first substrate and extends in a first direction in the first main surface;

a second semiconductor region of a second conductivity type different from the first conductivity type which is formed on the first main surface side of the first substrate and extends in the first direction in the first main surface;

a third semiconductor region of the first conductivity type which is formed on the first main surface side of the first substrate and extends in the first direction in the first main surface;

a fourth semiconductor region of the second conductivity type which is formed on the first main surface side of the first substrate and extends in the first direction in the first main surface;

a first insulating layer formed on the first semiconductor region;

a second insulating layer formed on the second semiconductor region;
a third insulating layer formed on the third semiconductor region;
a fourth insulating layer formed on the fourth semiconductor region;
a first semiconductor layer formed on the first insulating layer;
a second semiconductor layer formed on the second insulating layer;
a third semiconductor layer formed on the third insulating layer;
a fourth semiconductor layer formed on the fourth insulating layer;
a first MISFET of a first channel type formed on the second semiconductor layer; and
a second MISFET of a second channel type different from the first channel type formed on the third semiconductor layer,
wherein the first semiconductor region, the second semiconductor region, the third semiconductor region and the fourth semiconductor region are arranged in a second direction which intersects with the first direction in the first main surface in an order of the first semiconductor region, the second semiconductor region, the third semiconductor region and the fourth semiconductor region,
the second MISFET is connected in series with the first MISFET,
when the first conductivity type is a p type and the second conductivity type is an n type, the first channel type is the p channel type and the second channel type is the n channel type,
when the first conductivity type is an n type and the second conductivity type is a p type, the first channel type is the n channel type and the second channel type is the p channel type, and
the first MISFET and the second MISFET form an inverter circuit.

7. A semiconductor integrated circuit device comprising:
a first substrate;
a first semiconductor region of a first conductivity type which is formed on a first main surface side of the first substrate and extends in a first direction in the first main surface;
a second semiconductor region of a second conductivity type different from the first conductivity type which is formed on the first main surface side of the first substrate and extends in the first direction in the first main surface;
a third semiconductor region of the first conductivity type which is formed on the first main surface side of the first substrate and extends in the first direction in the first main surface;
a fourth semiconductor region of the second conductivity type which is formed on the first main surface side of the first substrate and extends in the first direction in the first main surface;
a first insulating layer formed on the first semiconductor region;
a second insulating layer formed on the second semiconductor region;
a third insulating layer formed on the third semiconductor region;
a fourth insulating layer formed on the fourth semiconductor region;
a first semiconductor layer formed on the first insulating layer;
a second semiconductor layer formed on the second insulating layer;
a third semiconductor layer formed on the third insulating layer;
a fourth semiconductor layer formed on the fourth insulating layer;
a first MISFET of a first channel type formed on the second semiconductor layer; and
a second MISFET of a second channel type different from the first channel type formed on the first semiconductor layer or the third semiconductor layer,
wherein the first semiconductor region, the second semiconductor region, the third semiconductor region and the fourth semiconductor region are arranged in a second direction which intersects with the first direction in the first main surface in an order of the first semiconductor region, the second semiconductor region, the third semiconductor region and the fourth semiconductor region,
the second MISFET is connected in series with the first MISFET,
when the first conductivity type is a p type and the second conductivity type is an n type, the first channel type is the p channel type and the second channel type is the n channel type,
when the first conductivity type is an n type and the second conductivity type is a p type, the first channel type is the n channel type and the second channel type is the p channel type,
the first insulating layer is not formed on a first end portion in the first direction of the first semiconductor region,
the second insulating layer is not formed on a second end portion in the first direction of the second semiconductor region,
the third insulating layer is not formed on a third end portion in the first direction of the third semiconductor region,
the fourth insulating layer is not formed on a fourth end portion in the first direction of the fourth semiconductor region,
the first end portion is electrically connected to a first voltage generating circuit for applying an eighth substrate bias voltage through a first connection electrode formed on the first end portion,
the second end portion is electrically connected to a second voltage generating circuit for applying a ninth substrate bias voltage through a second connection electrode formed on the second end portion,
the third end portion is electrically connected to a third voltage generating circuit for applying a tenth substrate bias voltage through a third connection electrode formed on the third end portion, and
the fourth end portion is electrically connected to a fourth voltage generating circuit for applying an eleventh substrate bias voltage through a fourth connection electrode formed on the fourth end portion.

* * * * *